(12) United States Patent
Shah et al.

(10) Patent No.: US 9,163,354 B2
(45) Date of Patent: Oct. 20, 2015

(54) CNT-INFUSED FIBER AS A SELF SHIELDING WIRE FOR ENHANCED POWER TRANSMISSION LINE

(75) Inventors: Tushar K. Shah, Fulton, MD (US); Daniel Jacob Adcock, Columbia, MD (US); Harry C. Malecki, Abingdon, MD (US)

(73) Assignee: Applied Nanostructured Solutions, LLC, Baltimore, MD (US)

( * ) Notice: Subject to any disclaimer, the term of this patent is extended or adjusted under 35 U.S.C. 154(b) by 345 days.

(21) Appl. No.: 13/234,100

(22) Filed: Sep. 15, 2011

(65) Prior Publication Data

US 2012/0000691 A1    Jan. 5, 2012

Related U.S. Application Data

(63) Continuation-in-part of application No. 13/006,368, filed on Jan. 13, 2011.

(60) Provisional application No. 61/385,923, filed on Sep. 23, 2010, provisional application No. 61/295,621, filed on Jan. 15, 2010.

(51) Int. Cl.
*H01B 7/18* (2006.01)
*B05D 5/12* (2006.01)
(Continued)

(52) U.S. Cl.
CPC ............... *D06M 11/74* (2013.01); *B82Y 30/00* (2013.01); *B82Y 40/00* (2013.01); *C01B 31/024* (2013.01);
(Continued)

(58) Field of Classification Search
CPC .............................. H05K 9/0098; H01B 5/105

USPC .................................................... 174/102 R
See application file for complete search history.

(56) References Cited

U.S. PATENT DOCUMENTS 2,883,306 A   4/1959   Cotter
3,580,731 A   5/1971   Milewski et al.
(Continued)

FOREIGN PATENT DOCUMENTS

CN   1363123 A   8/2002
CN   1838999 A   9/2006
(Continued)

OTHER PUBLICATIONS

U.S. Appl. No. 12/766,817, filed Apr. 23 2010, Tushar K. Shah.
(Continued)

*Primary Examiner* — William H Mayo, III
*Assistant Examiner* — Hiram E Gonzalez
(74) *Attorney, Agent, or Firm* — McDermott Will & Emery LLP

(57) ABSTRACT

A wire includes a plurality of carbon nanotube infused fibers in which the infused carbon nanotubes are aligned parallel to the fiber axes. An electromagnetic shield for a wire includes a plurality of carbon nanotube infused fibers, in which the infused carbon nanotubes are aligned radially about the fiber axes. The plurality of carbon nanotube infused fibers are arranged circumferentially about the wire with the fiber axes parallel to the wire. A self-shielded wire includes 1) a wire that includes a plurality of carbon nanotube infused fibers in which the infused carbon nanotubes are aligned parallel to the fiber axes; and 2) an electromagnetic shield that includes a plurality of carbon nanotube infused fibers in which the carbon nanotubes are aligned radially about the fiber axes. The axes of the carbon nanotube infused fibers of the wire and the carbon nanotube infused fibers of the electromagnetic shield share are parallel.

21 Claims, 15 Drawing Sheets

(51) Int. Cl.

| | |
|---|---|
| *C08K 3/04* | (2006.01) |
| *D02G 3/36* | (2006.01) |
| *D02G 3/02* | (2006.01) |
| *C08K 3/08* | (2006.01) |
| *B82Y 30/00* | (2011.01) |
| *B82Y 40/00* | (2011.01) |
| *D06M 11/74* | (2006.01) |
| *H05K 9/00* | (2006.01) |
| *C01B 31/02* | (2006.01) |
| *D06M 101/40* | (2006.01) |
| *H01B 5/10* | (2006.01) |

(52) U.S. Cl.
 CPC .......... *C01B 31/0233* (2013.01); *H05K 9/0098* (2013.01); *D06M 2101/40* (2013.01); *H01B 5/105* (2013.01); *Y10T 428/2918* (2015.01)

(56) References Cited

U.S. PATENT DOCUMENTS

| | | | |
|---|---|---|---|
| 4,104,083 A | 8/1978 | Hirano | |
| 4,313,084 A | 1/1982 | Hosokawa et al. | |
| 4,488,203 A | 12/1984 | Muranaka et al. | |
| 4,515,107 A | 5/1985 | Fournier et al. | |
| 4,530,750 A | 7/1985 | Alsenberg et al. | |
| 4,581,284 A | 4/1986 | Eggert et al. | |
| 4,707,349 A | 11/1987 | Hjersted | |
| 4,920,917 A | 5/1990 | Nakatani et al. | |
| 5,093,155 A | 3/1992 | Miyazaki et al. | |
| 5,103,067 A | 4/1992 | Aldissi | |
| 5,130,194 A | 7/1992 | Baker et al. | |
| 5,156,225 A | 10/1992 | Murrin | |
| 5,173,367 A | 12/1992 | Liimatta et al. | |
| 5,175,224 A | 12/1992 | Horacek | |
| 5,187,021 A | 2/1993 | Vydra et al. | |
| 5,221,605 A | 6/1993 | Bard et al. | |
| 5,238,808 A | 8/1993 | Bard et al. | |
| 5,246,794 A | 9/1993 | Blomgren et al. | |
| 5,310,687 A | 5/1994 | Bard et al. | |
| 5,449,574 A | 9/1995 | Higley | |
| 5,470,408 A | 11/1995 | Nielson et al. | |
| 5,514,217 A | 5/1996 | Niino et al. | |
| 5,547,525 A | 8/1996 | Bennett et al. | |
| 5,571,749 A | 11/1996 | Matsuda et al. | |
| 5,581,438 A | 12/1996 | Halliop | |
| 5,583,318 A | 12/1996 | Powell | |
| 5,639,984 A | 6/1997 | Nielson | |
| 5,707,758 A | 1/1998 | Iwatsu et al. | |
| 5,714,089 A | 2/1998 | Bard et al. | |
| 5,731,147 A | 3/1998 | Bard et al. | |
| 5,908,585 A | 6/1999 | Shibuta | |
| 5,949,018 A | 9/1999 | Esker | |
| 5,968,274 A | 10/1999 | Fujioka et al. | |
| 5,997,832 A | 12/1999 | Lieber et al. | |
| 6,139,956 A | 10/2000 | Endoh et al. | |
| 6,140,138 A | 10/2000 | Bard et al. | |
| 6,146,783 A | 11/2000 | Brohm et al. | |
| 6,180,281 B1 | 1/2001 | Schneider et al. | |
| 6,184,280 B1 | 2/2001 | Shibuta | |
| 6,194,685 B1 | 2/2001 | Rutherford | |
| 6,221,154 B1 | 4/2001 | Lee et al. | |
| 6,225,565 B1 * | 5/2001 | Prysner | 174/120 SC |
| 6,232,706 B1 | 5/2001 | Dai et al. | |
| 6,233,135 B1 | 5/2001 | Farahmandi et al. | |
| 6,251,520 B1 | 6/2001 | Blizzard et al. | |
| 6,265,466 B1 | 7/2001 | Glatkowski et al. | |
| 6,331,209 B1 | 12/2001 | Jang et al. | |
| 6,333,016 B1 | 12/2001 | Resasco et al. | |
| 6,361,861 B2 | 3/2002 | Gao | |
| 6,413,487 B1 | 7/2002 | Resasco et al. | |
| 6,420,293 B1 | 7/2002 | Chang et al. | |
| 6,430,031 B1 | 8/2002 | Dispennette et al. | |
| 6,454,816 B1 | 9/2002 | Lee et al. | |
| 6,455,021 B1 | 9/2002 | Saito | |
| 6,465,057 B1 | 10/2002 | Nakahigashi et al. | |
| 6,479,028 B1 | 11/2002 | Kaner et al. | |
| 6,479,030 B1 | 11/2002 | Firsich | |
| 6,491,789 B2 | 12/2002 | Niu | |
| 6,495,258 B1 | 12/2002 | Chen et al. | |
| 6,528,572 B1 | 3/2003 | Patel et al. | |
| 6,564,744 B2 | 5/2003 | Nakahigashi et al. | |
| 6,585,152 B2 | 7/2003 | Farahmandi et al. | |
| 6,602,742 B2 | 8/2003 | Maletin et al. | |
| 6,639,786 B2 | 10/2003 | Noguchi et al. | |
| 6,650,531 B2 | 11/2003 | Ikeda et al. | |
| 6,653,619 B2 | 11/2003 | Chin et al. | |
| 6,673,392 B2 | 1/2004 | Lee et al. | |
| 6,686,537 B1 | 2/2004 | Gareis et al. | |
| 6,692,717 B1 | 2/2004 | Smalley et al. | |
| 6,765,949 B2 | 7/2004 | Chang | |
| 6,773,466 B1 | 8/2004 | Hiratsuka et al. | |
| 6,790,425 B1 | 9/2004 | Smalley et al. | |
| 6,818,821 B2 | 11/2004 | Fujieda et al. | |
| 6,831,826 B2 | 12/2004 | Iwaida et al. | |
| 6,837,928 B1 | 1/2005 | Zhang et al. | |
| 6,852,410 B2 | 2/2005 | Veedu et al. | |
| 6,863,942 B2 | 3/2005 | Ren et al. | |
| 6,887,365 B2 | 5/2005 | Naughton | |
| 6,887,451 B2 | 5/2005 | Dodelet et al. | |
| 6,900,264 B2 | 5/2005 | Kumar et al. | |
| 6,900,580 B2 | 5/2005 | Dai et al. | |
| 6,908,572 B1 | 6/2005 | Derbyshire et al. | |
| 6,913,075 B1 | 7/2005 | Knowles et al. | |
| 6,934,600 B2 | 8/2005 | Jang et al. | |
| 6,936,653 B2 | 8/2005 | McElrath et al. | |
| 6,949,237 B2 | 9/2005 | Smalley et al. | |
| 6,955,800 B2 | 10/2005 | Resasco et al. | |
| 6,962,892 B2 | 11/2005 | Resasco et al. | |
| 6,967,013 B2 | 11/2005 | Someya et al. | |
| 6,979,709 B2 | 12/2005 | Smalley et al. | |
| 6,986,853 B2 | 1/2006 | Glatkowski et al. | |
| 6,986,877 B2 | 1/2006 | Takikawa et al. | |
| 6,994,907 B2 | 2/2006 | Resasco et al. | |
| 7,011,760 B2 | 3/2006 | Wang et al. | |
| 7,018,600 B2 | 3/2006 | Yanagisawa et al. | |
| 7,022,776 B2 | 4/2006 | Bastiaens et al. | |
| 7,045,108 B2 | 5/2006 | Jiang et al. | |
| 7,056,452 B2 | 6/2006 | Niu et al. | |
| 7,060,326 B2 | 6/2006 | Hiel et al. | |
| 7,061,749 B2 | 6/2006 | Liu et al. | |
| 7,074,294 B2 | 7/2006 | Dubrow | |
| 7,085,125 B2 | 8/2006 | Sung | |
| 7,094,386 B2 | 8/2006 | Resasco et al. | |
| 7,105,596 B2 | 9/2006 | Smalley et al. | |
| 7,108,841 B2 | 9/2006 | Smalley et al. | |
| 7,118,693 B2 | 10/2006 | Glatkowski et al. | |
| 7,125,502 B2 | 10/2006 | Smalley et al. | |
| 7,125,534 B1 | 10/2006 | Smalley et al. | |
| 7,132,621 B2 | 11/2006 | Kumar et al. | |
| 7,144,563 B2 | 12/2006 | Rao et al. | |
| 7,147,966 B2 | 12/2006 | Ren et al. | |
| 7,148,619 B2 | 12/2006 | Den et al. | |
| 7,151,129 B2 | 12/2006 | Ishikawa et al. | |
| 7,153,452 B2 | 12/2006 | Ogale et al. | |
| 7,157,068 B2 | 1/2007 | Li et al. | |
| 7,160,532 B2 | 1/2007 | Liu et al. | |
| 7,189,959 B1 | 3/2007 | Morison et al. | |
| 7,211,320 B1 | 5/2007 | Cooper et al. | |
| 7,226,643 B2 | 6/2007 | Juang et al. | |
| 7,235,159 B2 | 6/2007 | Gu et al. | |
| 7,253,442 B2 | 8/2007 | Huang et al. | |
| 7,261,779 B2 | 8/2007 | Gardner | |
| 7,265,174 B2 | 9/2007 | Carroll et al. | |
| 7,265,175 B2 | 9/2007 | Winey et al. | |
| 7,278,324 B2 | 10/2007 | Smits et al. | |
| 7,289,312 B2 | 10/2007 | Duff, Jr. | |
| 7,294,302 B2 | 11/2007 | Kolde et al. | |
| 7,312,608 B2 | 12/2007 | Georgeson et al. | |
| 7,329,698 B2 | 2/2008 | Noguchi et al. | |
| 7,338,684 B1 | 3/2008 | Curliss et al. | |
| 7,340,134 B1 | 3/2008 | Hudson, II et al. | |
| 7,352,559 B2 | 4/2008 | Sung | |
| 7,354,877 B2 | 4/2008 | Rosenberger et al. | |

(56) References Cited

U.S. PATENT DOCUMENTS

| | | |
|---|---|---|
| 7,354,881 B2 | 4/2008 | Resasco et al. |
| 7,354,988 B2 | 4/2008 | Charati et al. |
| 7,372,880 B2 | 5/2008 | Jablonski et al. |
| 7,384,663 B2 | 6/2008 | Olry et al. |
| 7,399,794 B2 | 7/2008 | Harmon et al. |
| 7,407,640 B2 | 8/2008 | Barrera et al. |
| 7,407,901 B2 | 8/2008 | Bystricky et al. |
| 7,410,628 B2 | 8/2008 | Bening et al. |
| 7,419,601 B2 | 9/2008 | Cooper et al. |
| 7,431,965 B2 | 10/2008 | Grigorian et al. |
| 7,435,476 B2 | 10/2008 | Viswanathan et al. |
| 7,442,284 B2 | 10/2008 | Ren et al. |
| 7,445,817 B2 | 11/2008 | Kumar et al. |
| 7,448,441 B2 | 11/2008 | Hendricks et al. |
| 7,448,931 B2 | 11/2008 | Liu et al. |
| 7,449,631 B2 * | 11/2008 | Lee et al. ............... 174/28 |
| 7,459,627 B2 | 12/2008 | Lee et al. |
| 7,465,605 B2 | 12/2008 | Raravikar et al. |
| 7,466,539 B2 | 12/2008 | Dementiev et al. |
| 7,473,466 B1 | 1/2009 | Muradov |
| 7,479,052 B2 | 1/2009 | Kim et al. |
| 7,488,455 B2 | 2/2009 | Dai et al. |
| 7,504,078 B1 | 3/2009 | Jacques et al. |
| 7,510,695 B2 | 3/2009 | Smalley et al. |
| 7,531,267 B2 | 5/2009 | Kim |
| 7,532,454 B2 | 5/2009 | Plee et al. |
| 7,534,486 B2 | 5/2009 | Boerstoel et al. |
| 7,553,341 B2 | 6/2009 | Pan et al. |
| 7,563,411 B2 | 7/2009 | Jiang et al. |
| 7,563,428 B2 | 7/2009 | Resasco et al. |
| 7,569,425 B2 | 8/2009 | Huang et al. |
| 7,579,112 B2 | 8/2009 | Chiang et al. |
| 7,588,700 B2 | 9/2009 | Kwon et al. |
| 7,592,248 B2 | 9/2009 | Ventzek et al. |
| 7,597,869 B2 | 10/2009 | Hsiao |
| 7,608,798 B2 | 10/2009 | Kumar et al. |
| 7,611,579 B2 | 11/2009 | Lashmore et al. |
| 7,612,985 B2 | 11/2009 | Dementiev et al. |
| 7,615,204 B2 | 11/2009 | Ajayan et al. |
| 7,615,205 B2 | 11/2009 | Jiang et al. |
| 7,632,550 B2 | 12/2009 | Mizuno et al. |
| 7,632,569 B2 | 12/2009 | Smalley et al. |
| 7,700,943 B2 | 4/2010 | Raravikar et al. |
| 7,709,087 B2 | 5/2010 | Majidi et al. |
| 7,718,220 B2 | 5/2010 | D'Silva et al. |
| 7,771,798 B1 | 8/2010 | Grosse et al. |
| 7,776,777 B2 | 8/2010 | Kim et al. |
| 7,793,653 B2 | 9/2010 | Kuckelkorn et al. |
| 7,811,632 B2 | 10/2010 | Eres |
| 7,815,820 B2 | 10/2010 | Tan et al. |
| 7,816,709 B2 | 10/2010 | Balzano et al. |
| 7,820,329 B2 | 10/2010 | Boulton et al. |
| 7,862,795 B2 | 1/2011 | Zhang et al. |
| 7,871,591 B2 | 1/2011 | Harutyunyan et al. |
| 7,880,376 B2 | 2/2011 | Takai et al. |
| 7,927,701 B2 | 4/2011 | Curliss et al. |
| 8,373,971 B2 | 2/2013 | Young |
| 2002/0035170 A1 | 3/2002 | Glatkowski et al. |
| 2002/0048143 A1 | 4/2002 | Lee et al. |
| 2002/0085968 A1 | 7/2002 | Smalley et al. |
| 2002/0090330 A1 | 7/2002 | Smalley et al. |
| 2002/0098135 A1 | 7/2002 | Smalley et al. |
| 2002/0136683 A1 | 9/2002 | Smalley et al. |
| 2003/0042147 A1 | 3/2003 | Talin et al. |
| 2003/0044678 A1 | 3/2003 | ESq. |
| 2003/0055153 A1 | 3/2003 | Luippold et al. |
| 2003/0102585 A1 | 6/2003 | Poulin et al. |
| 2003/0111333 A1 | 6/2003 | Montgomery et al. |
| 2003/0143453 A1 | 7/2003 | Ren et al. |
| 2004/0007955 A1 | 1/2004 | Yaniv et al. |
| 2004/0018375 A1 | 1/2004 | Banno et al. |
| 2004/0020681 A1 | 2/2004 | Hjortstam et al. |
| 2004/0026234 A1 | 2/2004 | Vanden Brande et al. |
| 2004/0029019 A1 | 2/2004 | Clarke et al. |
| 2004/0071870 A1 | 4/2004 | Knowles et al. |
| 2004/0082247 A1 | 4/2004 | Desai et al. |
| 2004/0096389 A1 | 5/2004 | Lobovsky et al. |
| 2004/0105807 A1 | 6/2004 | Fan et al. |
| 2004/0111141 A1 | 6/2004 | Brabec et al. |
| 2004/0166417 A1 | 8/2004 | Nishio et al. |
| 2004/0184981 A1 | 9/2004 | Liu et al. |
| 2004/0197546 A1 | 10/2004 | Rinzler et al. |
| 2004/0210289 A1 | 10/2004 | Wang et al. |
| 2004/0241532 A1 | 12/2004 | Kim |
| 2004/0245088 A1 | 12/2004 | Gardner |
| 2004/0253167 A1 | 12/2004 | Silva et al. |
| 2005/0090176 A1 | 4/2005 | Dean et al. |
| 2005/0100501 A1 | 5/2005 | Veedu et al. |
| 2005/0112052 A1 | 5/2005 | Gu et al. |
| 2005/0113876 A1 | 5/2005 | Weiner et al. |
| 2005/0119371 A1 | 6/2005 | Drzal et al. |
| 2005/0170177 A1 | 8/2005 | Crawford et al. |
| 2005/0172370 A1 | 8/2005 | Haq et al. |
| 2005/0176329 A1 | 8/2005 | Olry et al. |
| 2005/0188727 A1 | 9/2005 | Greywall |
| 2005/0214648 A1 | 9/2005 | Boulton et al. |
| 2005/0231893 A1 | 10/2005 | Harvey |
| 2005/0238810 A1 | 10/2005 | Scaringe et al. |
| 2005/0260412 A1 | 11/2005 | Gardner |
| 2005/0263456 A1 | 12/2005 | Cooper et al. |
| 2005/0287064 A1 | 12/2005 | Mayne et al. |
| 2006/0052509 A1 | 3/2006 | Saitoh |
| 2006/0054866 A1 | 3/2006 | Ait-Haddou et al. |
| 2006/0063065 A1 | 3/2006 | Clarke et al. |
| 2006/0110599 A1 | 5/2006 | Honma et al. |
| 2006/0121275 A1 | 6/2006 | Poulin et al. |
| 2006/0126268 A1 | 6/2006 | Sung |
| 2006/0159916 A1 | 7/2006 | Dubrow et al. |
| 2006/0177602 A1 | 8/2006 | Dijon et al. |
| 2006/0198956 A1 | 9/2006 | Eres |
| 2006/0233692 A1 | 10/2006 | Scaringe et al. |
| 2006/0241236 A1 | 10/2006 | Kuznetsov et al. |
| 2006/0249203 A1 | 11/2006 | Li et al. |
| 2006/0253942 A1 | 11/2006 | Barrera et al. |
| 2007/0020167 A1 | 1/2007 | Han et al. |
| 2007/0036709 A1 | 2/2007 | Lashmore et al. |
| 2007/0048521 A1 | 3/2007 | Istvan |
| 2007/0054105 A1 | 3/2007 | Hsiao |
| 2007/0062799 A1 | 3/2007 | Lee |
| 2007/0070579 A1 | 3/2007 | Sung |
| 2007/0076349 A1 | 4/2007 | Dementiev et al. |
| 2007/0092431 A1 | 4/2007 | Resasco et al. |
| 2007/0110977 A1 | 5/2007 | Al-Haik et al. |
| 2007/0128960 A1 * | 6/2007 | Ghasemi Nejhad et al. ... 442/59 |
| 2007/0134555 A1 | 6/2007 | Ren et al. |
| 2007/0135588 A1 | 6/2007 | Diakoumakos et al. |
| 2007/0166603 A1 | 7/2007 | Nakanishi et al. |
| 2007/0189953 A1 | 8/2007 | Bai et al. |
| 2007/0237990 A1 | 10/2007 | Kim |
| 2007/0241962 A1 | 10/2007 | Shinoda et al. |
| 2007/0259128 A1 | 11/2007 | Parsapour |
| 2007/0293086 A1 | 12/2007 | Liu et al. |
| 2008/0010796 A1 | 1/2008 | Pan et al. |
| 2008/0014431 A1 | 1/2008 | Lashmore et al. |
| 2008/0020193 A1 | 1/2008 | Jang et al. |
| 2008/0048364 A1 | 2/2008 | Armenlades et al. |
| 2008/0049380 A1 | 2/2008 | Miyahara et al. |
| 2008/0053922 A1 | 3/2008 | Honsinger, Jr. et al. |
| 2008/0057265 A1 | 3/2008 | Liang et al. |
| 2008/0063585 A1 | 3/2008 | Smalley |
| 2008/0075954 A1 | 3/2008 | Wardle et al. |
| 2008/0102371 A1 | 5/2008 | Mitchell et al. |
| 2008/0117562 A1 | 5/2008 | Maruyama et al. |
| 2008/0118753 A1 | 5/2008 | Poulin et al. |
| 2008/0137890 A1 | 6/2008 | Petersen et al. |
| 2008/0160286 A1 | 7/2008 | Asrar et al. |
| 2008/0170982 A1 | 7/2008 | Zhang et al. |
| 2008/0173111 A1 | 7/2008 | Thostenson et al. |
| 2008/0182108 A1 | 7/2008 | Curliss et al. |
| 2008/0187482 A1 | 8/2008 | Chen et al. |
| 2008/0187648 A1 | 8/2008 | Hart et al. |
| 2008/0195187 A1 | 8/2008 | Li et al. |
| 2008/0212261 A1 | 9/2008 | Ajayan et al. |
| 2008/0247938 A1 | 10/2008 | Tsai et al. |

(56) References Cited

U.S. PATENT DOCUMENTS

| | | |
|---|---|---|
| 2008/0248192 A1 | 10/2008 | Long et al. |
| 2008/0248362 A1 | 10/2008 | Sayre et al. |
| 2008/0251971 A1 | 10/2008 | Kim et al. |
| 2008/0254675 A1 | 10/2008 | Lee et al. |
| 2008/0273290 A1 | 11/2008 | Dementiev et al. |
| 2008/0279753 A1 | 11/2008 | Harutyunyan |
| 2008/0286564 A1 | 11/2008 | Tsotsis |
| 2008/0296558 A1 | 12/2008 | Choi et al. |
| 2008/0297980 A1 | 12/2008 | Bourcier et al. |
| 2008/0299308 A1 | 12/2008 | Luo et al. |
| 2009/0017301 A1 | 1/2009 | Moireau |
| 2009/0020734 A1 | 1/2009 | Jang et al. |
| 2009/0029127 A1 | 1/2009 | Watanabe et al. |
| 2009/0047453 A1 | 2/2009 | Folaron et al. |
| 2009/0047502 A1 | 2/2009 | Folaron et al. |
| 2009/0053512 A1 | 2/2009 | Pyun et al. |
| 2009/0059474 A1 | 3/2009 | Zhamu et al. |
| 2009/0068387 A1 | 3/2009 | Panzer et al. |
| 2009/0068461 A1 | 3/2009 | Reneker et al. |
| 2009/0072222 A1 | 3/2009 | Radisic et al. |
| 2009/0081383 A1 | 3/2009 | Alberding et al. |
| 2009/0081441 A1 | 3/2009 | Shah et al. |
| 2009/0087743 A1 | 4/2009 | Kim et al. |
| 2009/0092832 A1 | 4/2009 | Moireau |
| 2009/0095051 A1 | 4/2009 | Suzuki et al. |
| 2009/0098453 A1 | 4/2009 | Liu et al. |
| 2009/0099016 A1 | 4/2009 | Carruthers et al. |
| 2009/0117269 A1 | 5/2009 | Hansen et al. |
| 2009/0121219 A1 | 5/2009 | Song et al. |
| 2009/0126783 A1 | 5/2009 | Lin et al. |
| 2009/0136707 A1 | 5/2009 | Ueno |
| 2009/0140098 A1 | 6/2009 | Lengsfeld et al. |
| 2009/0176100 A1 | 7/2009 | Higashi et al. |
| 2009/0176112 A1 | 7/2009 | Kruckenberg et al. |
| 2009/0181309 A1 | 7/2009 | Kwon et al. |
| 2009/0185327 A1 | 7/2009 | Seymour |
| 2009/0186214 A1 | 7/2009 | Lafdi et al. |
| 2009/0186276 A1 | 7/2009 | Zhamu et al. |
| 2009/0191352 A1 | 7/2009 | DuFaux et al. |
| 2009/0192241 A1 | 7/2009 | Raravikar et al. |
| 2009/0194313 A1 | 8/2009 | Jiang et al. |
| 2009/0208743 A1 | 8/2009 | Pettit |
| 2009/0212430 A1 | 8/2009 | Wyland |
| 2009/0214800 A1 | 8/2009 | Saito |
| 2009/0214944 A1 | 8/2009 | Rojeski |
| 2009/0220409 A1 | 9/2009 | Curliss et al. |
| 2009/0226673 A1 | 9/2009 | Friedersdorf et al. |
| 2009/0244810 A1 | 10/2009 | Reynolds |
| 2009/0255706 A1 | 10/2009 | Jiang et al. |
| 2009/0258164 A1 | 10/2009 | Nakai et al. |
| 2009/0262484 A1 | 10/2009 | Miyagi |
| 2009/0272946 A1 | 11/2009 | Lu |
| 2009/0282671 A1 | 11/2009 | Tao et al. |
| 2009/0286079 A1 | 11/2009 | Barker et al. |
| 2009/0294022 A1 | 12/2009 | Hayes et al. |
| 2009/0294753 A1 | 12/2009 | Hauge et al. |
| 2009/0305135 A1 | 12/2009 | Shi et al. |
| 2009/0311166 A1* | 12/2009 | Hart et al. ............... 423/445 B |
| 2009/0314510 A1* | 12/2009 | Kukowski et al. ............ 174/69 |
| 2009/0325076 A1 | 12/2009 | Matsui et al. |
| 2010/0000520 A1 | 1/2010 | Vachon |
| 2010/0000754 A1 | 1/2010 | Mann et al. |
| 2010/0000770 A1 | 1/2010 | Gupta et al. |
| 2010/0035124 A1 | 2/2010 | Thompson et al. |
| 2010/0059243 A1 | 3/2010 | Chang |
| 2010/0074834 A1 | 3/2010 | Kim |
| 2010/0087042 A1 | 4/2010 | Kim et al. |
| 2010/0098931 A1 | 4/2010 | Daniel et al. |
| 2010/0099319 A1 | 4/2010 | Lashmore et al. |
| 2010/0159240 A1 | 6/2010 | Shah et al. |
| 2010/0173228 A1 | 7/2010 | Wallace et al. |
| 2010/0178531 A1 | 7/2010 | Amaratunga et al. |
| 2010/0178825 A1 | 7/2010 | Shah et al. |
| 2010/0188833 A1 | 7/2010 | Liang et al. |
| 2010/0192851 A1 | 8/2010 | Shah et al. |
| 2010/0196695 A1* | 8/2010 | Garcia et al. ............... 428/323 |
| 2010/0196697 A1 | 8/2010 | D'Silva et al. |
| 2010/0197848 A1 | 8/2010 | Verghese et al. |
| 2010/0203362 A1 | 8/2010 | Lam et al. |
| 2010/0206504 A1 | 8/2010 | Akiyama et al. |
| 2010/0210159 A1 | 8/2010 | Zhu |
| 2010/0221424 A1 | 9/2010 | Malecki et al. |
| 2010/0224129 A1 | 9/2010 | Malecki et al. |
| 2010/0227134 A1 | 9/2010 | Shah et al. |
| 2010/0227155 A1 | 9/2010 | Bao et al. |
| 2010/0254885 A1 | 10/2010 | Menchhofer et al. |
| 2010/0258111 A1 | 10/2010 | Shah et al. |
| 2010/0270069 A1 | 10/2010 | Shar et al. |
| 2010/0270513 A1 | 10/2010 | Haylock et al. |
| 2010/0272891 A1 | 10/2010 | Malecki et al. |
| 2010/0276072 A1 | 11/2010 | Shah et al. |
| 2010/0279569 A1 | 11/2010 | Shah et al. |
| 2010/0286395 A1 | 11/2010 | Newkome et al. |
| 2010/0311866 A1 | 12/2010 | Huang et al. |
| 2010/0330421 A1 | 12/2010 | Cui et al. |
| 2011/0024409 A1 | 2/2011 | Shah et al. |
| 2011/0024694 A1 | 2/2011 | Shah et al. |
| 2011/0036829 A1 | 2/2011 | Fugetsu et al. |
| 2011/0089958 A1 | 4/2011 | Malecki et al. |
| 2011/0104571 A1 | 5/2011 | Zhamu et al. |
| 2011/0123735 A1 | 5/2011 | Shah et al. |
| 2011/0124253 A1 | 5/2011 | Shah et al. |
| 2011/0124483 A1 | 5/2011 | Shah et al. |
| 2011/0143087 A1 | 6/2011 | Alberding et al. |
| 2011/0159365 A1 | 6/2011 | Loveness et al. |
| 2011/0159381 A1 | 6/2011 | Doe et al. |
| 2011/0163274 A1 | 7/2011 | Plee et al. |
| 2011/0171469 A1 | 7/2011 | Shah et al. |
| 2011/0174519 A1 | 7/2011 | Shah et al. |
| 2011/0186775 A1 | 8/2011 | Shah et al. |
| 2011/0216476 A1 | 9/2011 | Fleischer et al. |
| 2011/0235240 A1 | 9/2011 | Lu et al. |
| 2011/0242731 A1 | 10/2011 | Fleischer et al. |
| 2011/0281068 A1 | 11/2011 | David et al. |
| 2011/0287318 A1 | 11/2011 | Loveness et al. |
| 2011/0297892 A1 | 12/2011 | Shah et al. |
| 2011/0304964 A1 | 12/2011 | Fleischer et al. |
| 2012/0000691 A1 | 1/2012 | Shah et al. |
| 2012/0052363 A1 | 3/2012 | Fleischer et al. |

FOREIGN PATENT DOCUMENTS

| | | |
|---|---|---|
| CN | 1970612 A | 5/2007 |
| CN | 101189930 A | 5/2008 |
| CN | 101365740 A | 2/2009 |
| CN | 101654555 A | 2/2010 |
| CN | 101698975 | 4/2010 |
| IN | 01900DE2008 A | 3/2010 |
| JP | S 61-157495 | 7/1986 |
| JP | H-05-269874 A | 10/1993 |
| JP | H 07-134911 | 5/1995 |
| JP | H 11-134949 | 5/1999 |
| JP | 2001-517583 A | 10/2001 |
| JP | 2002-515847 A | 5/2002 |
| JP | 2003-239171 A | 8/2003 |
| JP | 2004-039668 | 2/2004 |
| JP | 2004-247064 A | 9/2004 |
| JP | 2005-353493 | 12/2005 |
| JP | 2005-538026 | 12/2005 |
| JP | 2007-070593 A | 3/2007 |
| JP | 2007-515364 | 6/2007 |
| JP | 2007-194354 A | 8/2007 |
| JP | 2007-220841 | 8/2007 |
| JP | 2007-246317 A | 9/2007 |
| JP | 2008-010329 | 1/2008 |
| JP | 2008-270807 | 11/2008 |
| JP | 2008-296338 A | 12/2008 |
| JP | 2009-173476 | 8/2009 |
| JP | 2009-190948 | 8/2009 |
| JP | 2009-533831 | 9/2009 |
| JP | 2009-252745 | 10/2009 |
| JP | 2009-535530 A | 10/2009 |
| JP | 2009-537339 | 10/2009 |
| KR | 100829001 | 5/2008 |

(56) References Cited

FOREIGN PATENT DOCUMENTS

| | | |
|---|---|---|
| TW | 200833861 | 8/2008 |
| WO | WO 03082733 | 10/2003 |
| WO | WO 2006-048531 | 5/2006 |
| WO | WO-2006/080702 A1 | 8/2006 |
| WO | WO 2006-115486 | 11/2006 |
| WO | WO 2007-015710 | 2/2007 |
| WO | WO 2007-061854 | 5/2007 |
| WO | WO 2007-089118 | 8/2007 |
| WO | WO 2007-149109 | 12/2007 |
| WO | WO 2008-012196 | 1/2008 |
| WO | WO-2008/035730 A1 | 3/2008 |
| WO | WO 2008-041183 | 4/2008 |
| WO | WO-2008/054409 A2 | 5/2008 |
| WO | WO 2008-054541 | 5/2008 |
| WO | WO 2008-085634 | 7/2008 |
| WO | WO-2008085550 A2 | 7/2008 |
| WO | WO 2008-115168 | 9/2008 |
| WO | WO 2008-115640 | 9/2008 |
| WO | WO-2008/133299 A1 | 11/2008 |
| WO | WO 2008-145787 | 12/2008 |
| WO | WO 2009-004346 | 1/2009 |
| WO | WO 2009110885 | 9/2009 |
| WO | WO-2009/125421 A1 | 10/2009 |

OTHER PUBLICATIONS

U.S. Appl. No. 61/295,621, filed Jan. 15 2010, Harry C. Malecki.
U.S. Appl. No. 61/297,704, filed Jan. 22 2010, Tushar K. Shah.
Ago, et al., "Colloidal Solution of Metal Nanoparticles as a Catalyst for Carbon Nanotube Growth", Proceedings Materials Research Society, Fall 2000, pp. A13.18.1-A13.18.5, vol. 633, Materials Research Society.
Andrews, et al., "Nanotube Composite Carbon Fibers," Applied Physics Letters, Aug. 1999, vol. 75, No. 9, pp. 1329-1331.
Arepalli, et al., "Carbon-Nanotube-Based Electrochemical Double-Layer Capacitor Technologies for Spaceflight Applications," JOM, Dec. 2005, pp. 26-31.
Bradford, et al., "Electrical Conductivity Study of Carbon nanotube Yarns, 3-D Hybrid Braids and their Composites", Jouranl of Composite Materials, pp. 1533-1545, vol. 42, No. 15, SAGE Productions, Los Angeles, London, New Delhi and Singapore.
Bubert, et al., "Basic analytical investigation of plasma-chemically modified carbon fibers", Spectrochimica Acta Part B., 2002, pp. 1601-1610, vol. 57, Elsevier Science B.V.
Chae, et al., "A comparison of reinforcement efficiency of various types of carbon nanotubes in polyacrylonitrile fiber", Polymer, Nov. 21, 2005, pp. 10925-10935, vol. 46, No. 24, Elsevier Ltd.
Che, et al., "Chemical Vapor Deposition Based Synthesis of Carbon Nanotubes and Nanofibers Using a Template Method", Chem. Mater., 1998, pp. 260-267, vol. 10, American Chemical Society.
Chen, et al., "Basalt fiber-epoxy laminates with functionalized multi-walled carbon nanotubes", Composites, Part A, 2009, pp. 1082-1089, vol. 40, Elsevier Ltd.
Chen, et al., "Pulsed electrodeposition of Pt nanoclusters on carbon nanotubes modified carbon materials using diffusion restricting viscous electroyles", Electrochemistry Communications, Jun. 2007, pp. 1348-1354, vol. 9, Elsevier B.V.
Ci, et al., "Direct Growth of Carbon Nanotubes on the Surface of Ceramic Fibers", Carbon, 2005, pp. 883-886, vol. 43, No. 4, Elsevier Ltd.
Cui, et al., "Carbon-Silicon Core-Shell Nanowires as High Capacity Electrode for Lithium Ion Batteries," American Chemical Society, vol. xx, No. x.
Fiedler et al, "Can Carbon Nanotubes be Used to Sense Damage in Composites?", Annales de Chimie—Science des Materiaux, 2004, vol. 29, No. 6, pp. 81-94.
Franz, et al., "Carbon Single-Wall Nanotube Growth in a Volumetrically Confined Arc Discharge System", U.S. Departement of Energy Journal of Undergraduate Research, pp. 66-69, publication date unknown.
Garcia, et al., "Aligned Carbon Nanotube Reinforcement of Advanced Composite Ply Interfaces," 49th AIAA-ASCE-AHS-ASC Structures, Structural Dynamics, and Materials Conference, Apr. 7-10, 2008, Schaumburg, IL, MIT, American Institute of Aeronautics and Astronautics, Inc.
Hsieh, et al., "Synthesis of Carbon Nanotubes on Carbon Fabric for Use as electrochemical Capacitor," Microporous and Mesoporous Materials, (2009), pp. 155-159, vol. 122.
Hsu, et al., "Optical Absorption and Thermal Transport of Individual Suspended Carbon Nanotube Bundles", Nano Lett., 2009, pp. 590-594, vol. 9, No. 2, American Chemical Society, Publication Date (Web): Jan. 13, 2009.
Jiang, et al., "Carbon nanotube-coated solid-phase microextraction metal fiber based on sol-gel technique", Journal of Chromatography A., May 29, 2009, pp. 4641-4647, vol. 1216, Elsevier B.V.
Jiang, et al., "Plasma-Enhanced Deposition of Silver Nanoparticles onto Polymer and Metal Surfaces for the Generation of Antimicrobial Characteristics", Journal of Applied_Polymer Science, 2004, pp. 1411-1422, vol. 93, Wiley Periodicals, Inc.
Jo, et al., "Field Emission of Carbon Nanotubes Grown on Carbon Cloth," Applied Physics Letters, Aug. 2, 2004, pp. 810-812, vol. 85, No. 5.
Jung, et al., "Fabrication of radar absorbing structure (RAS) using GFR-nano composite and spring-back compensation of hybrid composite RAS shells", Composite Structures, 2006, pp. 571-576, vol. 75, Elsevier Ltd.
Kim, et al., "Processing, characterization, and modeling of carbon nanotube-reinforced multiscale composites," Composites Science and Technology, 2009, pp. 335,342, vol. 69, Elsevier Ltd.
Kind, et al., "Patterned Films of Nanotubes Using Microcontact Printing of Catalysts", Adv. Mater., 1999, pp. 1285-1289, vol. 11, No. 15, Wiley-VCH Verlag GmbH, D-69469 Weinheim.
Kramer, et al., Constrained Iron Catalysts for Single-Walled Carbon Nanotube Growth?, Langmuir 2005, 21, 8466-8470 [http:--pubs.acs.org-dol-abs-10.1021-la0506729].
Laachachi, et al., "A chemical method to graft carbon nanotubes onto a carbon fiber", Materials Letters, 2008, pp. 394-397, vol. 62, Elsevier B.V.
Lee, "Syntheses and properties of fluorinated carbon materials", Journal of Fluorine Chemistry, 2007, pp. 392-403, vol. 128, Elsevier B.V.
Lee, et al., "Fabrication and design of multi-layered radar absorbing structures of MWNT-filled glass-epoxy plain-weave composites", Composite Structures, 2006, pp. 397-405, vol. 76, Elsevier Ltd.
Li, et al., "A Miniature glucose-$O_2$ biofuel cell with single-walled carbon nanotubes-modified carbon fiber microelectrodes as the substrate", Electrochemistry Communications, Jun. 2008, pp. 851-854, vol. 10, Elsevier B.V.
Li, et al., "Electromagnetic Interference (EMI) Shielding of Single-Walled Carbon Nanotube Epoxy Composites", Nano Lett., 2006, pp. 1141-1145, vol. 6, No. 6, American Chemical Society.
Makris, et al., "Carbon Nanotubes Growth and Anchorage to Carbon Fibres", Carbon Nanotubes, 2006, pp. 57-58, vol. 222, Springer, the Netherlands.
Meyyappan, et al., "Carbon nanotube growth by PECVD: a review", Plasma Sources Sci. Technol., 2003, pp. 205-216, vol. 12, IOP Publishing Ltd, UK.
Mylvaganam, "Fabrication and Application of Polymer Composites Comprising Carbon Nanotubes", Recent Pat Nanotechnol., 2007, pp. 59-65, vol. 1, Bentham Science Publishers, Ltd.
Panhuis, et al., "Carbon Nanotube Mediated Reduction in Optical Activity in Polyaniline Composite Materials", J. Phys. Chem. C, 2008, pp. 1441-1445, vol. 112, American Chemical Society.
Parrish, "Carbon Nanotubes and Carbon Layer Nanostructured Composites Grown in Improved Process," Capella University, Before It's News, Jul. 9, 2010.
Pisco, et al., "Hollow fibers integrated with single walled carbon nanotubes: Bandgap modification and chemical sensing capability", Sensors and Actuators B, 2008, pp. 163-170, vol. 129, Elsevier B.V.
Račkauskas "Carbon nanotube growth and use in energy sector", Energetika, 2006, pp. 43-46, vol. 2.
Satishkumar, et al., "Bundles of aligned carbon nanotubes obtained by the pyrolysis of ferrocene-hydrocarbon mixtures: role of the metal

(56) References Cited

OTHER PUBLICATIONS nanoparticles produced in situ", Chemical Physics Letters, 1999, pp. 158-162, vol. 307, Elsevier Science B.V.
Suh, et al., "Highly ordered two-dimensional carbon nanotube arrays", Applied Physics Letters, Oct. 4, 2002, pp. 2047-2049, vol. 75, No. 14, American Institute of Physics.
Thostenson et al., "Carbon Nanotube Networks: Sensing of distributed Strain and Damage for Life Prediction and Self Healing," Advanced Materials, Oct. 2, 1006, vol. 18, Iss. 21, pp. 2837-2841.
Wang, et al., "Penetration depth of atmospheric pressure plasma surface modification into multiple layers of polyester fabrics", Surface and Coatings Technology, 2007, pp. 77-83, vol. 202, Elsevier B.V.
Wang, et al., "Processing and property investigation of single-walled carbon nanotube (SWNT) buckypaper-epoxy resin matrix nanocomposites", Composites: Part A, 2004, pp. 1225-1232, vol. 35, Elsevier Ltd.
Wichmann, et al., "Glass-fibre-reinforced composites with enhanced mechanical and electrical properties—Benefits and limitations of a nanoparticle modified matrix", Engineering Fracture Mechanics, 2006, pp. 2346-2359, vol. 73, Elsevier Ltd.
Xu, et al., "Bone-Shaped Nanomaterials for Nanocomposite Applications", Nano Lett., 2003, pp. 1135-1139, vol. 3, No. 8, American Chemical Society.
Yabe, et al., Synthesis of well-aligned carbon nanotubes by radio frequency plasma enhanced CVD method, Diamond and Related Materials, 2004, pp. 1292-1295, vol. 13, Elsevier B.V.
Yanagishita, et al., "Carbon Nanotubes with a Triangular Cross-section, Fabricated Using Anodic Porous Alumina as the Temple", Adv. Mater., 204, pp. 429-432, vol. 16, No. 5, Wiley-VCH Verlag GmbH & Co. KGaA, Weinheim.
Yang, et al., "Electrical Conductivity and Electromagnetic Interference Shielding of Multi-walled Carbon Nanotube Filled Polymer Composites" Mater. Res. Soc. Symp. Proc., 2005, pp. HH5.3.1-HH.5.3.5, vol. 858E, Materials Research Society.
Yeh, et al., "Mechanical properties of phenolic-based nanocomposites reinforced by multi-walled carbon nanotubes and carbon fibers", Composites: Part A, 2008, pp. 677-684, vol. 39, No. 4.
Zhang et al., "Integration and characterization of aligned carbon nanotubes on metal-silicon substrates and effects of water", Applied Surface Science 255 (2009) 5003-5008, entire document.
Zhang, et al., "In situ growth of carbon nanotubes on inorganic fibers with different surface properties," Materials Chemistry and Physics, 2008, pp. 317-321, vol. 107, Science Direct.
Zhao et al., "The Use of Carbon Nanotubes to Sense Matrix Stresses Around a Single Glass Fiber," Composites Science and Technology, Nov. 2001, vol. 61, No. 14, pp. 2139-2143.
Zhao, et al., "Carbon Nanosheets as the Electrode Material in Supercapacitors," Journal of Power Sources 194 (2009 pp. 1208-1212.
Zhao, et al., "Growth of carbon nanotubes on the surface of carbon fibers", Carbon, 2007, pp. 380-383, vol. 46, No. 2, Elsevier Ltd.
Zhao, et al., "The growth of multi-walled carbon nanotubes with different morphologies on carbon fibers", Carbon, 2005, pp. 651-673, vol. 43, Elsevier Ltd.
Zhu, et al., "Carbon nanotube growth on carbon fibers", Diamond and Related Materials, 2003, pp. 1825-1825, vol. 12, Elsevier B.V.
Zhu, et al., "Synthesis of single-walled carbon nanotubes by the vertical floating catalyst method," Chinese Science Bulletin, 2002, pp. 159-162, vol. 47, No. 2.
Garcia, et al., "Fabrication and multifunctional properties of a hybrid laminate with aligned carbon nanotubes grown In Situ", Composites Science and Technology, Jul. 1, 2008, pp. 2034-2041, vol. 68, No. 9.
Hou et al., "A resistance-based damage location sensor for carbon-fibre composites", Smart Materials and Structures, Nov. 4, 2002, vol. 11, pp. 966-969.
Thostenson et al., "Real-time in situ sensing of damage evolution in advanced fiber composites using carbon nanotube networks", Nanotechnology, Apr. 23, 2008, vol. 19.
Park, et al., "Strain-dependent electrical resistance of multi-walled carbon nanotube/polymer composite films," Nanotechnology, 2008, vol. 19, 055705, 7 pages.
Rebouillat, et al., "Measuring the Electrical Conductivity of Single Fibres," Int J Electrochem Sci, 2011, vol. 6, pp. 5731-5740.
Buehler GmbH, Safety Data Sheet 1907/2006/EC (GB) Buehler EpoThin Hardener, revised Apr. 21, 2008, 5 pages.
Buehler GmbH, Safety Data Sheet 1907/2006/EC (GB) Buehler EpoThin Resin, revised Apr. 21, 2008, 5 pages.
CRC Handbook of Chemistry and Physics, $95^{th}$ Edition, 2014-2015, Physical Constants of Inorganic Compounds, p. 4-45.
The University of Edinburgh School of GeoSciences, Sample Preparation Procedures, revised Aug. 23, 2008, 6 pages.
vanSchalkwijk, et al., "Advances in Lithium-Ion Batteries," Kluwer Academic Plenum Publishers, 2002, p. 499.
Fiedler et al, "Can Carbon Nanotubes Be Used to Sense Damage in Composites?", Annales de Chimie—Science des Materiaux, 2004, vol. 29. No. 6, pp. 81-94.
Ma, et al., "Electrochemical properties of manganese oxide coated onto carbon nanotubes for energy-storage applications," Dec. 2007, Journal of Power Sources, pp. 483-489, vol. 178, No. 1.
Lee, et al., "Fabrication of polypyrrole (PPy)/carbon nanotube (CNT) composite electrode on ceramic fabric for supercapacitor applications," Jun. 2011, Electrochimica ACTA, pp. 7460-7466, vol. 56, No. 22.
Stoller, et al., "Best practice methods for determining an electrode material's performance for ultracapacitors," Jan. 2010, Energy & Environmental Science, pp. 1294-1301, vol. 3, No. 9.
CRC Handbook of Chemistry and Physics, 95th Edition, 2014-2015, Physical Constants of Inorganic Compounds, p. 4-88.

\* cited by examiner

Figure 13  CNT-Infused Wire Shield 1300

CNT-INFUSED FIBER AS A SELF SHIELDING WIRE FOR ENHANCED POWER TRANSMISSION LINE

CROSS-REFERENCES TO RELATED APPLICATIONS

The present application claims the benefit of priority under 35 U.S.C. §119 from U.S. patent application Ser. No. 13/006,368, "CNT-INFUSED FIBER AS A SELF SHIELDING WIRE FOR ENHANCED POWER TRANSMISSION LINE," which claims priority from U.S. Provisional Patent Application Ser. No. 61/295,621, entitled "CNT-INFUSED FIBER AS A SELF SHIELDING WIRE," filed on Jan. 15, 2010, and U.S. Provisional Patent Application Ser. No. 61/385,923, entitled "CNT-INFUSED FIBER ENHANCED POWER TRANSMISSION LINE," filed on Sep. 23, 2010, which are hereby incorporated by reference in their entirety for all purposes.

FIELD

An aspect of the present disclosure may relate to the field of power transmission, and more particularly, to a carbon nanotube (CNT) infused fiber as a self shielding wire for enhanced power transmission.

BACKGROUND

There are over 300,000 km of power transmission lines traversing the USA (and many km more across the world) delivering electrical power through aluminum conductors with various forms of additional reinforcement. A significant issue in the power transmission industry is cost associated with transmission/distribution loss (up to 6.5% in 2007) as well as the infrastructure cost associated with suspending power lines whose spans are limited by the strength/stiffness of the line itself. Over time lines begin to sag requiring maintenance.

In addition, power transmission and data transfer lines suffer from signal distortion due in part to crosstalk, stray inductance or capacitance created by other lines, and noise, interference created by external sources. Signal distortion has been overcome through the use of twisted pairs, where the twisting of two wires together cancels electromagnetic signals, and/or the incorporation of shielding material, such as magnetic foils, which are layered in the wire sheathing/insulation. While these techniques have been shown to reduce issues related to crosstalk and noise, the these techniques can add significant weight and cost to components utilizing twisted pairs or shielded wire.

SUMMARY

In one aspect of the disclosure, a wire that includes a plurality of carbon nanotube infused fibers is disclosed. The infused carbon nanotubes may be aligned parallel to or perpendicular to the fiber axes.

In a further aspect of the disclosure, a self-shielded wire or a wire sheathing is described that incorporates a built-in shielding capability that may improve overall product performance and reduce weight and cost. The electromagnetic shield for the wire may include a plurality of carbon nanotube infused fibers. The infused carbon nanotubes may be aligned radially about the fiber axes. The plurality of carbon nanotube infused fibers may be arranged circumferentially about the wire with the fiber axes parallel to the wire.

In yet another aspect of the disclosure, a power transmission cable is described that includes a high strength core that may aid in improving power transmission capability to improve overall product performance, reduce weight, and cost.

In some aspects of the disclosure a self-shielded wire may include 1) a wire that may include a plurality of carbon nanotube infused fibers in which the infused carbon nanotubes are aligned parallel to the fiber axes; and 2) an electromagnetic shield that may include a plurality of carbon nanotube infused fibers in which the carbon nanotubes are aligned radially about the fiber axes. The axes of the carbon nanotube infused fibers of the wire and the carbon nanotube infused fibers of the electromagnetic shield share may be parallel.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

DETAILED DESCRIPTION

Figure 1:
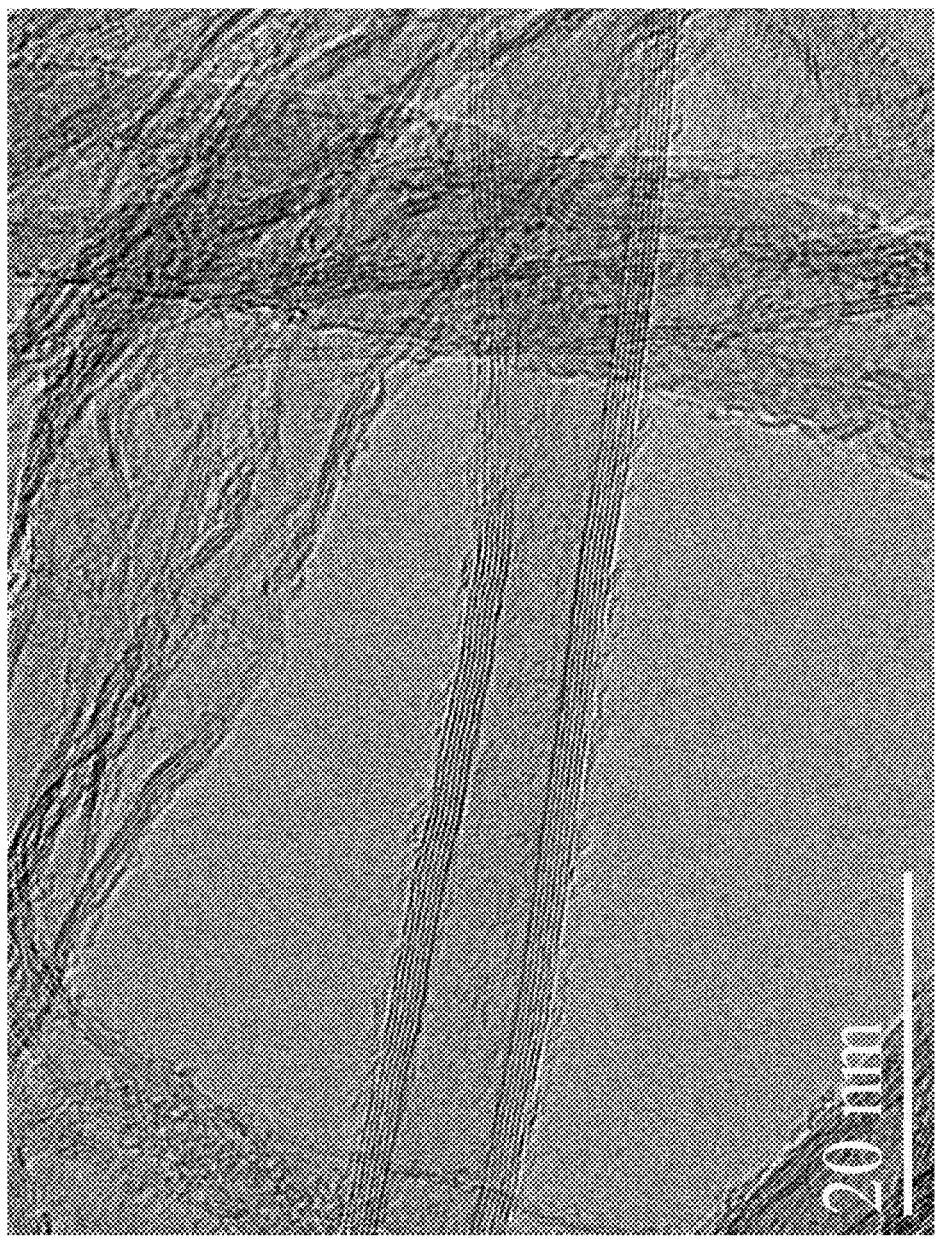
FIG. 1 shows a transmission electron microscope (TEM) image of a multi-walled CNT (MWNT) grown on AS4 carbon fiber via a continuous CVD process employing an apparatus of the present disclosure.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology. Like components are labeled with identical element numbers for ease of understanding.

Some aspects of the disclosure may be directed to a power transmission cable with a high strength core that provides improved power transmission while improving overall product performance by reducing weight and lowering cost. In some aspects of the present disclosure, the power transmission line comprises a core that includes a plurality of carbon nanotube (CNT) infused fibers in a composite matrix to provide a power transmission medium with reduced transmission loss. In one aspect, the infused CNTs are aligned parallel to the fiber axes to provide improved electrical conduction, which may be referred to herein as an "axial orientation."

Another aspect of the present disclosure may relate to an electromagnetic shield for a wire that includes a plurality of CNT-infused fibers. In one aspect, the infused CNTs are aligned radially about the fiber axes. The plurality of carbon nanotube infused fibers may be arranged circumferentially about the wire with the fiber axes parallel to the wire to provide improved electromagnetic shielding, which may be referred to herein as a "radial orientation."

In some aspects of the present disclosure, a self-shielded wire may include 1) a wire that includes a plurality of carbon nanotube infused fibers in which the infused carbon nanotubes are aligned parallel to the fiber axes in a radial orientation; and 2) an electromagnetic shield that includes a plurality of carbon nanotube infused fibers in which the carbon nanotubes are also aligned in a radial orientation relative to the fiber axes. The axes of the carbon nanotube infused fibers of the wire and the carbon nanotube infused fibers of the electromagnetic shield may be parallel.

In another aspect of the present disclosure, the CNT-infused core may be surrounded by a conductive wire. In one aspect, the conductive wire may operate as a power transmission medium of a power transmission cable. The power transmission cable may include an insulation protection layer as an outermost layer. According to this aspect of the present disclosure, the CNT-infused core may include CNT-infused fibers arranged in an axial orientation for providing enhanced stiffness and strength, which may be particularly important for increasing the spanning distance of the power transmission cable. In addition, the CNT-infused core may provide aid in reducing transmission loss by providing an additional efficient conductive path way.

The following describes compositions and processes related to the production of CNT-infused fibers disclosed herein above for the manufacture of wires, EM shields, and self-shielding wires and is understood to be merely exemplary. One skilled in the art will recognize that aspects of the processes and compositions related to CNT-infused fiber materials, as described below, can be applied equally to glass, metal, aramid, and ceramic fiber materials, for example, as well. Thus, the methods disclosed below can be used to generate any CNT-infused fiber material, not just CNT-infused fiber materials as exemplified below. Such CNT-infused fiber materials are described in commonly owned U.S. patent application Ser. Nos. 12/611,073, 12/611,101, and 12/611,103, all filed on Nov. 2, 2009, and U.S. patent application Ser. No. 12/938,328, filed on Nov. 2, 2010, each of which is incorporated herein by reference in its entirety.

Some aspects of the disclosure may be directed, in part, to carbon nanotube-infused ("CNT-infused") fiber materials arranged according to one of an axial orientation and a radial orientation relative to a fiber axis. The infusion of CNTs to the fiber material can serve many functions including, for example, as a sizing agent to protect against damage from moisture, oxidation, abrasion, and compression. A CNT-based sizing can also serve as an interface between the fiber material and a matrix material in a composite. The CNTs can also serve as one of several sizing agents coating the carbon fiber material.

Moreover, CNTs infused on a fiber material can alter various properties of the fiber material, such as thermal and/or electrical conductivity, and/or tensile strength, for example, depending on their orientation relative to a fiber axis. The processes employed to make CNT-infused fiber materials provide CNTs with substantially uniform length and distribution to impart their useful properties uniformly over the fiber material that is being modified. Furthermore, the processes disclosed herein are suitable for the generation of CNT-infused fiber materials of spoolable dimensions.

Some aspects of the disclosure may be directed, in part, to processes for making CNT-infused fiber materials. The processes disclosed herein can be applied to nascent fiber materials generated de novo before, or in lieu of, application of a typical sizing solution to the fiber material. Alternatively, the processes disclosed herein can utilize a commercial fiber material, for example, a carbon tow, that already has a sizing applied to its surface. In such aspects, the sizing can be removed to provide a direct interface between the fiber material and the synthesized CNTs, although a barrier coating and/or transition metal particle can serve as an intermediate layer providing indirect infusion, as explained further below. After CNT synthesis further sizing agents can be applied to the fiber material as desired.

Some of the processes described herein may allow for the continuous production of carbon nanotubes of uniform length and distribution along spoolable lengths of tow, tapes, fabrics, and other 3D woven structures. While various mats, woven, and non-woven fabrics and the like can be functionalized by processes of the present disclosure, it is also possible to generate such higher ordered structures from the parent tow, yarn or the like after CNT functionalization of these parent materials. For example, a CNT-infused woven fabric can be generated from a CNT-infused fiber tow.

As used herein the term "fiber material" refers to any material which may be infused with carbon nanotubes (CNTs). The term encompasses, but is not limited to, a carbon fiber, a graphite fiber, a cellulosic fiber, a glass fiber, a metal fiber (e.g., steel, aluminum, copper, etc.), a metallic fiber, a ceramic fiber, a metallic-ceramic fiber, an aramid fiber, or any combination thereof. The fiber material can include fibers or filaments arranged, for example, in a fiber tow (typically having about 1000 to about 12,000 fibers) as well as planar substrates such as fabrics, tapes, or other fiber broadgoods, and materials upon which CNTs can be synthesized.

As used herein the term "carbon fiber material" refers to any material which has carbon fiber as its elementary structural component. The term encompasses fibers, filaments, yarns, tows, tapes, woven and non-woven fabrics, plies, mats, and the like.

As used herein the term "spoolable dimensions" refers to fiber materials having at least one dimension that is not limited in length, allowing for the material to be stored on a spool or mandrel. Fiber materials of "spoolable dimensions" have at least one dimension that indicates the use of either batch or continuous processing for CNT infusion as described herein. One fiber material of spoolable dimensions that is commercially available is exemplified by AS4 12 k carbon fiber tow with a tex value of 800 (1 tex=1 g/1,000 m) or 620 yard/lb (Grafil, Inc., Sacramento, Calif.). Commercial fiber tow, in particular, can be obtained in 5, 10, 20, 50, and 100 lb. (for spools having high weight, usually a 3 k/12K tow) spools, for example, although larger spools may require special order. Processes according to some aspects of the present disclosure may operate readily with 5 to 20 lb. spools, although larger spools are usable. Moreover, a pre-process operation can be incorporated that divides very large spoolable lengths, for example 100 lb. or more, into easy to handle dimensions, such as two 50 lb spools.

As used herein, the term "carbon nanotube" (CNT, plural CNTs) refers to any of a number of cylindrically-shaped allotropes of carbon of the fullerene family including single-walled carbon nanotubes (SWNTs), double-walled carbon nanotubes (DWNTs), multi-walled carbon nanotubes (MWNTs). CNTs can be capped by a fullerene-like structure or open-ended. CNTs include those nano-scaled materials with walls substantially axially aligned, including, but not limited to, carbon nano-bamboo and carbon nanohorns. CNTs include those that encapsulate other materials. Further, CNTs can be present as an interlinked network of carbon nanotubes. The interlinked network can contain carbon nanotubes that branch in a dendrimeric fashion from other carbon nanotubes. The interlinked network can also contain carbon nanotubes that bridge between carbon nanotubes and carbon nanotubes that have a least a portion of their sidewalls shared with other carbon nanotubes.

As used herein "uniform in length" refers to length of CNTs grown in a reactor. "Uniform length" means that the CNTs have lengths with tolerances of plus or minus about 20% of the total CNT length or less, for CNT lengths varying from between about 1 micron to about 500 microns. At very short lengths, such as 1-4 microns, this error may be in a range from between about plus or minus 20% of the total CNT length up to about plus or minus 1 micron, that is, somewhat more than about 20% of the total CNT length.

As used herein "uniform in distribution" refers to the consistency of density of CNTs on a carbon fiber material. "Uniform distribution" means that the CNTs have a density on the carbon fiber material with tolerances of plus or minus about 10% coverage defined as the percentage of the surface area of the fiber covered by CNTs. This is equivalent to ±1500 CNTs/ μm2 for an 8 nm diameter CNT with 5 walls. Such a figure assumes the space inside the CNTs as fillable.

As used herein, the term "infused" means bonded and "infusion" means the process of bonding. Such bonding can involve direct covalent bonding, ionic bonding, pi-pi, and/or van der Waals force-mediated physisorption. For example, in some aspects, the CNTs can be directly bonded to the fiber material. Bonding can be indirect, such as the CNT infusion to the fiber material via a barrier coating and/or an intervening transition metal nanoparticle disposed between the CNTs and fiber material. In the CNT-infused fiber materials disclosed herein, the carbon nanotubes can be "infused" to the fiber material directly or indirectly as described above. The particular manner in which a CNT is "infused" to a fiber materials is referred to as a "bonding motif."

As used herein, the term "transition metal" refers to any element or alloy of elements in the d-block of the periodic table. The term "transition metal" also includes salt forms of the base transition metal element such as oxides, carbides, nitrides, and the like.

As used herein, the term "nanoparticle" or NP (plural NPs), or grammatical equivalents thereof refers to particles sized between about 0.1 to about 100 nanometers in equivalent spherical diameter, although the NPs need not be spherical in shape. Nanoparticles composed, at least in part, of a transition metal can serve as catalysts for CNT growth on the substrates.

As used herein, the term "transition metal" refers to any element or alloy of elements in the d-block of the periodic table (Groups 3 through 12), and the term "transition metal salt" refers to any transition metal compound such as, for example, transition metal oxides, carbides, nitrides, and the like. Illustrative transition metals that form catalytic nanoparticles suitable for synthesizing carbon nanotubes include, for example, Ni, Fe, Co, Mo, Cu, Pt, Au, Ag, alloys thereof, salts thereof, and mixtures thereof.

As used herein, the term "sizing agent," "fiber sizing agent," or just "sizing," refers collectively to materials used in the manufacture of fibers as a coating to protect the integrity of fibers, provide enhanced interfacial interactions between a fiber material and a matrix material in a composite, and/or alter and/or enhance particular physical properties of a fiber material. In some aspects, CNTs infused to fiber materials behave as a sizing agent.

As used herein, the term "matrix material" refers to a bulk material than can serve to organize sized CNT-infused fiber materials in particular orientations, including random orientation. The matrix material can benefit from the presence of the CNT-infused fiber material by imparting some aspects of the physical and/or chemical properties of the CNT-infused fiber material to the matrix material.

As used herein, the term "material residence time" refers to the amount of time a discrete point along a glass fiber material of spoolable dimensions is exposed to CNT growth conditions during the CNT infusion processes described herein. This definition includes the residence time when employing multiple CNT growth chambers.

As used herein, the term "linespeed" refers to the speed at which a glass fiber material of spoolable dimensions can be fed through the CNT infusion processes described herein, where linespeed is a velocity determined by dividing CNT chamber(s) length by the material residence time.

Some aspects of the disclosure may provide a composition that includes a CNT-infused fiber material. The CNT-infused fiber material includes a fiber material of spoolable dimensions, a barrier coating conformally disposed about the fiber material, and CNTs infused to the fiber material. The infusion of CNTs to the fiber material can include a bonding motif of direct bonding of individual CNTs to the fiber material or indirect bonding via a transition metal NP, barrier coating, or both.

Without being bound by theory, transition metal NPs, which serve as a CNT-forming catalyst, can catalyze CNT growth by forming a CNT growth seed structure. In one aspect, the CNT-forming catalyst can remain at the base of the carbon fiber material, locked by the barrier coating, and infused to the surface of the carbon fiber material. In such a case, the seed structure initially formed by the transition metal nanoparticle catalyst is sufficient for continued non-catalyzed seeded CNT growth without allowing the catalyst to move along the leading edge of CNT growth, as often observed in the art. In such a case, the NP serves as a point of attachment for the CNT to the fiber material. The presence of the barrier coating can also lead to further indirect bonding motifs.

For example, the CNT forming catalyst can be locked into the barrier coating, as described above, but not in surface contact with fiber material. In such a case a stacked structure with the barrier coating disposed between the CNT forming catalyst and fiber material results. In either case, the CNTs formed are infused to the carbon fiber material. In some aspects, some barrier coatings will still allow the CNT growth catalyst to follow the leading edge of the growing nanotube. In such cases, this can result in direct bonding of the CNTs to the fiber material or, optionally, to the barrier coating. Regardless of the nature of the actual bonding motif formed between the carbon nanotubes and the fiber material, the infused CNT is robust and allows the CNT-infused fiber material to exhibit carbon nanotube properties and/or characteristics.

Again, without being bound by theory, when growing CNTs on carbon fiber materials, the elevated temperatures and/or any residual oxygen and/or moisture that can be present in the reaction chamber can damage the carbon fiber material. Moreover, the carbon fiber material itself can be damaged by reaction with the CNT-forming catalyst itself. That is the carbon fiber material can behave as a carbon feedstock to the catalyst at the reaction temperatures employed for CNT synthesis. Such excess carbon can disturb the controlled introduction of the carbon feedstock gas and can even serve to poison the catalyst by overloading it with carbon.

The barrier coating employed in one aspect of the disclosure may be designed to facilitate CNT synthesis on fiber materials. Without being bound by theory, the coating can provide a thermal barrier to heat degradation and/or can be a physical barrier preventing exposure of the fiber material to the environment at the elevated temperatures. Alternatively or additionally, it can minimize the surface area contact between the CNT-forming catalyst and the fiber material and/or it can mitigate the exposure of the fiber material to the CNT-forming catalyst at CNT growth temperatures.

Compositions having CNT-infused fiber materials are provided in which the CNTs are substantially uniform in length. In the continuous process described herein, the residence time of the fiber material in a CNT growth chamber can be modulated to control CNT growth and ultimately, CNT length. This provides a means to control specific properties of the CNTs grown. CNT length can also be controlled through modulation of the carbon feedstock and carrier gas flow rates and reaction temperature. Additional control of the CNT properties can be obtained by controlling, for example, the size of the catalyst used to prepare the CNTs. For example, 1 nm transition metal nanoparticle catalysts can be used to provide SWNTs in particular. Larger catalysts can be used to prepare predominantly MWNTs.

Additionally, the CNT growth processes employed are useful for providing a CNT-infused fiber material with uniformly distributed CNTs on fiber materials while avoiding bundling and/or aggregation of the CNTs that can occur in processes in which pre-formed CNTs are suspended or dispersed in a solvent solution and applied by hand to the fiber material. Such aggregated CNTs tend to adhere weakly to a fiber material and the characteristic CNT properties are weakly expressed, if at all. In some aspects, the maximum distribution density, expressed as percent coverage, that is, the surface area of fiber covered, can be as high as about 55% assuming about 8 nm diameter CNTs with 5 walls. This coverage is calculated by considering the space inside the CNTs as being "fillable" space. Various distribution/density values can be achieved by varying catalyst dispersion on the surface as well as controlling gas composition and process speed. Typically for a given set of parameters, a percent coverage within about 10% can be achieved across a fiber surface. Higher density and shorter CNTs are useful for improving mechanical properties, while longer CNTs with lower density are useful for improving thermal and electrical properties, although increased density is still favorable. A lower density can result when longer CNTs are grown. This can be the result of the higher temperatures and more rapid growth causing lower catalyst particle yields.

The compositions of some aspects of the disclosure having CNT-infused fiber materials can include a fiber material such as a filament, a fiber yarn, a fiber tow, a tape, a fiber-braid, a woven fabric, a non-woven fiber mat, a fiber ply, and other 3D woven structures. Filaments include high aspect ratio carbon fibers having diameters ranging in size from between about 1 micron to about 100 microns. Fiber tows are generally compactly associated bundles of filaments and are usually twisted together to give yarns.

Yarns include closely associated bundles of twisted filaments. Each filament diameter in a yarn is relatively uniform. Yarns have varying weights described by their 'tex,' expressed as weight in grams of 1000 linear meters, or denier, expressed as weight in pounds of 10,000 yards, with a typical tex range usually being between about 200 tex to about 2000 tex.

Tows include loosely associated bundles of untwisted filaments. As in yarns, filament diameter in a tow is generally uniform. Tows also have varying weights and the tex range is usually between 200 tex and 2000 tex. They are frequently characterized by the number of thousands of filaments in the tow, for example 12K tow, 24K tow, 48K tow, and the like.

Tapes are materials that can be assembled as weaves or can represent non-woven flattened tows. Tapes can vary in width and are generally two-sided structures similar to ribbon. Processes of the present disclosure may be compatible with CNT infusion on one or both sides of a tape. CNT-infused tapes can resemble a "carpet" or "forest" on a flat substrate surface. Again, processes of the disclosure may be performed in a continuous mode to functionalize spools of tape.

Fiber-braids represent rope-like structures of densely packed fibers. Such structures can be assembled from yarns, for example. Braided structures can include a hollow portion or a braided structure can be assembled about another core material.

In some aspect of the disclosure, a number of primary fiber material structures can be organized into fabric or sheet-like structures. These include, for example, woven fabrics, non-woven fiber mat and fiber ply, in addition to the tapes described above. Such higher ordered structures can be assembled from parent tows, yarns, filaments or the like, with CNTs already infused in the parent fiber. Alternatively, such structures can serve as the substrate for the CNT infusion processes described herein.

There are three types of carbon fiber material which are categorized based on the precursors used to generate the fibers, any of which can be used in the present disclosure: Rayon, Polyacrylonitrile (PAN) and Pitch. Carbon fiber from rayon precursors, which are cellulosic materials, has relatively low carbon content at about 20% and the fibers tend to have low strength and stiffness. Polyacrylonitrile (PAN) precursors provide a carbon fiber with a carbon content of about 55%. Carbon fiber based on a PAN precursor generally has a higher tensile strength than carbon fiber based on other carbon fiber precursors due to a minimum of surface defects.

Pitch precursors based on petroleum asphalt, coal tar, and polyvinyl chloride can also be used to produce carbon fiber. Although pitches are relatively low in cost and high in carbon yield, there can be issues of non-uniformity in a given batch.

CNTs useful for infusion to fiber materials include single-walled CNTs, double-walled CNTs, multi-walled CNTs, and mixtures thereof. The exact CNTs to be used depends on the application of the CNT-infused fiber material. CNTs can be used for thermal and/or electrical conductivity applications, or as insulators. In some aspects, the infused carbon nanotubes are single-wall nanotubes. In some aspects, the infused carbon nanotubes are multi-wall nanotubes. In some aspects, the infused carbon nanotubes are a combination of single-wall and multi-wall nanotubes. There are some differences in the characteristic properties of single-wall and multi-wall nanotubes that, for some end uses of the fiber, dictate the synthesis of one or the other type of nanotube. For example, single-walled nanotubes can be semi-conducting or metallic, while multi-walled nanotubes are metallic.

CNTs lend their characteristic properties such as mechanical strength, low to moderate electrical resistivity, high thermal conductivity, and the like to the CNT-infused fiber material. For example, in some aspects, the electrical resistivity of a carbon nanotube-infused fiber material is lower than the electrical resistivity of a parent fiber material. More generally, the extent to which the resulting CNT-infused fiber expresses these characteristics can be a function of the extent and density of coverage of the fiber material by the carbon nanotubes, as well as an orientation of the CNTs relative to an axis of the fiber material.

According to one aspect of the present disclosure, any amount of the fiber surface area, from 0-55% of the fiber can be covered assuming an 8 nm diameter, 5-walled MWNT (again this calculation counts the space inside the CNTs as fillable). This number is lower for smaller diameter CNTs and more for greater diameter CNTs. 55% surface area coverage is equivalent to about 15,000 CNTs/micron2. Further CNT properties can be imparted to the fiber material in a manner dependent on CNT length, as described above. Infused CNTs can vary in length ranging from between about 1 micron to about 500 microns, including 1 micron, 2 microns, 3 microns, 4 micron, 5, microns, 6, microns, 7 microns, 8 microns, 9 microns, 10 microns, 15 microns, 20 microns, 25 microns, 30 microns, 35 microns, 40 microns, 45 microns, 50 microns, 60 microns, 70 microns, 80 microns, 90 microns, 100 microns, 150 microns, 200 microns, 250 microns, 300 microns, 350 microns, 400 microns, 450 microns, 500 microns, and all values in between. CNTs can also be less than about 1 micron in length, including about 0.5 microns, for example. CNTs can also be greater than 500 microns, including for example, 510 microns, 520 microns, 550 microns, 600 microns, 700 microns and all values in between.

Compositions of the some aspects of the disclosure may incorporate CNTs have a length from about 1 micron to about 10 microns. Such CNT lengths can be useful in application to increase shear strength. CNTs can also have a length from about 5 to about 70 microns. Such CNT lengths can be useful in applications for increased tensile strength if the CNTs are aligned in the fiber direction. CNTs can also have a length from about 10 microns to about 100 microns. Such CNT lengths can be useful to increase electrical/thermal properties as well as mechanical properties. The process used in the one aspect of the disclosure can also provide CNTs having a length from about 100 microns to about 500 microns, which can also be beneficial to increase electrical and thermal properties. Such control of CNT length is readily achieved through modulation of carbon feedstock and inert gas flow rates coupled with varying linespeeds and growth temperature.

In some aspects, compositions that include spoolable lengths of CNT-infused fiber materials can have various uniform regions with different lengths of CNTs. For example, it can be desirable to have a first portion of CNT-infused fiber material with uniformly shorter CNT lengths to enhance shear strength properties, and a second portion of the same spoolable material with a uniform longer CNT length to enhance electrical or thermal properties for use in power transmission cables according to one aspect of the present disclosure.

Processes of some aspects of the disclosure for CNT infusion to fiber materials may allow control of the CNT lengths with uniformity and in a continuous process allowing spoolable fiber materials to be functionalized with CNTs at high rates. With material residence times between 5 to 300 seconds, linespeeds in a continuous process for a system that is 3 feet long can be in a range anywhere from about 0.5 ft/min to about 36 ft/min and greater. The speed selected depends on various parameters as explained further below.

In some aspects, a material residence time of about 5 to about 30 seconds can produce CNTs having a length between about 1 micron to about 10 microns. In some aspects, a material residence time of about 30 to about 180 seconds can produce CNTs having a length between about 10 microns to about 100 microns. In still further aspects, a material residence time of about 180 to about 300 seconds can produce CNTs having a length between about 100 microns to about 500 microns. One skilled in the art will recognize that these ranges are approximate and that CNT length can also be modulated by reaction temperatures, and carrier and carbon feedstock concentrations and flow rates.

CNT-infused fiber materials of the present disclosure may include a barrier coating. Barrier coatings can include for example an alkoxysilane, methylsiloxane, an alumoxane, alumina nanoparticles, spin on glass and glass nanoparticles. As described below, the CNT-forming catalyst can be added to the uncured barrier coating material and then applied to the fiber material together. In other aspects the barrier coating material can be added to the fiber material prior to deposition of the CNT-forming catalyst. The barrier coating material can be of a thickness sufficiently thin to allow exposure of the CNT-forming catalyst to the feedstock for subsequent CVD growth. In some aspects, the thickness is less than or about equal to the effective diameter of the CNT-forming catalyst. In some aspects, the thickness of the barrier coating is in a range from between about 10 nm to about 100 nm. The barrier coating can also be less than 10 nm, including 1 nm, 2 nm, 3nm, 4 nm, 5 nm, 6 nm, 7 nm, 8 nm, 9 nm, 10 nm, and any value in between.

Without being bound by theory, the barrier coating can serve as an intermediate layer between the fiber material and the CNTs and serves to mechanically infuse the CNTs to the carbon fiber material. Such mechanical infusion still provides a robust system in which the fiber material serves as a platform for organizing the CNTs while still imparting properties of the CNTs to the carbon fiber material. Moreover, the benefit of including a barrier coating is the immediate protection it provides the fiber material from chemical damage due to exposure to moisture and/or any thermal damage due to heating of the fiber material at the temperatures used to promote CNT growth.

The infused CNTs disclosed herein can effectively function as a replacement for conventional fiber material "sizing." The infused CNTs are more robust than conventional sizing materials and can improve the fiber-to-matrix interface in composite materials and, more generally, improve fiber-to-fiber interfaces. Indeed, the CNT-infused fiber materials disclosed herein are themselves composite materials in the sense the CNT-infused fiber material properties will be a combination of those of the fiber material as well as those of the infused CNTs. Consequently, some aspects of the present disclosure may provide a means to impart desired properties to a fiber material that otherwise lack such properties or possesses them in insufficient measure. Fiber materials can be tailored or engineered to meet the requirements of specific applications. The CNTs acting as sizing can protect fiber materials from absorbing moisture due to the hydrophobic CNT structure. Moreover, hydrophobic matrix materials, as further exemplified below, interact well with hydrophobic CNTs to provide improved fiber to matrix interactions.

Despite the beneficial properties imparted to a fiber material having infused CNTs described above, the compositions of the present disclosure may include further "conventional" sizing agents. Such sizing agents vary widely in type and function and include, for example, surfactants, anti-static agents, lubricants, siloxanes, alkoxysilanes, aminosilanes, silanes, silanols, polyvinyl alcohol, starch, and mixtures thereof. Such secondary sizing agents can be used to protect the CNTs themselves or provide further properties to the fiber not imparted by the presence of the infused CNTs.

Compositions of some aspects of the disclosure may further include a matrix material to form a composite with the CNT-infused fiber material, which may be arranged according to a composite matrix core. Such matrix materials can include, for example, an epoxy, a polyester, a vinylester, a polyetherimide, a polyetherketoneketone, a polyphthalamide, a polyetherketone, a polytheretherketone, a polyimide, a phenol-formaldehyde, and a bismaleimide. Matrix materials useful in the present disclosure may include any of the known matrix materials (see Mel M. Schwartz, Composite Materials Handbook (2d ed. 1992)). Matrix materials more generally can include resins (polymers), both thermosetting and thermoplastic, metals, ceramics, cements, and any combination thereof.

Thermosetting resins useful as matrix materials include phthalic/maelic type polyesters, vinyl esters, epoxies, phenolics, cyanates, bismaleimides, and nadic end-capped polyimides (e.g., PMR-15). Thermoplastic resins include polysulfones, polyamides, polycarbonates, polyphenylene oxides, polysulfides, polyether ether ketones, polyether sulfones, polyamide-imides, polyetherimides, polyimides, polyarylates, and liquid crystalline polyester.

Metals useful as matrix materials include alloys of aluminum such as aluminum 6061, 2024, and 713 aluminum braze. Ceramics useful as matrix materials include carbon ceramics, such as lithium aluminosilicate, oxides such as alumina and mullite, nitrides such as silicon nitride, and carbides such as silicon carbide. Cements useful as matrix materials include carbide-base cermets (tungsten carbide, chromium carbide, and titanium carbide), refractory cements (tungsten-thoria and barium-carbonate-nickel), chromium-alumina, nickel-magnesia iron-zirconium carbide. Any of the above-described matrix materials can be used alone or in combination.

Figure 2:
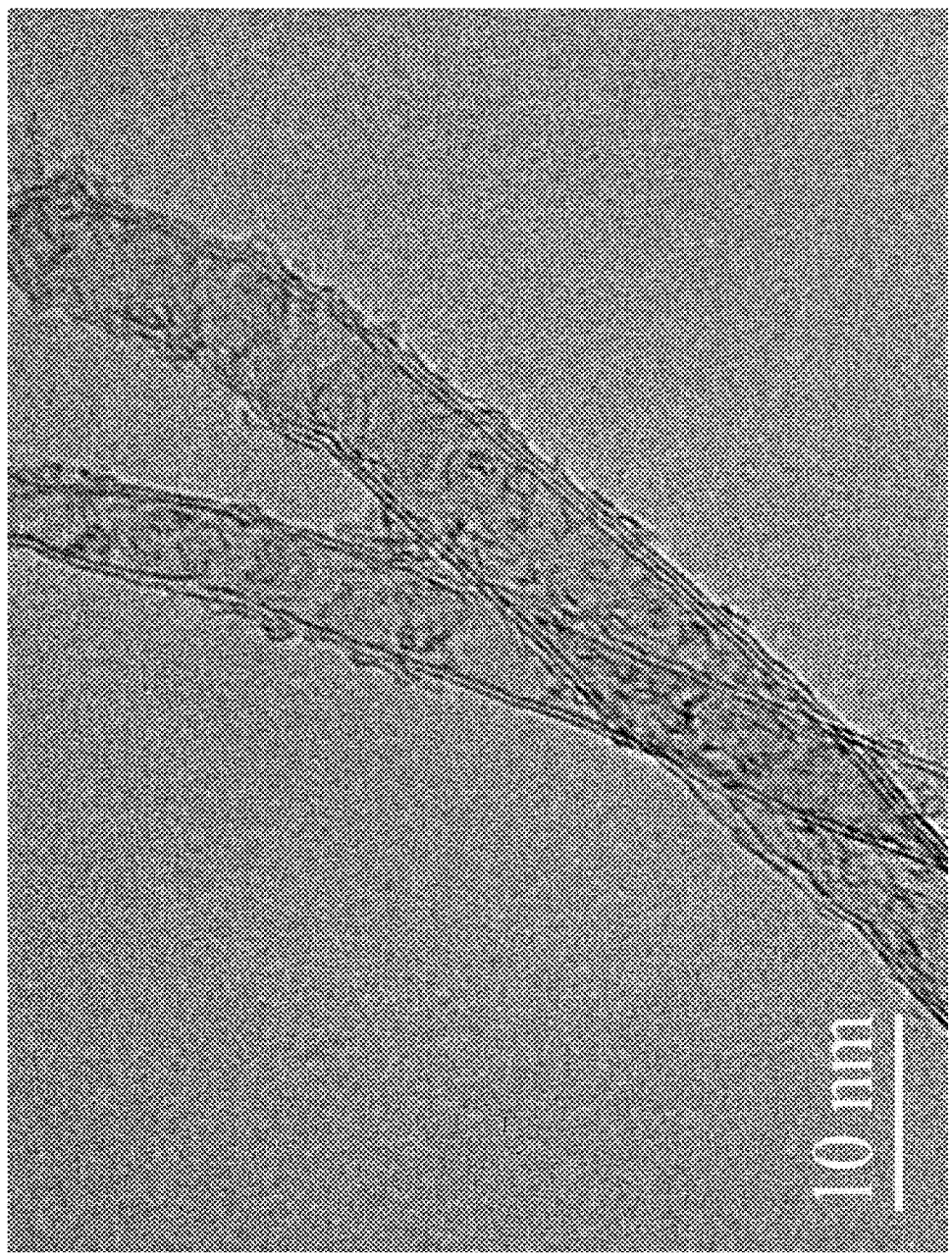
FIG. 2 shows a TEM image of a double-walled CNT (DWNT) grown on AS4 carbon fiber via a continuous CVD process employing an apparatus of the present disclosure.
Figure 3:
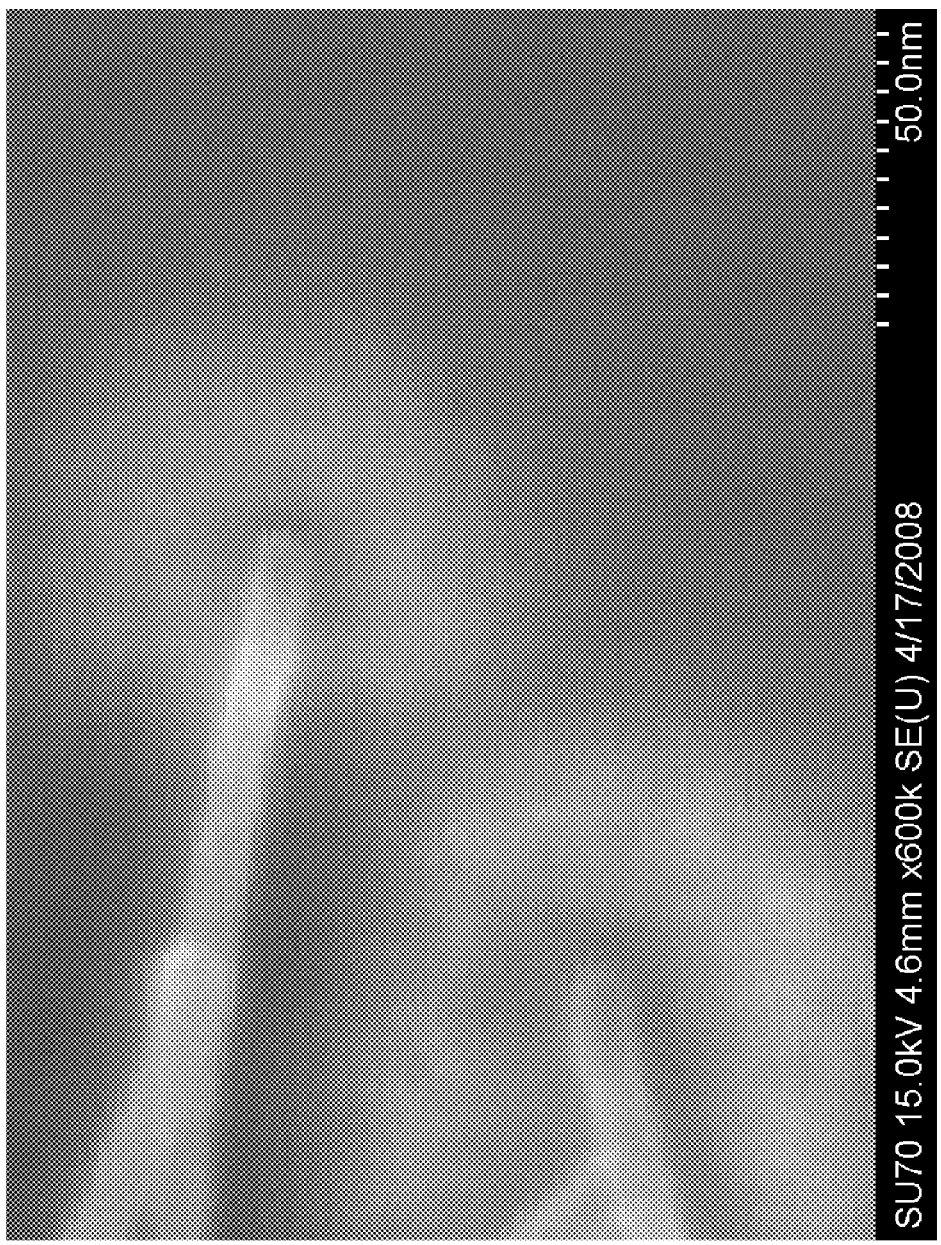
FIG. 3 shows a scanning electron microscope (SEM) image of CNTs growing from within the barrier coating where the CNT-forming nanoparticle catalyst was mechanically infused to the carbon fiber material surface.
Figure 4:
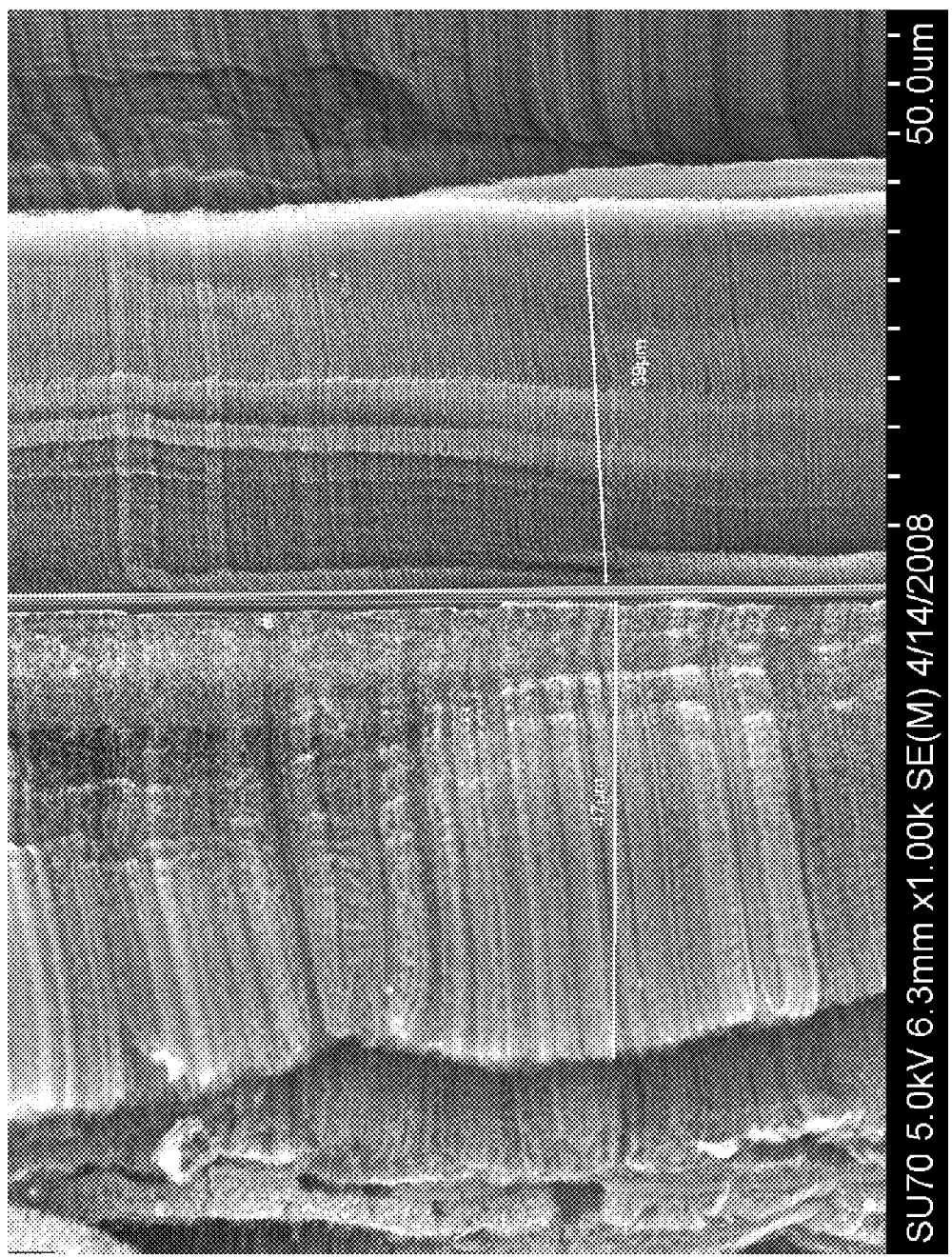
FIG. 4 shows a SEM image demonstrating the consistency in length distribution of CNTs grown on a carbon fiber material to within 20% of a targeted length of about 40 microns employing an apparatus of the present disclosure.
Figure 5:
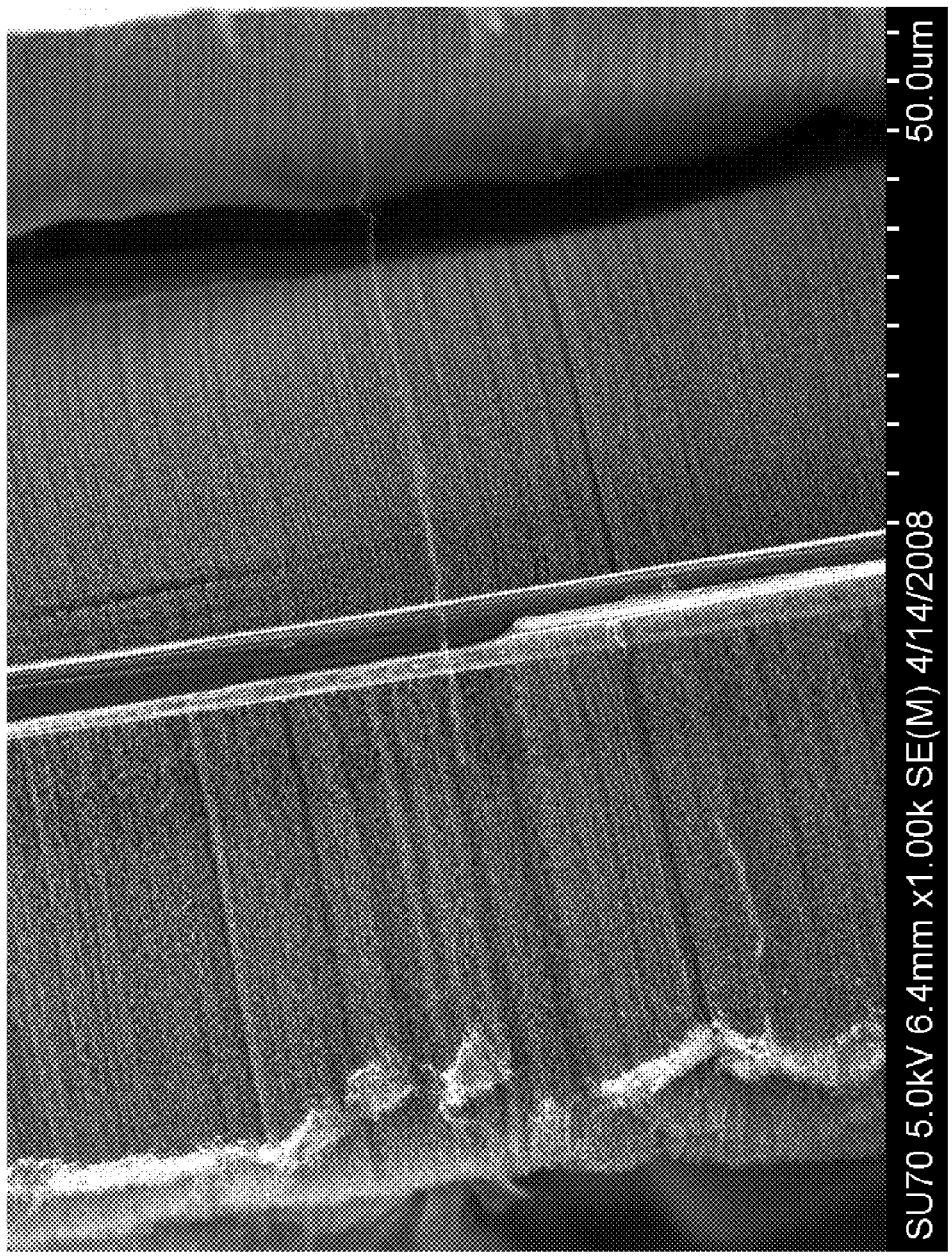
FIG. 5 shows an SEM image demonstrating the effect of a barrier coating on CNT growth. Dense, well aligned CNTs grew where barrier coating was applied and no CNTs grew where barrier coating was absent.
Figure 6:
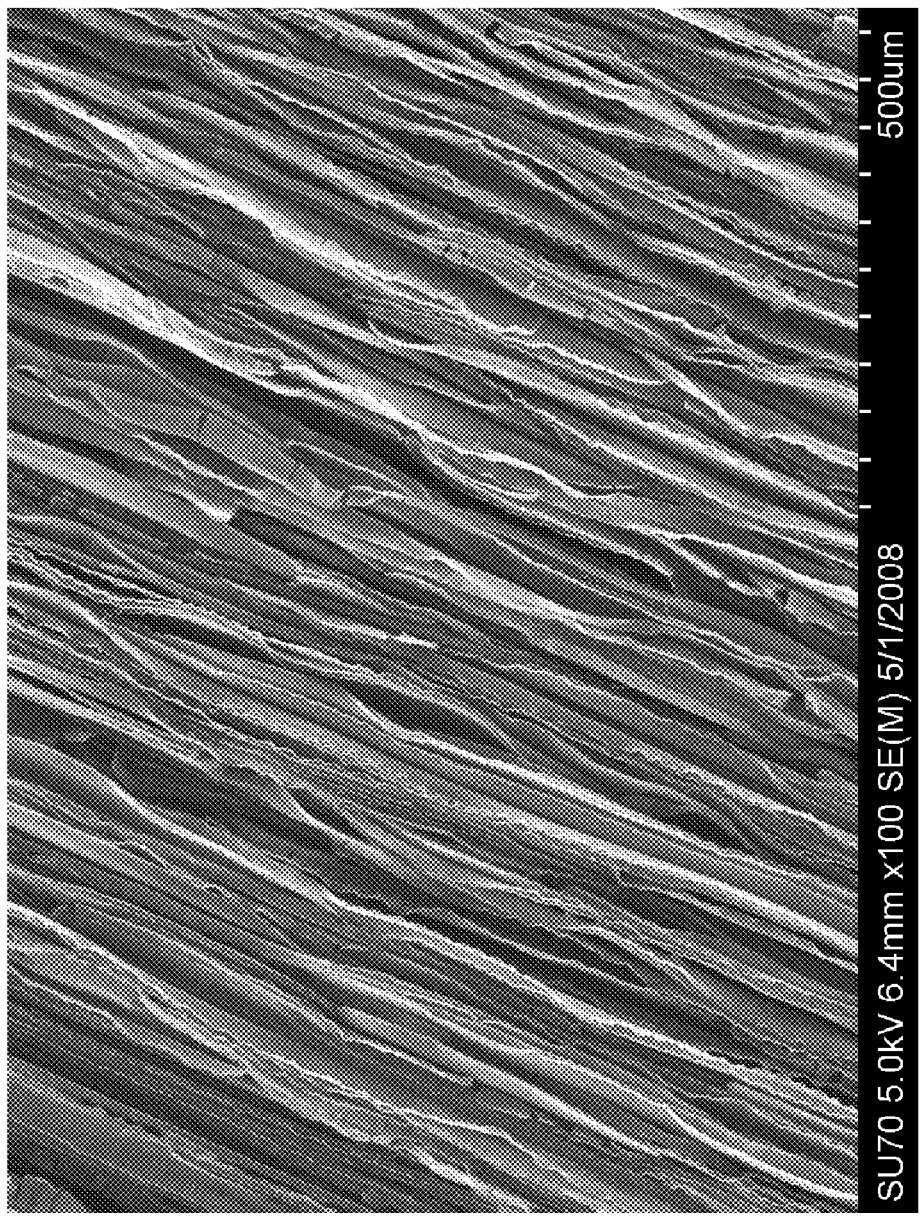
FIG. 6 shows a low magnification SEM of CNTs on carbon fiber demonstrating the uniformity of CNT density across the fibers within about 10% employing an apparatus of the present disclosure.

FIG. 1-6 shows TEM and SEM images of fiber materials prepared by the processes described herein. The procedures for preparing these materials are further detailed below and in Examples I-III. FIGS. 1 and 2 show TEM images of multi-walled and double-walled carbon nanotubes, respectively, that were prepared on an AS4 carbon fiber in a continuous process. FIG. 3 shows a scanning electron microscope (SEM) image of CNTs growing from within the barrier coating after the CNT-forming nanoparticle catalyst was mechanically infused to a carbon fiber material surface. FIG. 4 shows a SEM image demonstrating the consistency in length distribution of CNTs grown on a fiber material to within 20% of a targeted length of about 40 microns. FIG. 5 shows an SEM image demonstrating the effect of a barrier coating on CNT growth. Dense, well aligned CNTs grew where barrier coating was applied and no CNTs grew where barrier coating was absent. FIG. 6 shows a low magnification SEM of CNTs on fiber material demonstrating the uniformity of CNT density across the fibers within about 10%.

CNT-infused fiber materials can be used in a myriad of applications. For example, chopped CNT-infused fiber can be used in propellant applications. U.S. Pat. No. 4,072,546 describes the use of graphite fibers to augment propellant burning rate. The presence of CNTs infused on chopped carbon fiber can further enhance such burn rates. CNT-infused fiber materials can also be used in flame retardant applications as well. For example, the CNTs can form a protective char layer that retards burning of a material coated with a layer of CNT infused fiber material.

CNT-infused conductive fibers can be used in the manufacture of electrodes for superconductors. In the production of superconducting fibers, it can be challenging to achieve adequate adhesion of the superconducting layer to a fiber material due, in part, to the different coefficients of thermal expansion of the fiber material and of the superconducting layer. Another difficulty in the art arises during the coating of the fibers by the CVD process. For example, reactive gases, such as hydrogen gas or ammonia, can attack the fiber surface and/or form undesired hydrocarbon compounds on the fiber surface and make good adhesion of the superconducting layer more difficult. CNT-infused fiber materials with barrier coating can overcome these aforementioned challenges in the art.

CNT-infused fiber materials can enhance structural elements in aerospace and ballistics applications. For example, the structures such as nose cones in missiles, leading edge of wings, primary structural parts, such as flaps and aerofoils, propellers and air brakes, small plane fuselages, helicopter shells and rotor blades, aircraft secondary structural parts, such as floors, doors, seats, air conditioners, and secondary tanks and airplane motor parts can benefit from the structural enhancement provided by CNT-infused fiber materials. Structural enhancement in many other applications can include, for example, mine sweeper hulls, helmets, radomes, rocket nozzles, rescue stretchers, and engine components. In building and construction, structural enhancement of exterior features include columns, pediments, domes, cornices, and formwork. Likewise, in interior building structures such as blinds, sanitary-ware, window profiles, and the like can all benefit from the use of CNT-infused fiber materials.

The electrical properties of CNT-infused fibers also can impact various energy and electrical applications. For example, CNT-infused fiber materials can be used in wind turbine blades, solar structures, electronic enclosures, such as laptops, cell phones, computer cabinets, where such CNT-infused materials can be used in EMI shielding, for example. Other applications include powerlines, cooling devices, light poles, circuit boards, electrical junction boxes, ladder rails, optical fiber, power built into structures such as data lines, computer terminal housings, and business equipment, such as copiers, cash registers and mailing equipment.

Power transmission lines including CNT-infused fiber cores and/or CNT-infused fiber shields, according to one aspect of the present disclosure, may provide reduced cost to infrastructure due to both reduced sagging and the ability to traverse longer spans with fewer support structures. The power transmission lines, according to one aspect of the present disclosure, may display targeted conductivity and strength. Such targeted conductivity and strength can be achieved by altering the amount and alignment of CNTs in the structure. Improved target conductivity and strength of the fiber is not limited to CNT alignment and may include, but is not limited to CNT functionalization to further promote CNT-to-CNT, CNT-to-substrate, and CNT-to-matrix adhesion. Moreover, the fiber type itself may be readily altered to affect these properties as well. Power transmission lines, according to one aspect of the present disclosure, may also be readily configurable to conventional extruded wire arrangements for providing access to complex shapes by using CNT-infused fibers as described herein.

In some aspects of the disclosure a continuous process for CNT infusion is described that includes (a) disposing a carbon nanotube-forming catalyst on a surface of a fiber material of spoolable dimensions; and (b) synthesizing carbon nanotubes directly on the fiber material, thereby forming a carbon nanotube-infused fiber material. For a 9 foot long system, the linespeed of the process can range from between about 1.5 ft/min to about 108 ft/min. The linespeeds achieved by the process described herein allow the formation of commercially relevant quantities of CNT-infused fiber materials with short production times. For example, at 36 ft/min linespeed, the quantities of CNT-infused fibers (over 5% infused CNTs on fiber by weight) can exceed over 100 pound or more of material produced per day in a system that is designed to simultaneously process 5 separate tows (20 lb/tow). Systems can be made to produce more tows at once or at faster speeds by repeating growth zones. Moreover, some steps in the fabrication of CNTs, as known in the art, have prohibitively slow rates preventing a continuous mode of operation. For example, in a typical process known in the art, a CNT-forming catalyst reduction step can take 1-12 hours to perform. CNT growth itself can also be time consuming, for example requiring tens of minutes for CNT growth, precluding the rapid linespeeds realized in one aspect of the disclosure. The process described herein overcomes such rate limiting steps.

The CNT-infused fiber material-forming processes of one aspect of the disclosure can avoid CNT entanglement that occurs when trying to apply suspensions of pre-formed carbon nanotubes to fiber materials. That is, because pre-formed CNTs are not fused to the fiber material, the CNTs tend to bundle and entangle. The result is a poorly uniform distribution of CNTs that weakly adhere to the fiber material. Processes of some aspects of the disclosure, however, may provide, if desired, a highly uniform entangled CNT mat on the surface of the fiber material by reducing the growth density. The CNTs grown at low density are infused in the fiber material first. In such aspects, the fibers do not grow dense enough to induce vertical alignment, the result is entangled mats on the fiber material surfaces. By contrast, manual application of pre-formed CNTs does not insure uniform distribution and density of a CNT mat on the fiber material.

As described in further detail below, CNT-infused fiber based wires may provide improved data/power transmission capabilities, while preventing electromagnetic interference (EMI) via the inherent dispersed CNT properties. According to one aspect, the use of CNT-infused fibers in shielding applications reduces cost by eliminating the need from a layered sheathing structure, as well as enhancing stiffness and strength, particularly for power transmission line applications in which increasing spanning distance is important. Techniques for producing CNT-infused fiber materials according to some aspects of the present disclosure are now described.

Figure 7:
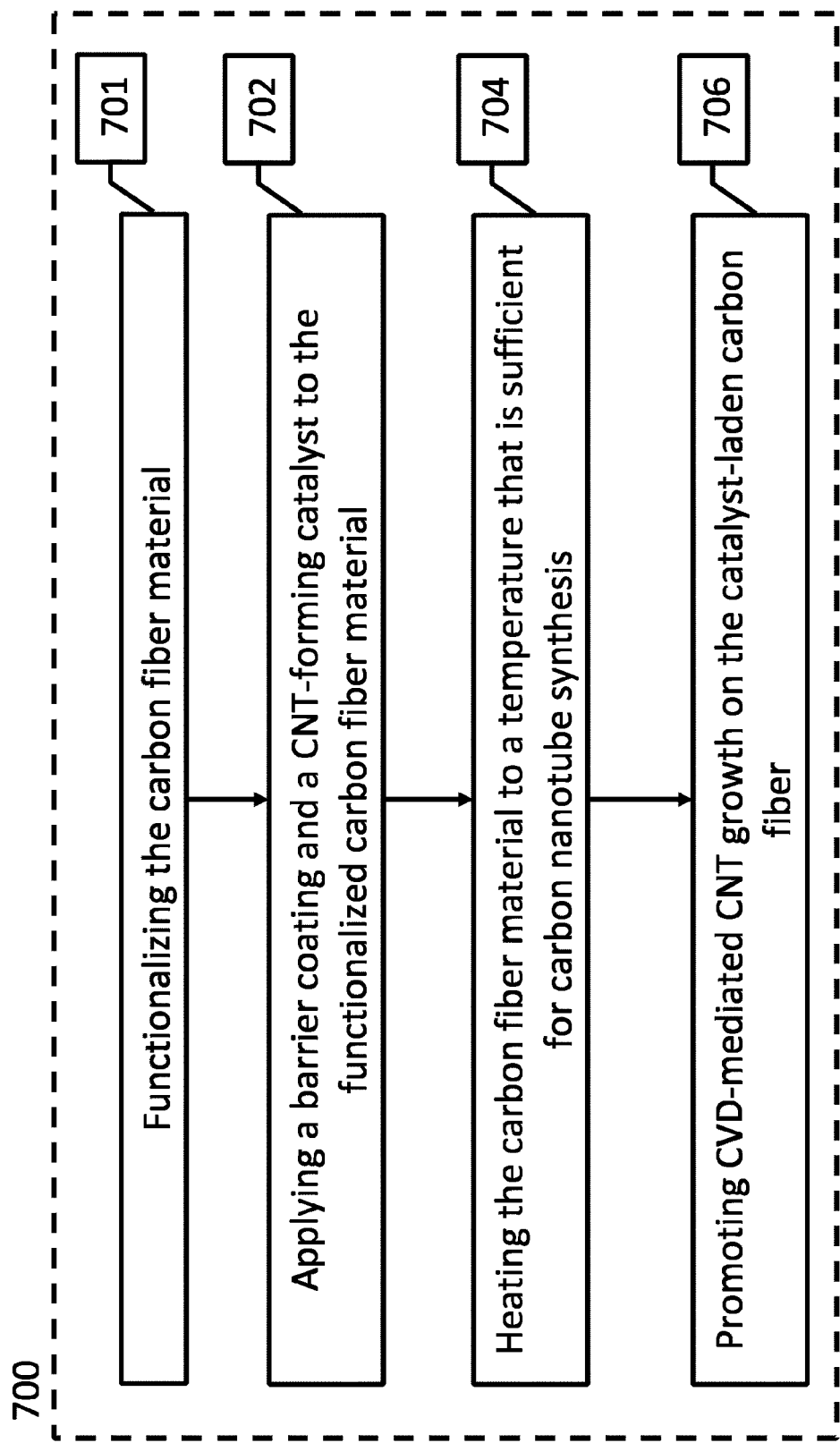
FIG. 7 shows a process for producing CNT-infused fiber material in accordance with the illustrative aspect of the present disclosure.

FIG. 7 depicts a flow diagram of process 700 for producing CNT-infused fiber material in accordance with an illustrative aspect of the disclosure.

Process 700 includes at least the operations of:

701: Functionalizing the fiber material.

702: Applying a barrier coating and a CNT-forming catalyst to the functionalized fiber material.

704: Heating the fiber material to a temperature that is sufficient for carbon nanotube synthesis.

706: Promoting CVD-mediated CNT growth on the catalyst-laden fiber material.

In step 701, the fiber material is functionalized to promote surface wetting of the fibers and to improve adhesion of the barrier coating.

To infuse carbon nanotubes into a fiber material, the carbon nanotubes are synthesized on the fiber material which is conformally coated with a barrier coating. In one aspect of the disclosure, this is accomplished by first conformally coating the fiber material with a barrier coating and then disposing nanotube-forming catalyst on the barrier coating, as per operation 702. In some aspects, the barrier coating can be partially cured prior to catalyst deposition. This can provide a surface that is receptive to receiving the catalyst and allowing it to embed in the barrier coating, including allowing surface contact between the CNT forming catalyst and the fiber material. In such aspects, the barrier coating can be fully cured after embedding the catalyst. In some aspects, the barrier coating is conformally coated over the fiber material simultaneously with deposition of the CNT-form catalyst. Once the CNT-forming catalyst and barrier coating are in place, the barrier coating can be fully cured.

In some aspects of the disclosure, the barrier coating can be fully cured prior to catalyst deposition. In such aspects, a fully cured barrier-coated fiber material can be treated with a plasma to prepare the surface to accept the catalyst. For example, a plasma treated fiber material having a cured barrier coating can provide a roughened surface in which the CNT-forming catalyst can be deposited. The plasma process for "roughing" the surface of the barrier thus facilitates catalyst deposition. The roughness is typically on the scale of nanometers. In the plasma treatment process craters or depressions are formed that are nanometers deep and nanometers in diameter. Such surface modification can be achieved using a plasma of any one or more of a variety of different gases, including, without limitation, argon, helium, oxygen, nitrogen, and hydrogen. In some aspects, plasma roughing can also be performed directly in the carbon fiber material itself. This can facilitate adhesion of the barrier coating to the carbon fiber material.

As described further below and in conjunction with FIG. 7, the catalyst is prepared as a liquid solution that contains CNT-forming catalyst that comprise transition metal nanoparticles. The diameters of the synthesized nanotubes are related to the size of the metal particles as described above. In some aspects of the disclosure, commercial dispersions of CNT-forming transition metal nanoparticle catalyst are available and are used without dilution, in other aspects commercial dispersions of catalyst can be diluted. Whether to dilute such solutions can depend on the desired density and length of CNT to be grown as described above.

With reference to the illustrative aspect of FIG. 7, carbon nanotube synthesis is shown based on a chemical vapor deposition (CVD) process and occurs at elevated temperatures. The specific temperature is a function of catalyst choice, but will typically be in a range of about 500 to 1000° C. Accordingly, operation 704 involves heating the barrier-coated carbon fiber material to a temperature in the aforementioned range to support carbon nanotube synthesis.

In operation 706, CVD-promoted nanotube growth on the catalyst-laden fiber material is then performed. The CVD process can be promoted by, for example, a carbon-containing feedstock gas such as acetylene, ethylene, and/or ethanol. The CNT synthesis processes generally use an inert gas (nitrogen, argon, helium) as a primary carrier gas. The carbon feedstock is provided in a range from between about 0% to about 15% of the total mixture. A substantially inert environment for CVD growth is prepared by removal of moisture and oxygen from the growth chamber.

In the CNT synthesis process, CNTs grow at the sites of a CNT-forming transition metal nanoparticle catalyst. The presence of the strong plasma-creating electric field can be optionally employed to affect nanotube growth. That is, the growth tends to follow the direction of the electric field. By properly adjusting the geometry of the plasma spray and electric field, vertically-aligned CNTs (i.e., perpendicular to the fiber material) can be synthesized. Under certain conditions, even in the absence of a plasma, closely-spaced nanotubes will maintain a vertical growth direction resulting in a dense array of CNTs resembling a carpet or forest. The presence of the barrier coating can also influence the directionality of CNT growth.

The operation of disposing a catalyst on the fiber material can be accomplished by spraying or dip coating a solution or by gas phase deposition via, for example, a plasma process. The choice of techniques can be coordinated with the mode with which the barrier coating is applied. Thus, in some aspects, after forming a solution of a catalyst in a solvent, catalyst can be applied by spraying or dip coating the barrier coated fiber material with the solution, or combinations of spraying and dip coating. Either technique, used alone or in combination, can be employed once, twice, thrice, four times, up to any number of times to provide a fiber material that is sufficiently uniformly coated with CNT-forming catalyst. When dip coating is employed, for example, a fiber material can be placed in a first dip bath for a first residence time in the first dip bath. When employing a second dip bath, the fiber material can be placed in the second dip bath for a second residence time. For example, fiber materials can be subjected to a solution of CNT-forming catalyst for between about 3 seconds to about 90 seconds depending on the dip configuration and linespeed. Employing spraying or dip coating processes, a fiber material with a surface density of catalyst of less than about 5% surface coverage to as high as about 80% coverage, in which the CNT-forming catalyst nanoparticles are nearly monolayer. In some aspects, the process of coating the CNT-forming catalyst on the fiber material should produce no more than a monolayer. For example, CNT growth on a stack of CNT-forming catalyst can erode the degree of infusion of the CNT to the fiber material. In other aspects, the transition metal catalyst can be deposited on the fiber material using evaporation techniques, electrolytic deposition techniques, and other processes known to those skilled in the art, such as addition of the transition metal catalyst to a plasma feedstock gas as a metal organic, metal salt or other composition promoting gas phase transport.

Because processes of some aspects of the disclosure are designed to be continuous, a spoolable fiber material can be dip-coated in a series of baths where dip coating baths are spatially separated. In a continuous process in which nascent fiber materials are being generated de novo, dip bath or spraying of CNT-forming catalyst can be the first step after applying and curing or partially curing a barrier coating to the fiber material. Application of the barrier coating and a CNT-forming catalyst can be performed in lieu of application of a sizing, for newly formed fiber materials. In other aspects, the CNT-forming catalyst can be applied to newly formed fibers in the presence of other sizing agents after barrier coating. Such simultaneous application of CNT-forming catalyst and other sizing agents can still provide the CNT-forming catalyst in surface contact with the barrier coating of the fiber material to insure CNT infusion.

The catalyst solution employed can be a transition metal nanoparticle which can be any d-block transition metal as described above. In addition, the nanoparticles can include alloys and non-alloy mixtures of d-block metals in elemental form or in salt form, and mixtures thereof. Such salt forms include, without limitation, oxides, carbides, and nitrides. Non-limiting exemplary transition metal NPs include Ni, Fe, Co, Mo, Cu, Pt, Au, and Ag and salts thereof and mixtures thereof. In some aspects, such CNT-forming catalysts are disposed on the fiber material by applying or infusing a CNT-forming catalyst directly to the fiber material simultaneously with barrier coating deposition. Many of these transition metal catalysts are readily commercially available from a variety of suppliers, including, for example, Ferrotec Corporation (Bedford, N.H.).

Catalyst solutions used for applying the CNT-forming catalyst to the fiber material can be in any common solvent that allows the CNT-forming catalyst to be uniformly dispersed throughout. Such solvents can include, without limitation, water, acetone, hexane, isopropyl alcohol, toluene, ethanol, methanol, tetrahydrofuran (THF), cyclohexane or any other solvent with controlled polarity to create an appropriate dispersion of the CNT-forming catalyst nanoparticles. Concentrations of CNT-forming catalyst can be in a range from about 1:1 to 1:10000 catalyst to solvent. Such concentrations can be used when the barrier coating and CNT-forming catalyst is applied simultaneously as well.

In some aspects heating of the fiber material can be at a temperature that is between about 500° C. and 1000° C. to synthesize carbon nanotubes after deposition of the CNT-forming catalyst. Heating at these temperatures can be performed prior to or substantially simultaneously with introduction of a carbon feedstock for CNT growth.

In some aspects, the present disclosure may provide a process that includes removing sizing agents from a fiber material, applying a barrier coating conformally over the fiber material, applying a CNT-forming catalyst to the fiber material, heating the carbon fiber material to at least 500° C., and synthesizing carbon nanotubes on the fiber material. In some aspects, operations of the CNT-infusion process include removing sizing from a fiber material, applying a barrier coating to the fiber material, applying a CNT-forming catalyst to the fiber material, heating the fiber to CNT-synthesis temperature and CVD-promoted CNT growth the catalyst-laden carbon fiber material. Thus, where commercial fiber materials are employed, processes for constructing CNT-infused fiber materials can include a discrete step of removing sizing from the fiber material before disposing barrier coating and the catalyst on the fiber material.

The step of synthesizing carbon nanotubes can include numerous techniques for forming carbon nanotubes, including those disclosed in co-pending U.S. Patent Application No. U.S. 2004/0245088 which is incorporated herein by reference. The CNTs grown on fibers of some aspects of the present disclosure can be accomplished by techniques known in the art including, without limitation, micro-cavity, thermal or plasma-enhanced CVD techniques, laser ablation, arc discharge, and high pressure carbon monoxide (HiPCO). During CVD, in particular, a barrier coated fiber material with CNT-forming catalyst disposed thereon, can be used directly. In some aspects, any conventional sizing agents can be removed prior CNT synthesis. In some aspects, acetylene gas is ionized to create a jet of cold carbon plasma for CNT synthesis. The plasma is directed toward the catalyst-bearing fiber material. Thus, in some aspects synthesizing CNTs on a fiber material includes (a) forming a carbon plasma; and (b) directing the carbon plasma onto the catalyst disposed on the fiber material. The diameters of the CNTs that are grown are dictated by the size of the CNT-forming catalyst as described above. In some aspects, the sized fiber substrate is heated to between about 550 to about 800° C. to facilitate CNT synthesis. To initiate the growth of CNTs, two gases are bled into the reactor: a process gas such as argon, helium, or nitrogen, and a carbon-containing gas, such as acetylene, ethylene, ethanol or methane. CNTs grow at the sites of the CNT-forming catalyst.

In some aspects, the CVD growth is plasma-enhanced. A plasma can be generated by providing an electric field during the growth process. CNTs grown under these conditions can follow the direction of the electric field. Thus, by adjusting the geometry of the reactor vertically aligned carbon nanotubes can be grown radially about a cylindrical fiber. In some aspects, a plasma is not required for radial growth about the fiber. For carbon fiber materials that have distinct sides such as tapes, mats, fabrics, plies, and the like, catalyst can be disposed on one or both sides and correspondingly, CNTs can be grown on one or both sides as well.

As described above, CNT-synthesis is performed at a rate sufficient to provide a continuous process for functionalizing spoolable carbon fiber materials. Numerous apparatus configurations facilitate such continuous synthesis as exemplified below.

In some aspects of the disclosure, CNT-infused fiber materials can be constructed in an "all plasma" process. An all plasma process can begin with roughing the fiber material with a plasma as described above to improve fiber surface wetting characteristics and provide a more conformal barrier coating, as well as improve coating adhesion via mechanical interlocking and chemical adhesion through the use of functionalization of the fiber material by using specific reactive gas species, such as oxygen, nitrogen, hydrogen in argon or helium based plasmas.

Barrier coated fiber materials pass through numerous further plasma-mediated steps to form the final CNT-infused product. In some aspects, the all plasma process can include a second surface modification after the barrier coating is cured. This is a plasma process for "roughing" the surface of the barrier coating on the fiber material to facilitate catalyst deposition. As described above, surface modification can be achieved using a plasma of any one or more of a variety of different gases, including, without limitation, argon, helium, oxygen, ammonia, hydrogen, and nitrogen.

After surface modification, the barrier coated fiber material proceeds to catalyst application. This is a plasma process for depositing the CNT-forming catalyst on the fibers. The CNT-forming catalyst is typically a transition metal as described above. The transition metal catalyst can be added to a plasma feedstock gas as a precursor in the form of a ferrofluid, a metal organic, metal salt or other composition for promoting gas phase transport. The catalyst can be applied at room temperature in the ambient environment with neither vacuum nor an inert atmosphere being required. In some aspects, the fiber material is cooled prior to catalyst application.

Continuing the all-plasma process, carbon nanotube synthesis occurs in a CNT-growth reactor. This can be achieved through the use of plasma-enhanced chemical vapor deposition, wherein carbon plasma is sprayed onto the catalyst-laden fibers. Since carbon nanotube growth occurs at elevated temperatures (typically in a range of about 500 to 1000° C. depending on the catalyst), the catalyst-laden fibers can be heated prior to exposing to the carbon plasma. For the infusion process, the fiber material can be optionally heated until it softens. After heating, the fiber material is ready to receive the carbon plasma. The carbon plasma is generated, for example, by passing a carbon containing gas such as acetylene, ethylene, ethanol, and the like, through an electric field that is capable of ionizing the gas. This cold carbon plasma is directed, via spray nozzles, to the carbon fiber material. The fiber material can be in close proximity to the spray nozzles, such as within about 1 centimeter of the spray nozzles, to receive the plasma. In some aspects, heaters are disposed above the fiber material at the plasma sprayers to maintain the elevated temperature of the fiber material.

In some aspects of the present disclosure, the dense CNT arrays on the fiber surface can be aligned radially on the fiber circumference ("radial orientation"), as synthesized, or can be manipulated post-synthesis such that they are realigned parallel to the fiber axis ("axial orientation"). Post-growth reorienting of the CNTs infused to the fiber can be achieved by mechanical or chemical means or by use of an electrical field. In one aspect of the present disclosure post-growth reorientation of the CNTs infused on the fiber may be performed for realigning the CNTs infused onto the fiber material to be axially aligned along and parallel to an axis of the fiber material if an axial orientation is required. In one aspect, an axial orientation may be required if a CNT-infused fiber is to operate as a power transmission medium and/or a reinforcement core of a power transmission cable. In a further aspect, a radial orientation may be required if a CNT-infused fiber is to operate, for example, as an EMI shield of a self-shielding wire.

In some aspects of the disclosure, the CNT-infused fibers can be bound within a matrix or can exist as dry unbound fibers. In accordance with a further aspect, a plurality of CNT-infused fibers may be bound within a composite matrix to form an CNT-infused composite core to provide, for example, a reinforcement core and/or a power transmission medium. In the case where a matrix is used, it can include virtually any matrix material including, for example, ceramic, metal, thermoset, or thermoplastic materials. Matrix materials can be included with a CNT-infused fiber material by any method known to one skilled in the art including, but not limited to, dipping, extruding, mixing, spraying, intercalating, infiltrating, disposing, and the like. Including the matrix material with CNT-infused fiber material can occur in-line with the production of the CNT-infused fiber material or as a post-processing step. In embodiments with a matrix material included with a CNT-infused fiber, the matrix material can advantageously assist in holding the CNTs in a desired orientation relative to the fiber material. In some embodiments, the method by which the matrix material is included with CNT-infused fiber material can be used to control alignment of the CNTs relative to the fiber material, e.g., extruding. In some embodiments, the CNTs can be aligned relative to the fiber material prior to including a matrix material. In some embodiments, the matrix material can be cured after being included with the CNT-infused fiber material. The following reactor configuration is useful for continuous carbon nanotube synthesis to generate CNT-infused fibers used in power transmission lines, according to one aspect of the disclosure.

Another configuration for continuous carbon nanotube synthesis involves a special rectangular reactor for the synthesis and growth of carbon nanotubes directly on fiber materials. The reactor can be designed for use in a continuous in-line process for producing carbon-nanotube bearing fibers. In some aspects, CNTs are grown via a chemical vapor deposition ("CVD") process at atmospheric pressure and at elevated temperature in the range of about 550° C. to about 800° C. in a multi-zone reactor. The fact that the synthesis occurs at atmospheric pressure is one factor that facilitates the incorporation of the reactor into a continuous processing line for CNT-on-fiber synthesis. Another advantage consistent with in-line continuous processing using such a zone reactor is that CNT growth occurs in a seconds, as opposed to minutes (or longer) as in other procedures and apparatus configurations typical in the art.

CNT synthesis reactors in accordance with the various aspects include the following features:

Rectangular Configured Synthesis Reactors: The cross section of a typical CNT synthesis reactor known in the art is circular. There are a number of reasons for this including, for example, historical reasons (cylindrical reactors are often used in laboratories) and convenience (flow dynamics are easy to model in cylindrical reactors, heater systems readily accept circular tubes (quartz, etc.), and ease of manufacturing.

Departing from the cylindrical convention, in one aspect, the present disclosure provides a CNT synthesis reactor having a rectangular cross section. The reasons for the departure are as follows: 1. Since many carbon fiber materials that can be processed by the reactor are relatively planar such as flat tape or sheet-like in form, a circular cross section is an inefficient use of the reactor volume. This inefficiency results in several drawbacks for cylindrical CNT synthesis reactors including, for example, a) maintaining a sufficient system purge; increased reactor volume requires increased gas flow rates to maintain the same level of gas purge. This results in a system that is inefficient for high volume production of CNTs in an open environment; b) increased carbon feedstock gas flow; the relative increase in inert gas flow, as per a) above, requires increased carbon feedstock gas flows. Consider that the volume of a 12K carbon fiber tow is 2000 times less than the total volume of a synthesis reactor having a rectangular cross section. In an equivalent growth cylindrical reactor (i.e., a cylindrical reactor that has a width that accommodates the same planarized carbon fiber material as the rectangular cross-section reactor), the volume of the carbon fiber material is 17,500 times less than the volume of the chamber.

Although gas deposition processes, such as CVD, are typically governed by pressure and temperature alone, volume has a significant impact on the efficiency of deposition. With a rectangular reactor there is a still excess volume. This excess volume facilitates unwanted reactions; yet a cylindrical reactor has about eight times that volume. Due to this greater opportunity for competing reactions to occur, the desired reactions effectively occur more slowly in a cylindrical reactor chamber. Such a slow down in CNT growth, is problematic for the development of a continuous process. One benefit of a rectangular reactor configuration is that the reactor volume can be decreased by using a small height for the rectangular chamber to make this volume ratio better and reactions more efficient. In some aspects of the present disclosure, the total volume of a rectangular synthesis reactor is no more than about 3000 times greater than the total volume of a fiber material being passed through the synthesis reactor. In some further aspects, the total volume of the rectangular synthesis reactor is no more than about 4000 times greater than the total volume of the fiber material being passed through the synthesis reactor.

In some still further aspects, the total volume of the rectangular synthesis reactor is less than about 10,000 times greater than the total volume of the fiber material being passed through the synthesis reactor. Additionally, it is notable that when using a cylindrical reactor, more carbon feedstock gas is required to provide the same flow percent as compared to reactors having a rectangular cross section. It should be appreciated that in some other aspects, the synthesis reactor has a cross section that is described by polygonal forms that are not rectangular, but are relatively similar thereto and provide a similar reduction in reactor volume relative to a reactor having a circular cross section; c) problematic temperature distribution; when a relatively small-diameter reactor is used, the temperature gradient from the center of the chamber to the walls thereof is minimal. But with increased size, such as would be used for commercial-scale production, the temperature gradient increases. Such temperature gradients result in product quality variations across a fiber material substrate (i.e., product quality varies as a function of radial position). This problem is substantially avoided when using a reactor having a rectangular cross section.

In particular, when a planar substrate is used, reactor height can be maintained constant as the size of the substrate scales upward. Temperature gradients between the top and bottom of the reactor are essentially negligible and, as a consequence, thermal issues and the product-quality variations that result are avoided. 2. Gas introduction: Because tubular furnaces are normally employed in the art, typical CNT synthesis reactors introduce gas at one end and draw it through the reactor to the other end. In some aspects disclosed herein, gas can be introduced at the center of the reactor or within a target growth zone, symmetrically, either through the sides or through the top and bottom plates of the reactor. This improves the overall CNT growth rate because the incoming feedstock gas is continuously replenishing at the hottest portion of the system, which is where CNT growth is most active. This constant gas replenishment is an important aspect to the increased growth rate exhibited by the rectangular CNT reactors.

Zoning. Chambers that provide a relatively cool purge zone depend from both ends of the rectangular synthesis reactor. Applicants have determined that if hot gas were to mix with the external environment (i.e., outside of the reactor), there would be an increase in degradation of the fiber material. The cool purge zones provide a buffer between the internal system and external environments. Typical CNT synthesis reactor configurations known in the art typically require that the substrate is carefully (and slowly) cooled. The cool purge zone at the exit of the present rectangular CNT growth reactor achieves the cooling in a short period of time, as required for the continuous in-line processing.

Non-contact, hot-walled, metallic reactor. In some aspects, a hot-walled reactor is made of metal is employed, in particular stainless steel. This may appear counterintuitive because metal, and stainless steel in particular, is more susceptible to carbon deposition (i.e., soot and by-product formation). Thus, most CNT reactor configurations use quartz reactors because there is less carbon deposited, quartz is easier to clean, and quartz facilitates sample observation. However, Applicants have observed that the increased soot and carbon deposition on stainless steel results in more consistent, faster, more efficient, and more stable CNT growth. Without being bound by theory it has been indicated that, in conjunction with atmospheric operation, the CVD process occurring in the reactor is diffusion limited. That is, the catalyst is "overfed;" too much carbon is available in the reactor system due to its relatively higher partial pressure (than if the reactor was operating under partial vacuum). As a consequence, in an open system—especially a clean one—too much carbon can adhere to catalyst particles, compromising their ability to synthesize CNTs. In some aspects, the rectangular reactor is intentionally run when the reactor is "dirty," that is with soot deposited on the metallic reactor walls. Once carbon deposits to a monolayer on the walls of the reactor, carbon will readily deposit over itself. Since some of the available carbon is "withdrawn" due to this mechanism, the remaining carbon feedstock, in the form of radicals, react with the catalyst at a rate that does not poison the catalyst. Existing systems run "cleanly" which, if they were open for continuous processing, would produced a much lower yield of CNTs at reduced growth rates.

Although it is generally beneficial to perform CNT synthesis "dirty" as described above, certain portions of the apparatus, such as gas manifolds and inlets, can nonetheless negatively impact the CNT growth process when soot created blockages. In order to combat this problem, such areas of the CNT growth reaction chamber can be protected with soot inhibiting coatings such as silica, alumina, or MgO. In practice, these portions of the apparatus can be dip-coated in these soot inhibiting coatings. Metals such as INVAR® can be used with these coatings as INVAR has a similar CTE (coefficient of thermal expansion) ensuring proper adhesion of the coating at higher temperatures, preventing the soot from significantly building up in critical zones.

Combined Catalyst Reduction and CNT Synthesis. In the CNT synthesis reactor disclosed herein, both catalyst reduction and CNT growth occur within the reactor. This is significant because the reduction step cannot be accomplished timely enough for use in a continuous process if performed as a discrete operation. In a typical process known in the art, a reduction step typically takes 1-12 hours to perform. Both operations occur in a reactor in accordance with the present disclosure due, at least in part, to the fact that carbon feedstock gas is introduced at the center of the reactor, not the end as would be typical in the art using cylindrical reactors. The reduction process occurs as the fibers enter the heated zone; by this point, the gas has had time to react with the walls and cool off prior to reacting with the catalyst and causing the oxidation reduction (via hydrogen radical interactions). It is this transition region where the reduction occurs. At the hottest isothermal zone in the system, the CNT growth occurs, with the greatest growth rate occurring proximal to the gas inlets near the center of the reactor.

In some aspects of the disclosure, when loosely affiliated carbon fiber materials, such as carbon tow are employed, the continuous process can include steps that spreads out the strands and/or filaments of the tow. Thus, as a tow is unspooled it can be spread using a vacuum-based fiber spreading system, for example. When employing sized fiber materials, which can be relatively stiff, additional heating can be employed in order to "soften" the tow to facilitate fiber spreading. The spread fibers which comprise individual filaments can be spread apart sufficiently to expose an entire surface area of the filaments, thus allowing the tow to more efficiently react in subsequent process steps. Such spreading can approach between about 4 inches to about 6 inches across for a 3 k tow. The spread carbon tow can pass through a surface treatment step that is composed of a plasma system as described above. After a barrier coating is applied and roughened, spread fibers then can pass through a CNT-forming catalyst dip bath. The result is fibers of the carbon tow that have catalyst particles distributed radially on their surface. The catalyzed-laden fibers of the tow then enter an appropriate CNT growth chamber, such as the rectangular chamber described above, where a flow through atmospheric pressure CVD or PE-CVD process is used to synthesize the CNTs at rates as high as several microns per second. The fibers of the tow, now with radially aligned CNTs, exit the CNT growth reactor.

In some aspects of the disclosure, CNT-infused fiber materials can pass through yet another treatment process that, in some aspects is a plasma process used to functionalize the CNTs. Additional functionalization of CNTs can be used to promote their adhesion to particular resins. Thus, in some aspects, the present disclosure provides CNT-infused fiber materials having functionalized CNTs.

As part of the continuous processing of spoolable fiber materials, the a CNT-infused fiber material can further pass through a sizing dip bath to apply any additional sizing agents which can be beneficial in a final product. Finally if wet winding is desired, the CNT-infused fiber materials can be passed through a resin bath and wound on a mandrel or spool. The resulting fiber material/resin combination locks the CNTs on the fiber material allowing for easier handling and composite fabrication. In some aspects, CNT infusion is used to provide improved filament winding. Thus, CNTs formed on fiber materials such as carbon tow, are passed through a resin bath to produce resin-impregnated, CNT-infused carbon tow. After resin impregnation, the carbon tow can be positioned on the surface of a rotating mandrel by a delivery head. The tow can then be wound onto the mandrel in a precise geometric pattern in known fashion.

The winding process described above provides pipes, tubes, or other forms as are characteristically produced via a male mold. But the forms made from the winding process disclosed herein differ from those produced via conventional filament winding processes. Specifically, in the process disclosed herein, the forms are made from composite materials that include CNT-infused tow. Such forms will therefore benefit from enhanced strength and the like, as provided by the CNT-infused tow.

In some aspects of the disclosure, a continuous process for infusion of CNTs on spoolable fiber materials can achieve a linespeed between about 0.5 ft/min to about 36 ft/min. In this aspect where the CNT growth chamber is 3 feet long and operating at a 750° C. growth temperature, the process can be run with a linespeed of about 6 ft/min to about 36 ft/min to produce, for example, CNTs having a length between about 1 micron to about 10 microns. The process can also be run with a linespeed of about 1 ft/min to about 6 ft/min to produce, for example, CNTs having a length between about 10 microns to about 100 microns. The process can be run with a linespeed of about 0.5 ft/min to about 1 ft/min to produce, for example, CNTs having a length between about 100 microns to about 200 microns. The CNT length is not tied only to linespeed and growth temperature, however, the flow rate of both the carbon feedstock and the inert carrier gases can also influence CNT length. For example, a flow rate consisting of less than 1% carbon feedstock in inert gas at high linespeeds (6 ft/min to 36 ft/min) will result in CNTs having a length between 1 micron to about 5 microns. A flow rate consisting of more than 1% carbon feedstock in inert gas at high linespeeds (6 ft/min to 36 ft/min) will result in CNTs having length between 5 microns to about 10 microns.

In some aspects of the disclosure, more than one fiber material can be run simultaneously through the process. For example, multiple tapes tows, filaments, strand and the like can be run through the process in parallel. Thus, any number of pre-fabricated spools of fiber material can be run in parallel through the process and re-spooled at the end of the process. The number of spooled fiber materials that can be run in parallel can include one, two, three, four, five, six, up to any number that can be accommodated by the width of the CNT-growth reaction chamber. Moreover, when multiple fiber materials are run through the process, the number of collection spools can be less than the number of spools at the start of the process. In such aspects, strands, tows, or the like can be sent through a further process of combining such fiber materials into higher ordered fiber materials such as woven fabrics or the like. The continuous process can also incorporate a post processing chopper that facilitates the formation CNT-infused chopped fiber mats, for example.

In some aspects, processes of the disclosure allow for synthesizing a first amount of a first type of carbon nanotube on the fiber material, in which the first type of carbon nanotube is selected to alter at least one first property of the fiber material. Subsequently, some processes of the disclosure allow for synthesizing a second amount of a second type of carbon nanotube on the fiber material, in which the second type of carbon nanotube is selected to alter at least one second property of the fiber material.

In some aspects of the disclosure, the first amount and second amount of CNTs are different. This can be accompanied by a change in the CNT type or not. Thus, varying the density of CNTs can be used to alter the properties of the original fiber material, even if the CNT type remains unchanged. CNT type can include CNT length and the number of walls, for example. In some aspects of the disclosure the first amount and the second amount are the same. If different properties are desirable in this case along the two different stretches of the spoolable material, then the CNT type can be changed, such as the CNT length. For example, longer CNTs can be useful in electrical/thermal applications, while shorter CNTs can be useful in mechanical strengthening applications.

In light of the aforementioned discussion regarding altering the properties of the fiber materials, the first type of carbon nanotube and the second type of carbon nanotube can be the same, in some aspects, while the first type of carbon nanotube and the second type of carbon nanotube can be different, in other aspects. Likewise, the first property and the second property can be the same, in some aspects. For example, the EMI shielding property can be the property of interest addressed by the first amount and type of CNTs and the 2nd amount and type of CNTs, but the degree of change in this property can be different, as reflected by differing amounts, and/or types of CNTs employed. Finally, in some aspects, the first property and the second property can be different. Again this may reflect a change in CNT type. For example the first property can be mechanical strength with shorter CNTs, while the second property can be electrical/thermal properties with longer CNTs. One skilled in the art will recognize the ability to tailor the properties of the carbon fiber material through the use of different CNT densities, CNT lengths, and the number of walls in the CNTs, such as single-walled, double-walled, and multi-walled, for example.

In some aspects, processes of the present disclosure may provide synthesizing a first amount of carbon nanotubes on a fiber material, such that this first amount allows the carbon nanotube-infused fiber material to exhibit a second group of properties that differ from a first group of properties exhibited by the fiber material itself. That is, selecting an amount that can alter one or more properties of the fiber material, such as tensile strength. The first group of properties and second group of properties can include at least one of the same properties, thus representing enhancing an already existing property of the fiber material. In some aspects, CNT infusion can impart a second group of properties to the carbon nanotube-infused fiber material that is not included among the first group of properties exhibited by the fiber material itself.

In some aspects of the disclosure, a first amount of carbon nanotubes is selected such that the value of at least one property selected from the group consisting of tensile strength, Young's Modulus, shear strength, shear modulus, toughness, compression strength, compression modulus, density, EM wave absorptivity/reflectivity, acoustic transmittance, electrical conductivity, and thermal conductivity of the carbon nanotube-infused fiber material differs from the value of the same property of the fiber material itself.

Tensile strength can include three different measurements: 1) Yield strength which evaluates the stress at which material strain changes from elastic deformation to plastic deformation, causing the material to deform permanently; 2) Ultimate strength which evaluates the maximum stress a material can withstand when subjected to tension, compression or shearing; and 3) Breaking strength which evaluates the stress coordinate on a stress-strain curve at the point of rupture. Composite shear strength evaluates the stress at which a material fails when a load is applied perpendicular to the fiber direction. Compression strength evaluates the stress at which a material fails when a compressive load is applied.

Multiwalled carbon nanotubes, in particular, have the highest tensile strength of any material yet measured, with a tensile strength of 63 GPa having been achieved. Moreover, theoretical calculations have indicated possible tensile strengths of CNTs of about 300 GPa. Thus, CNT-infused fiber materials are expected to have substantially higher ultimate strength compared to the parent fiber material. As described above, the increase in tensile strength will depend on the exact nature of the CNTs used as well as the density and distribution on the fiber material. CNT-infused fiber materials can exhibit a two to three times increase in tensile properties, for example. Exemplary CNT-infused fiber materials can have as high as three times the shear strength as the parent unfunctionalized fiber material and as high as 2.5 times the compression strength, which may be particularly important for increasing the spanning distance of power transmission cables according to some aspects of the present disclosure.

Young's modulus is a measure of the stiffness of an isotropic elastic material. It is defined as the ratio of the uniaxial stress over the uniaxial strain in the range of stress in which Hooke's Law holds. This can be experimentally determined from the slope of a stress-strain curve created during tensile tests conducted on a sample of the material.

Electrical conductivity or specific conductance is a measure of a material's ability to conduct an electric current. CNTs with particular structural parameters such as the degree of twist, which relates to CNT chirality, can be highly conducting, thus exhibiting metallic properties. A recognized system of nomenclature (M. S. Dresselhaus, et al. Science of Fullerenes and Carbon Nanotubes, Academic Press, San Diego, Calif. pp. 756-760, (1996)) has been formalized and is recognized by those skilled in the art with respect to CNT chirality. Thus, for example, CNTs are distinguished from each other by a double index (n,m) where n and m are integers that describe the cut and wrapping of hexagonal graphite so that it makes a tube when it is wrapped onto the surface of a cylinder and the edges are sealed together. When the two indices are the same, m=n, the resultant tube is said to be of the "arm-chair" (or n,n) type, since when the tube is cut perpendicular to the CNT axis only the sides of the hexagons are exposed and their pattern around the periphery of the tube edge resembles the arm and seat of an arm chair repeated n times. Arm-chair CNTs, in particular SWNTs, are metallic, and have extremely high electrical and thermal conductivity. In addition, such SWNTs have-extremely high tensile strength.

In addition to the degree of twist CNT diameter also effects electrical conductivity. As described above, CNT diameter can be controlled by use of controlled size CNT-forming catalyst nanoparticles. CNTs can also be formed as semiconducting materials. Conductivity in multi-walled CNTs (MWNTs) can be more complex. Interwall reactions within MWNTs can redistribute current over individual tubes non-uniformly. By contrast, there is no change in current across different parts of metallic single-walled nanotubes (SWNTs). Carbon nanotubes also have very high thermal conductivity, comparable to diamond crystal and in-plane graphite sheet.

The CNT-infused fiber materials can benefit from the presence of CNTs not only in the properties described above, but can also provide lighter materials in the process. Thus, such lower density and higher strength materials translates to greater strength to weight ratio. In one aspect of the present disclosure, the greater strength to weight ratio of CNT infused fiber may provide an improved power transmission cable that includes a high strength CNT-infused core for reducing sagging, while improving power transmission capability.

It is understood that modifications which do not substantially affect the activity of the various aspects of the present disclosure are also included within the definition of the disclosure provided herein. Accordingly, the following examples are intended to illustrate but not limit the present disclosure.

EXAMPLE I

This example shows how a fiber material can be infused with CNTs in a continuous process to target thermal and electrical conductivity improvements.

In this example, the maximum loading of CNTs on fibers is targeted. 34-700 12 k carbon fiber tow with a tex value of 800 (Grafil Inc., Sacramento, Calif.) is implemented as the carbon fiber substrate. The individual filaments in this carbon fiber tow have a diameter of approximately 7 µm.

Figure 8:
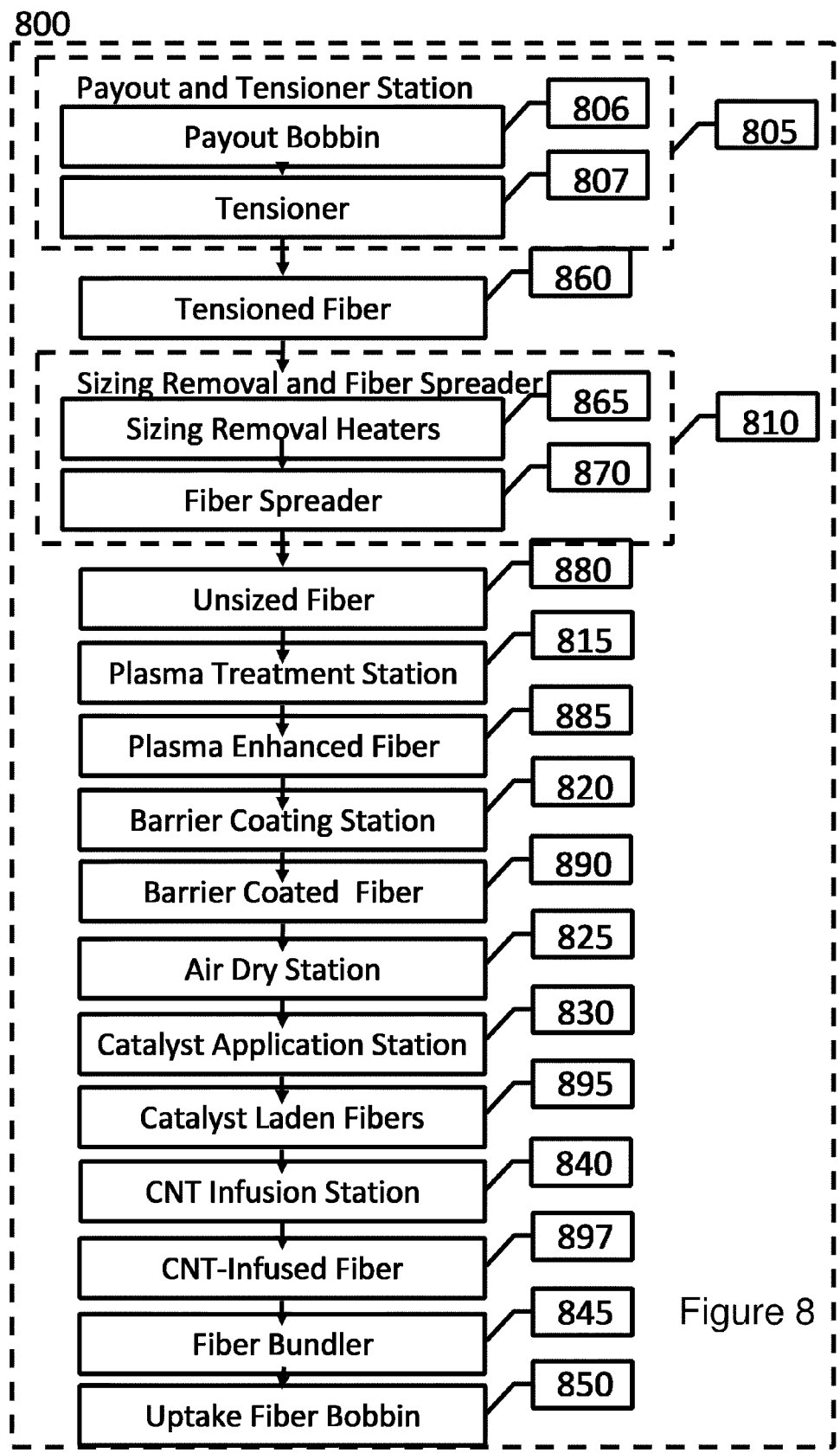
FIG. 8 shows how a carbon fiber material can be infused with CNTs in a continuous process to target thermal and electrical conductivity improvements.

FIG. 8 depicts system 800 for producing CNT-infused fiber in accordance with the illustrative aspect of the present disclosure. System 800 includes a carbon fiber material payout and tensioner station 805, sizing removal and fiber spreader station 810, plasma treatment station 815, barrier coating application station 820, air dry station 825, catalyst application station 830, solvent flash-off station 835, CNT-infusion station 840, fiber bundler station 845, and carbon fiber material uptake bobbin 850, interrelated as shown.

Payout and tension station 805 includes payout bobbin 806 and tensioner 807. The payout bobbin delivers carbon fiber material 860 to the process; the fiber is tensioned via tensioner 807. For this example, the carbon fiber is processed at a linespeed of 2 ft/min.

Fiber material 860 is delivered to sizing removal and fiber spreader station 810 which includes sizing removal heaters 865 and fiber spreader 870. At this station, any "sizing" that is on fiber 860 is removed. Typically, removal is accomplished by burning the sizing off of the fiber. Any of a variety of heating means can be used for this purpose, including, for example, an infrared heater, a muffle furnace, and other non-contact heating processes. Sizing removal can also be accomplished chemically. The fiber spreader separates the individual elements of the fiber. Various techniques and apparatuses can be used to spread fiber, such as pulling the fiber over and under flat, uniform-diameter bars, or over and under variable-diameter bars, or over bars with radially-expanding grooves and a kneading roller, over a vibratory bar, etc. Spreading the fiber enhances the effectiveness of downstream operations, such as plasma application, barrier coating application, and catalyst application, by exposing more fiber surface area.

Multiple sizing removal heaters 865 can be placed throughout the fiber spreader 870 which allows for gradual, simultaneous desizing and spreading of the fibers. Payout and tension station 805 and sizing removal and fiber spreader station 810 are routinely used in the fiber industry; those skilled in the art will be familiar with their design and use.

The temperature and time required for burning off the sizing vary as a function of (1) the sizing material and (2) the commercial source/identity of carbon fiber material 860. A conventional sizing on a carbon fiber material can be removed at about 650° C. At this temperature, it can take as long as 15 minutes to ensure a complete burn off of the sizing. Increasing the temperature above this burn temperature can reduce burn-off time. Thermogravimetric analysis is used to determine minimum burn-off temperature for sizing for a particular commercial product.

Depending on the timing required for sizing removal, sizing removal heaters may not necessarily be included in the CNT-infusion process proper; rather, removal can be performed separately (e.g., in parallel, etc.). In this way, an inventory of sizing-free carbon fiber material can be accumulated and spooled for use in a CNT-infused fiber production line that does not include fiber removal heaters. The sizing-free fiber is then spooled in payout and tension station 805. This production line can be operated at higher speed than one that includes sizing removal.

Unsized fiber 880 is delivered to plasma treatment station 815. For this example, atmospheric plasma treatment is utilized in a 'downstream' manner from a distance of 1 mm from the spread carbon fiber material. The gaseous feedstock is comprised of 100% helium.

Plasma enhanced fiber 885 is delivered to barrier coating station 820. In this illustrative example, a siloxane-based barrier coating solution is employed in a dip coating configuration. The solution is 'Accuglass T-11 Spin-On Glass' (Honeywell International Inc., Morristown, N.J.) diluted in isopropyl alcohol by a dilution rate of 40 to 1 by volume. The resulting barrier coating thickness on the carbon fiber material is approximately 40 nm. The barrier coating can be applied at room temperature in the ambient environment.

Barrier coated carbon fiber 890 is delivered to air dry station 825 for partial curing of the nanoscale barrier coating.

The air dry station sends a stream of heated air across the entire carbon fiber spread. Temperatures employed can be in the range of 100° C. to about 500° C.

After air drying, barrier coated carbon fiber 890 is delivered to catalyst application station 830. In this example, an iron oxide-based CNT forming catalyst solution is employed in a dip coating configuration. The solution is 'EFH-1' (Ferrotec Corporation, Bedford, N.H.) diluted in hexane by a dilution rate of 200 to 1 by volume. A monolayer of catalyst coating is achieved on the carbon fiber material. 'EFH-1' prior to dilution has a nanoparticle concentration ranging from 3-15% by volume. The iron oxide nanoparticles are of composition Fe2O3 and Fe3O4 and are approximately 8 nm in diameter.

Catalyst-laden carbon fiber material 895 is delivered to solvent flash-off station 835. The solvent flash-off station sends a stream of air across the entire carbon fiber spread. In this example, room temperature air can be employed in order to flash-off all hexane left on the catalyst-laden carbon fiber material.

After solvent flash-off, catalyst-laden fiber 895 is finally advanced to CNT-infusion station 840. In this example, a rectangular reactor with a 12 inch growth zone is used to employ CVD growth at atmospheric pressure. 98.0% of the total gas flow is inert gas (Nitrogen) and the other 2.0% is the carbon feedstock (acetylene). The growth zone is held at 750° C. For the rectangular reactor mentioned above, 750° C. is a relatively high growth temperature, which allows for the highest growth rates possible.

After CNT-infusion, CNT-infused fiber 897 is re-bundled at fiber bundler station 845. This operation recombines the individual strands of the fiber, effectively reversing the spreading operation that was conducted at station 810.

The bundled, CNT-infused fiber 897 is wound about uptake fiber bobbin 850 for storage. CNT-infused fiber 897 is loaded with CNTs approximately 50 µm in length and is then ready for use in composite materials with enhanced thermal and electrical conductivity.

It is noteworthy that some of the operations described above can be conducted under inert atmosphere or vacuum for environmental isolation. For example, if sizing is being burned off of a fiber material, the fiber can be environmentally isolated to contain off-gassing and prevent damage from moisture. For convenience, in system 800, environmental isolation is provided for all operations, with the exception of fiber material payout and tensioning, at the beginning of the production line, and fiber uptake, at the end of the production line.

EXAMPLE II

This example shows how fiber material can be infused with CNTs in a continuous process to target improvements in mechanical properties, especially interfacial characteristics such as shear strength. In this case, loading of shorter CNTs on fibers is targeted. In this example, 34-700 12 k unsized carbon fiber tow with a tex value of 793 (Grafil Inc., Sacramento, Calif.) is implemented as the carbon fiber substrate. The individual filaments in this carbon fiber tow have a diameter of approximately 7 µm.

Figure 9:
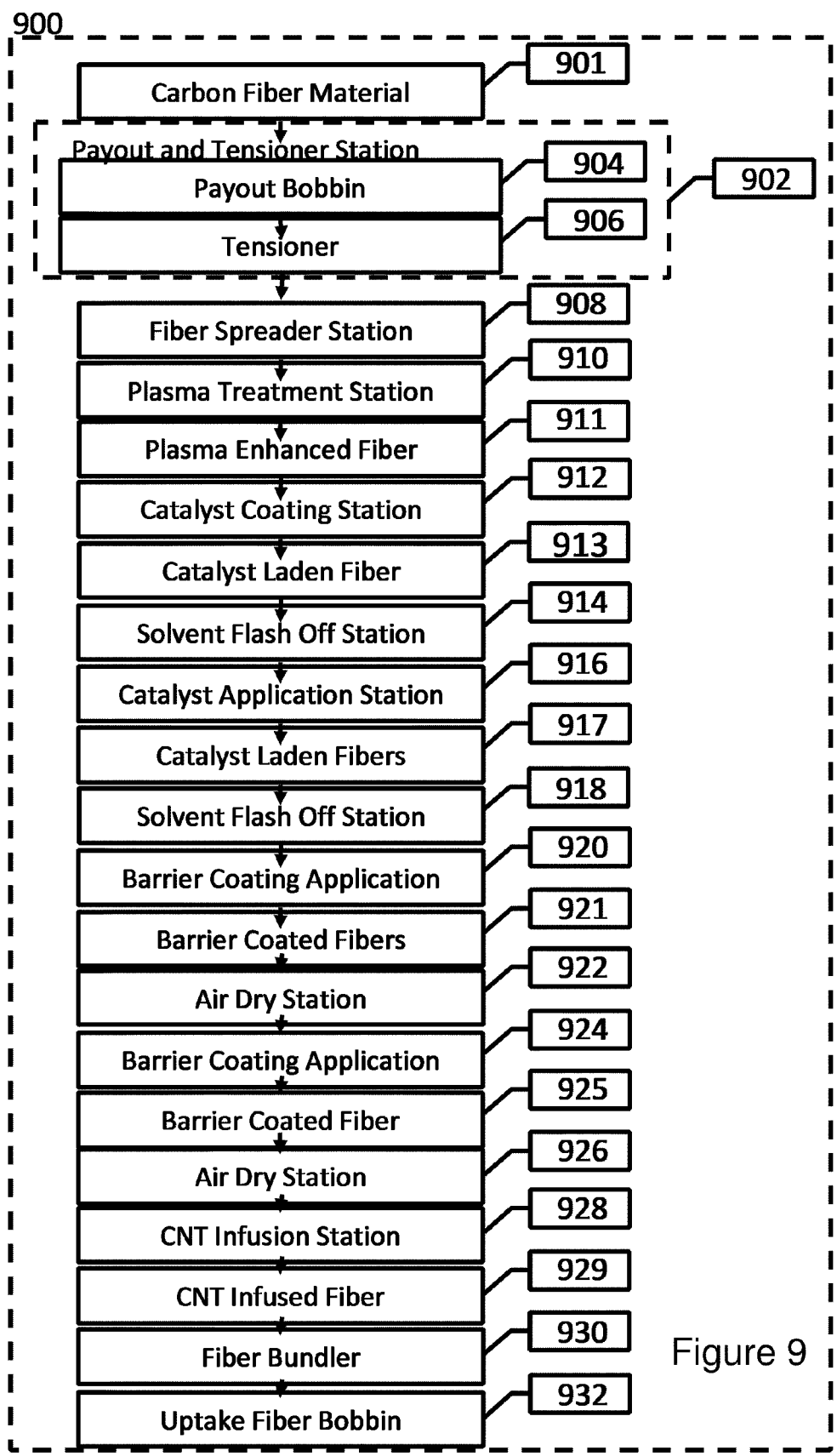
FIG. 9 shows how a fiber material can be infused with CNTs in a continuous process using a "reverse" barrier coating process to target improvements in mechanical properties, especially interfacial characteristics such as shear strength.

FIG. 9 depicts system 900 for producing CNT-infused fiber in accordance with the illustrative aspect of the present disclosure, and involves many of the same stations and processes described in system 800. System 900 includes a carbon fiber material payout and tensioner station 902, fiber spreader station 908, plasma treatment station 910, catalyst application station 912, solvent flash-off station 914, a second catalyst application station 916, a second solvent flash-off station 918, barrier coating application station 920, air dry station 922, a second barrier coating application station 924, a second air dry station 926, CNT-infusion station 928, fiber bundler station 930, and carbon fiber material uptake bobbin 932, interrelated as shown.

Payout and tension station 902 includes payout bobbin 904 and tensioner 906. The payout bobbin delivers carbon fiber material 901 to the process; the fiber is tensioned via tensioner 906. For this example, the carbon fiber is processed at a linespeed of 2 ft/min.

Fiber material 901 is delivered to fiber spreader station 908. As this fiber is manufactured without sizing, a sizing removal process is not incorporated as part of fiber spreader station 908. The fiber spreader separates the individual elements of the fiber in a similar manner as described in fiber spreader 870.

Fiber material 901 is delivered to plasma treatment station 910. For this example, atmospheric plasma treatment is utilized in a 'downstream' manner from a distance of 12 mm from the spread carbon fiber material. The gaseous feedstock is comprised of oxygen in the amount of 1.1% of the total inert gas flow (helium). Controlling the oxygen content on the surface of carbon fiber material is an effective way of enhancing the adherence of subsequent coatings, and is therefore desirable for enhancing mechanical properties of a carbon fiber composite.

Plasma enhanced fiber 911 is delivered to catalyst application station 912. In this example, an iron oxide based CNT forming catalyst solution is employed in a dip coating configuration. The solution is 'EFH-1' (Ferrotec Corporation, Bedford, N.H.) diluted in hexane by a dilution rate of 200 to 1 by volume. A monolayer of catalyst coating is achieved on the carbon fiber material. 'EFH-1' prior to dilution has a nanoparticle concentration ranging from 3-15% by volume. The iron oxide nanoparticles are of composition Fe2O3 and Fe3O4 and are approximately 8 nm in diameter.

Catalyst-laden carbon fiber material 913 is delivered to solvent flash-off station 914. The solvent flash-off station sends a stream of air across the entire carbon fiber spread. In this example, room temperature air can be employed in order to flash-off all hexane left on the catalyst-laden carbon fiber material.

After solvent flash-off, catalyst laden fiber 913 is delivered to catalyst application station 916, which is identical to catalyst application station 912. The solution is 'EFH-1' diluted in hexane by a dilution rate of 800 to 1 by volume. For this example, a configuration which includes multiple catalyst application stations is utilized to optimize the coverage of the catalyst on the plasma enhanced fiber 911.

Catalyst-laden carbon fiber material 917 is delivered to solvent flash-off station 918, which is identical to solvent flash-off station 914.

After solvent flash-off, catalyst-laden carbon fiber material 917 is delivered to barrier coating application station 920. In this example, a siloxane-based barrier coating solution is employed in a dip coating configuration. The solution is 'Accuglass T-11 Spin-On Glass' (Honeywell International Inc., Morristown, N.J.) diluted in isopropyl alcohol by a dilution rate of 40 to 1 by volume. The resulting barrier coating thickness on the carbon fiber material is approximately 40 nm. The barrier coating can be applied at room temperature in the ambient environment.

Barrier coated carbon fiber 921 is delivered to air dry station 922 for partial curing of the barrier coating. The air dry station sends a stream of heated air across the entire carbon fiber spread. Temperatures employed can be in the range of 100° C. to about 500° C.

After air drying, barrier coated carbon fiber 921 is delivered to barrier coating application station 924, which is identical to barrier coating application station 820. The solution is 'Accuglass T-11 Spin-On Glass' diluted in isopropyl alcohol by a dilution rate of 120 to 1 by volume. For this example, a configuration which includes multiple barrier coating application stations is utilized to optimize the coverage of the barrier coating on the catalyst-laden fiber 917.

Barrier coated carbon fiber 925 is delivered to air dry station 926 for partial curing of the barrier coating, and is identical to air dry station 922.

After air drying, barrier coated carbon fiber 925 is finally advanced to CNT-infusion station 928. In this example, a rectangular reactor with a 12 inch growth zone is used to employ CVD growth at atmospheric pressure. 97.75% of the total gas flow is inert gas (Nitrogen) and the other 2.25% is the carbon feedstock (acetylene). The growth zone is held at 650° C. For the rectangular reactor mentioned above, 650° C. is a relatively low growth temperature, which allows for the control of shorter CNT growth.

After CNT-infusion, CNT-infused fiber 929 is re-bundled at fiber bundler 930. This operation recombines the individual strands of the fiber, effectively reversing the spreading operation that was conducted at station 908.

The bundled, CNT-infused fiber 931 is wound about uptake fiber bobbin 932 for storage. CNT-infused fiber 929 is loaded with CNTs approximately 5 μm in length and is then ready for use in composite materials with enhanced mechanical properties.

In this example, the fiber material passes through catalyst application stations 912 and 916 prior to barrier coating application stations 920 and 924. This ordering of coatings is in the 'reverse' order as illustrated in Example I, which can improve anchoring of the CNTs to the carbon fiber substrate. During the CNT growth process, the barrier coating layer is lifted off of the substrate by the CNTs, which allows for more direct contact with the fiber material (via catalyst NP interface). Because increases in mechanical properties, and not thermal/electrical properties, are being targeted, a 'reverse' order coating configuration is desirable.

It is noteworthy that some of the operations described above can be conducted under inert atmosphere or vacuum for environmental isolation. For convenience, in system 900, environmental isolation is provided for all operations, with the exception of carbon fiber material payout and tensioning, at the beginning of the production line, and fiber uptake, at the end of the production line.

EXAMPLE III

This example shows how fiber material can be infused with CNTs in a continuous process to target improvements in mechanical properties, especially interfacial characteristics such as interlaminar shear.

In this example, loading of shorter CNTs on fibers is targeted. In this example, 34-700 12 k unsized carbon fiber tow with a tex value of 793 (Grafil Inc., Sacramento, Calif.) is implemented as the carbon fiber substrate. The individual filaments in this carbon fiber tow have a diameter of approximately 7 μm.

Figure 10:
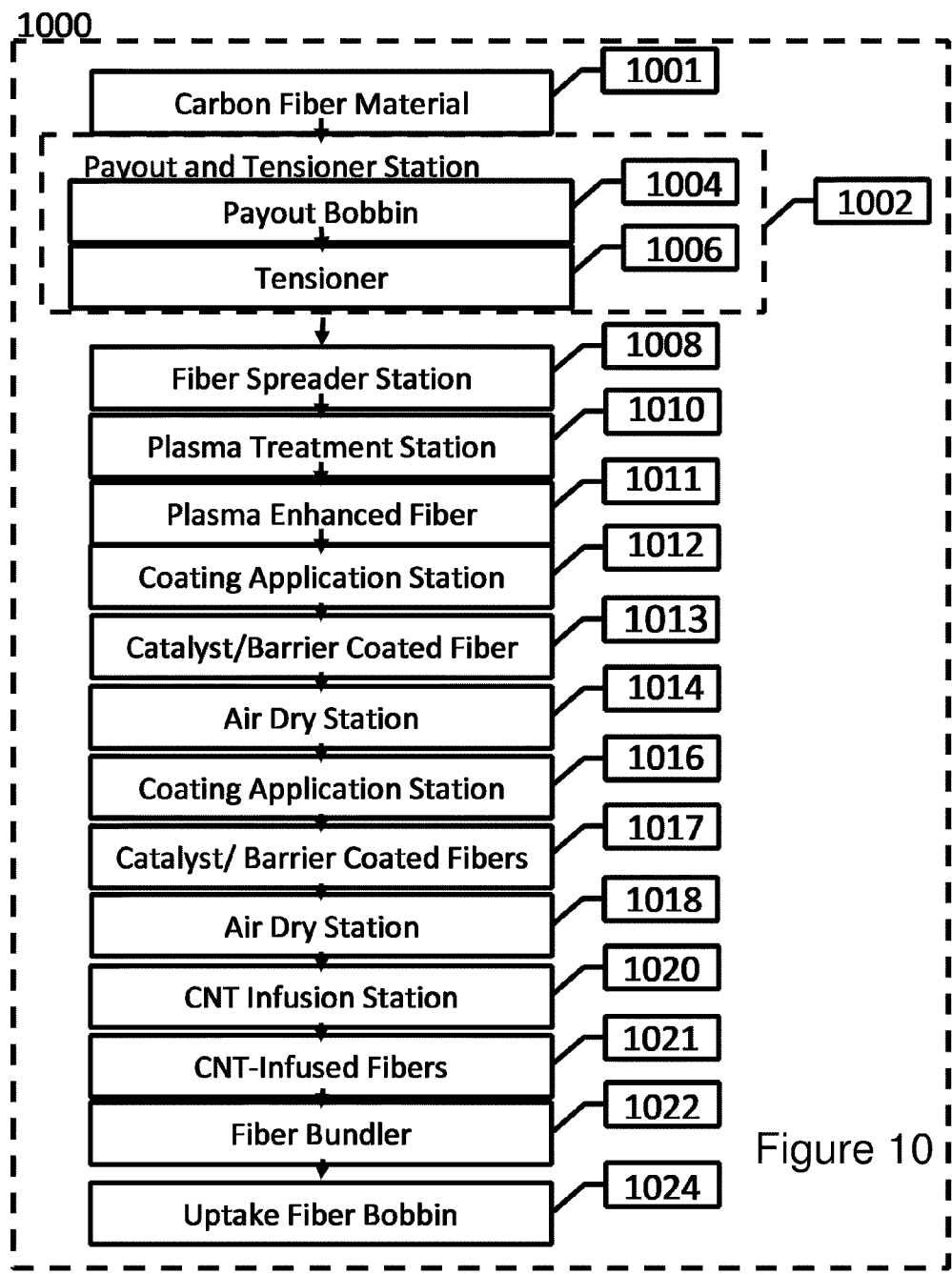
FIG. 10 shows how fiber material can be infused with CNTs in another continuous process using a "hybrid" barrier coating to target improvements in mechanical properties, especially interfacial characteristics such as shear strength and interlaminar fracture toughness.
Figure 11:
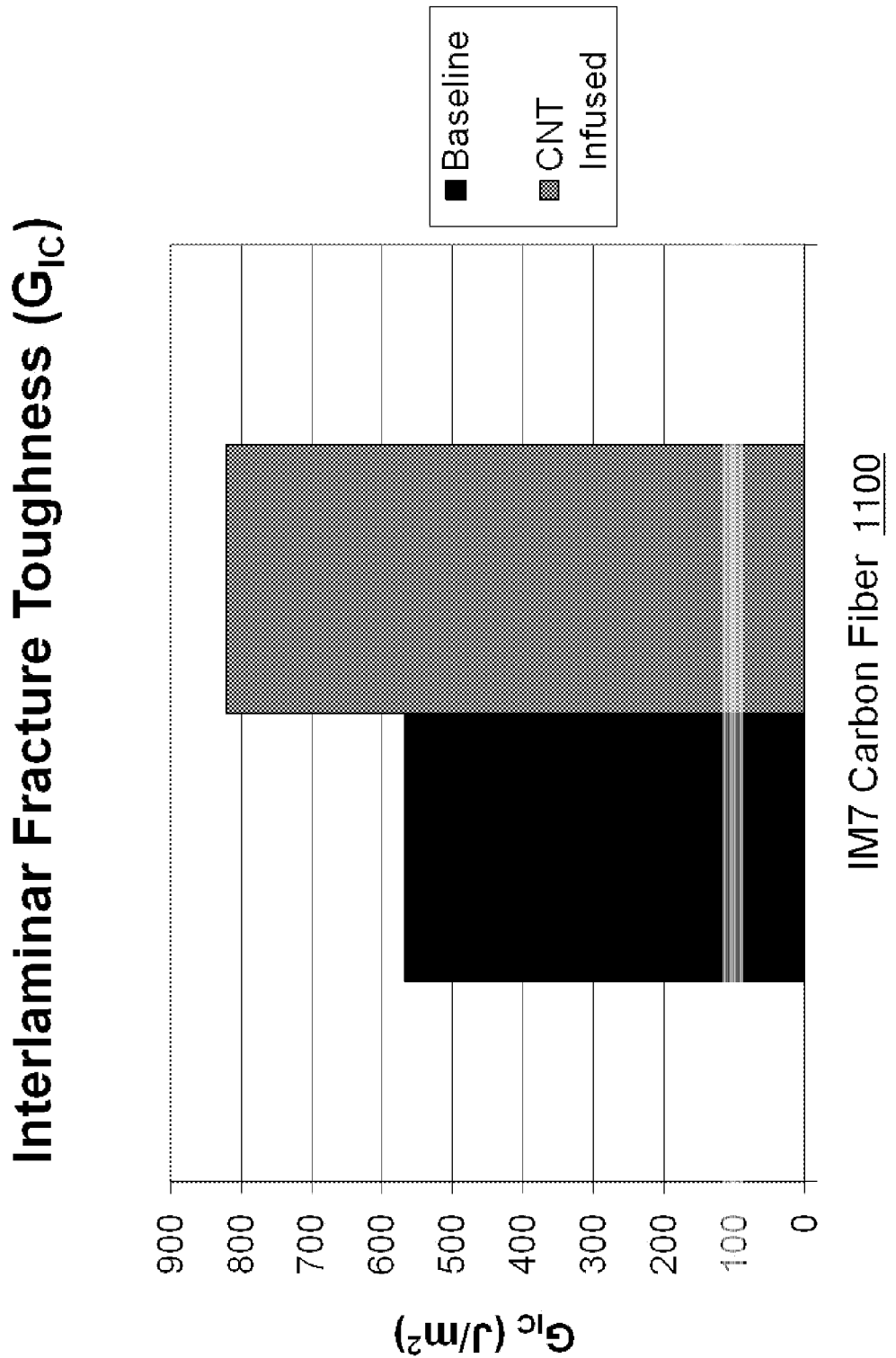
FIG. 11 shows the effect of infused CNTs on IM7 carbon fiber on interlaminar fracture toughness. The baseline material is an unsized IM7 carbon fiber, while the CNT-Infused material is an unsized carbon fiber with 15 micron long CNTs infused on the fiber surface.

FIG. 10 depicts system 1000 for producing CNT-infused fiber in accordance with the illustrative aspect of the present disclosure, and involves many of the same stations and processes described in system 800. System 1000 includes a carbon fiber material payout and tensioner station 1002, fiber spreader station 1008, plasma treatment station 1010, coating application station 1012, air dry station 1014, a second coating application station 1016, a second air dry station 1018, CNT-infusion station 1020, fiber bundler station 1022, and carbon fiber material uptake bobbin 1024, interrelated as shown.

Payout and tension station 1002 includes payout bobbin 1004 and tensioner 1006. The payout bobbin delivers carbon fiber material 1001 to the process; the fiber is tensioned via tensioner 1006. For this example, the carbon fiber is processed at a linespeed of 5 ft/min.

Fiber material 1001 is delivered to fiber spreader station 1008. As this fiber is manufactured without sizing, a sizing removal process is not incorporated as part of fiber spreader station 1008. The fiber spreader separates the individual elements of the fiber in a similar manner as described in fiber spreader 870.

Fiber material 1001 is delivered to plasma treatment station 1010. For this example, atmospheric plasma treatment is utilized in a 'downstream' manner from a distance of 12 mm from the spread carbon fiber material. The gaseous feedstock is comprised of oxygen in the amount of 1.1% of the total inert gas (helium). Controlling the oxygen content on the surface of carbon fiber material is an effective way of enhancing the adherence of subsequent coatings, and is therefore desirable for enhancing mechanical properties of a carbon fiber composite.

Plasma enhanced fiber 1011 is delivered to coating application station 1012. In this example, an iron oxide based catalyst and a barrier coating material is combined into a single 'hybrid' solution and is employed in a dip coating configuration. The 'hybrid' solution is 1-part-by-volume 'EFH-1', 5-parts 'Accuglass T-11 Spin-On Glass', 24-parts hexane, 24-parts isopropyl alcohol, and 146-parts tetrahydrofuran. The benefit of employing such a 'hybrid' coating is that it marginalizes the effect of fiber degradation at high temperatures. Without being bound by theory, degradation to carbon fiber materials is intensified by the sintering of catalyst NPs at high temperatures (the same temperatures vital to the growth of CNTs). By encapsulating each catalyst NP with its own barrier coating, it is possible to control this effect. Because increases in mechanical properties, and not thermal/electrical properties, is being targeted, it is desirable to maintain the integrity of the carbon fiber base-material, therefore a 'hybrid' coating can be employed.

Catalyst-laden and barrier coated carbon fiber material 1013 is delivered to air dry station 1014 for partial curing of the barrier coating. The air dry station sends a stream of heated air across the entire carbon fiber spread. Temperatures employed can be in the range of 100° C. to about 500° C.

After air drying, the catalyst and barrier coating-laden carbon fiber 1013 is delivered to coating application station 1016, which is identical to coating application station 1012. The same 'hybrid' solution is used (1-part-by-volume 'EFH-1', 5-parts 'Accuglass T-11 Spin-On Glass', 24-parts hexane, 24-parts isopropyl alcohol, and 146-parts tetrahydrofuran). For this example, a configuration which includes multiple coating application stations is utilized to optimized the coverage of the 'hybrid' coating on the plasma enhanced fiber 1011.

Catalyst and barrier coating-laden carbon fiber 1017 is delivered to air dry station 1018 for partial curing of the barrier coating, and is identical to air dry station 1014.

After air drying, catalyst and barrier coating-laden carbon fiber 1017 is finally advanced to CNT-infusion station 1020. In this example, a rectangular reactor with a 12 inch growth zone is used to employ CVD growth at atmospheric pressure. 98.7% of the total gas flow is inert gas (Nitrogen) and the other 1.3% is the carbon feedstock (acetylene). The growth zone is held at 675° C. For the rectangular reactor mentioned above, 675° C. is a relatively low growth temperature, which allows for the control of shorter CNT growth.

After CNT-infusion, CNT-infused fiber 1021 is re-bundled at fiber bundler 1022. This operation recombines the individual strands of the fiber, effectively reversing the spreading operation that was conducted at station 1008.

The bundled, CNT-infused fiber 1021 is wound about uptake fiber bobbin 1024 for storage. CNT-infused fiber 1021 is loaded with CNTs approximately 2 µm in length and is then ready for use in composite materials with enhanced mechanical properties.

It is noteworthy that some of the operations described above can be conducted under inert atmosphere or vacuum for environmental isolation. For convenience, in system 1000, environmental isolation is provided for all operations, with the exception of carbon fiber material payout and tensioning, at the beginning of the production line, and fiber uptake, at the end of the production line.

The above described compositions and processes relate to the production of CNT-infused fibers according to some aspects of the present disclosure. The above describes compositions and processes for the production of CNT-infused fibers may be used in the manufacture of wires, EM shields, and self-shielding wires according to some aspects of the present disclosure. In some embodiments, a plurality CNT-infused fibers can be substantially longitudinally aligned (including twisted) to form wires and wire-like structures (including sheaths). In the nonlimiting examples provided below, it should be understood that the CNT-infused fiber compositions need not be those exactly specified in the example. Rather the CNT-infused fiber compositions can be interchanged with CNT-infused fibers, CNT-infused fibers included with a matrix material, discrete bundles of a plurality of CNT-infused fibers (including those included with a matrix material), or any combination thereof.

Figure 12:
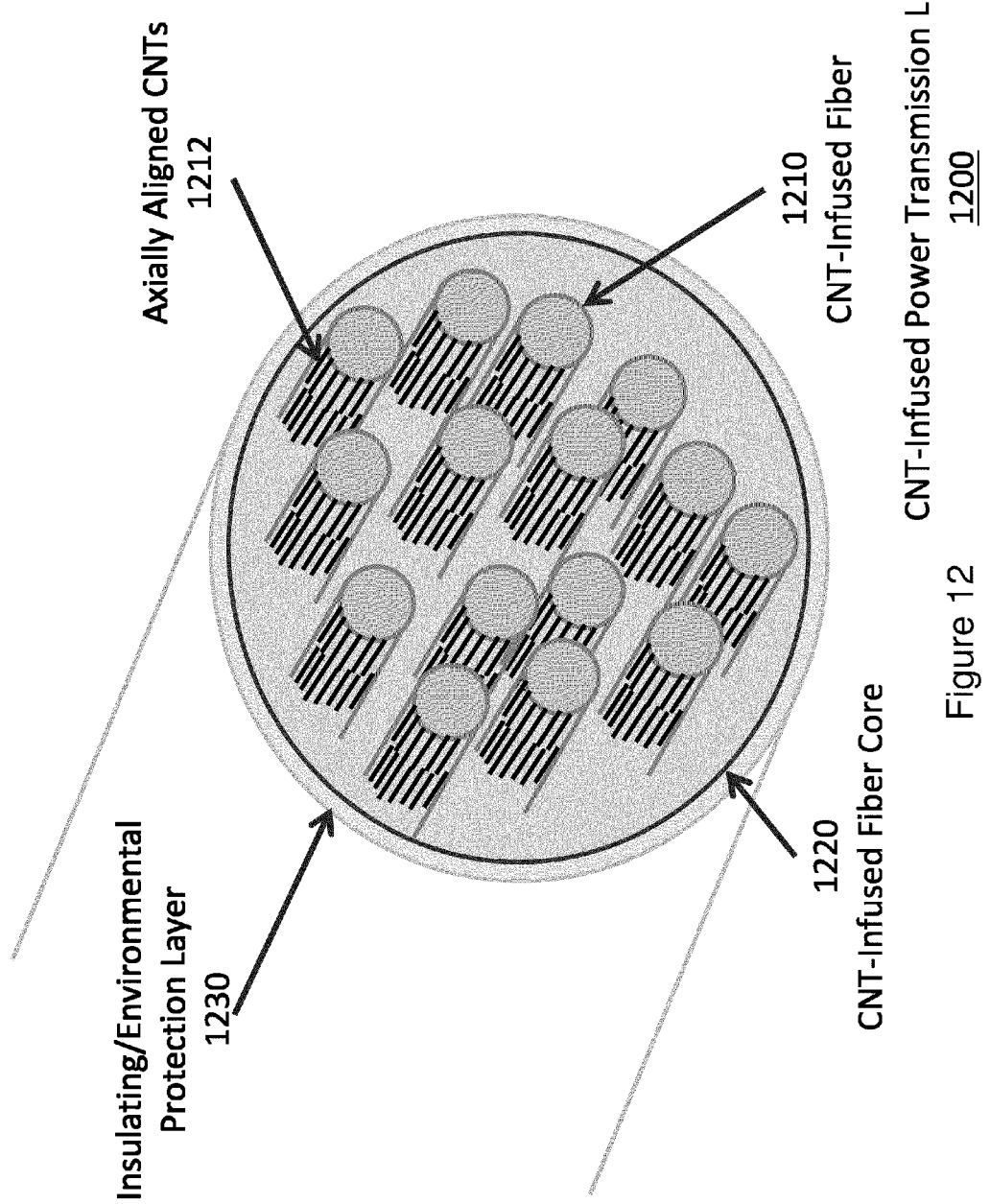
FIG. 12 shows a power transmission line with a CNT-Infused Fiber that functions as both a core and a conductor and includes a plurality of carbon nanotube infused fibers in which the infused carbon nanotubes are parallel to the fiber axes, according to one aspect of the disclosure.

FIG. 12 shows a power transmission line 1200 with a CNT-infused fiber 1210 that functions as both a core and a conductor. Representatively, power transmission line 1200 may include a plurality of CNT-infused fibers 1210 in which the infused CNTs 1210 are parallel 1212 to the fiber axes, according to an axial orientation of one aspect of the disclosure. In some aspects of the disclosure, power transmission line 1200 may comprises a CNT-infused core 1220 that may include a plurality of CNT-infused fibers 1210 in a composite matrix. Representatively, infused CNTs 1210 are aligned according to an axial orientation 1212 relative to the fiber axes. Power transmission lines 1200, according to one aspect, may provide reduced cost to infrastructure due to both reduced sagging and the ability to traverse longer spans with fewer support structures.

In the case of using CNT infused fibers in power transmission applications, the incorporation of CNT infused fibers 1210 in the transmission line core 1220 may aid in reducing transmission loss by providing an additional efficient conductive pathway, as well as providing enhanced stiffness and strength. Providing enhance stiffness and strength may be particularly important for increasing span distance of power transmission lines for reducing infrastructure installation costs, for example, as shown in FIGS. 12, 14, and 15.

Figure 13:
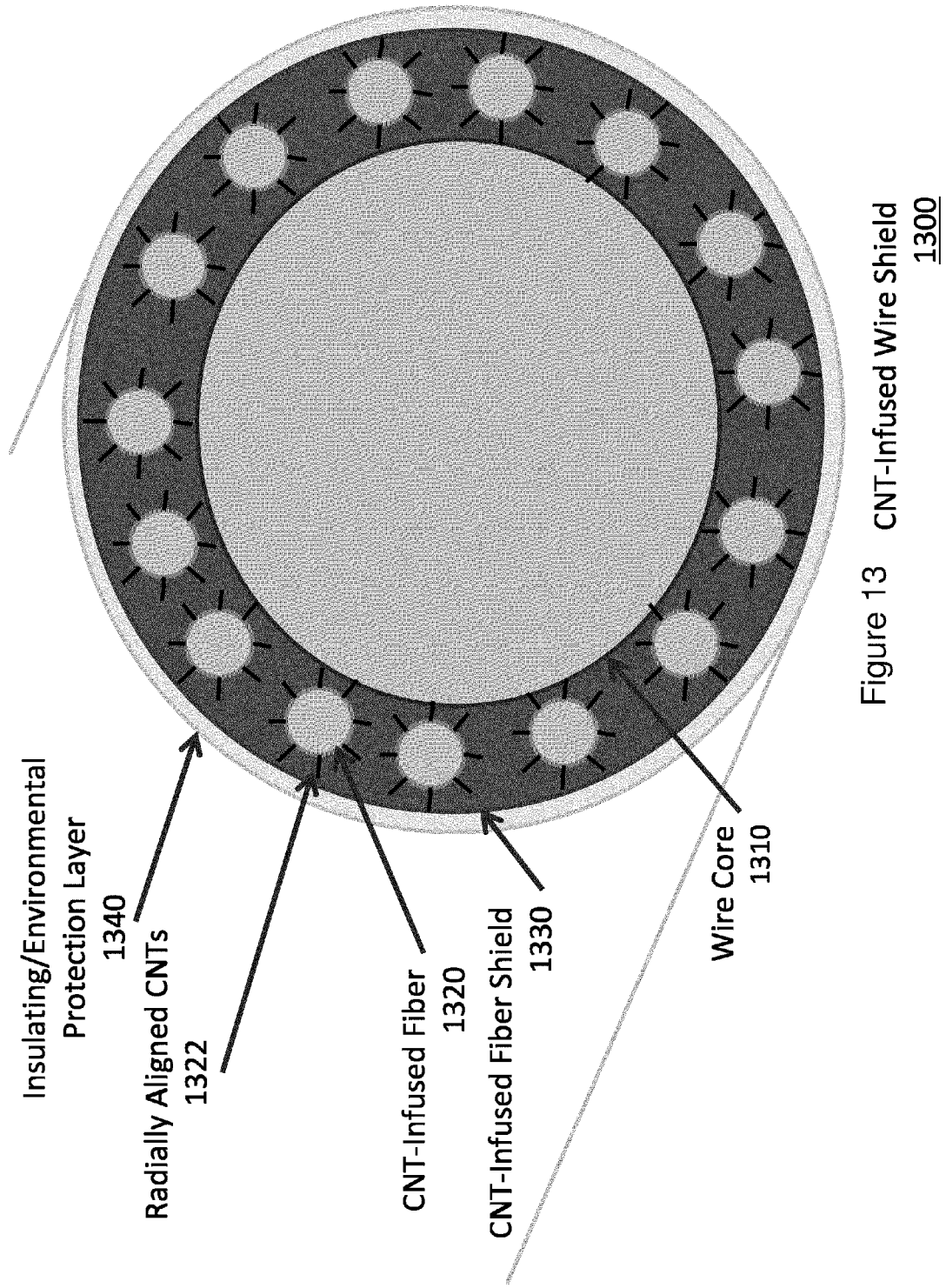
FIG. 13 shows an electromagnetic shield for a wire that includes a plurality of carbon nanotube infused fibers which are arranged circumferentially about the wire, in which the infused carbon nanotubes are disposed radially about the fiber axes, according to one aspect of the disclosure.

In one aspect of the disclosure, an electromagnetic shield for a wire may include a plurality of carbon nanotube infused fibers, in which the infused carbon nanotubes are aligned according to radial orientation 1322 relative to the fiber axes, as shown in FIG. 13. FIG. 13 shows an electromagnetic shield 1330 for a wire 1310 that includes a plurality of carbon nanotube infused fibers 1320 which are arranged circumferentially 1322 about the wire core 1310, in which the infused CNT are disposed radially 1322 about the fiber axes, according to one aspect of the disclosure. Representatively, the plurality of CNT-infused fibers 1320 may be arranged circumferentially according to a radial orientation 1322 relative to wire 1310, with the fiber axes parallel to wire 1310, to form CNT-infused fiber shield 1330 according to one aspect of the present disclosure. In some embodiments, CNT-infused fibers can be used for EMI shielding to protect a material from EMI, to prevent and/or mitigate EM emissions from a material, or a combination thereof.

Figure 14:
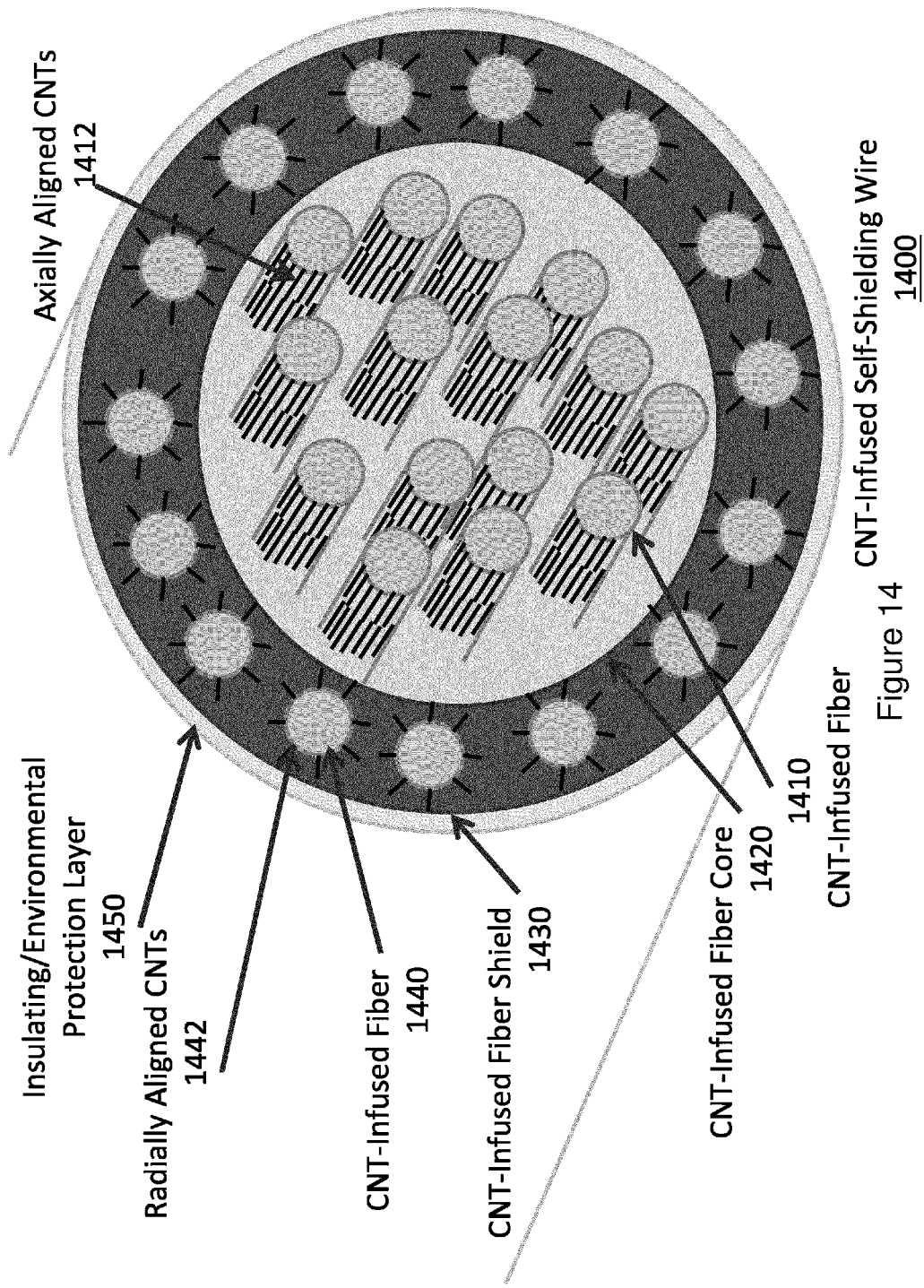
FIG. 14 shows a self-shielding wire with the electromagnetic shield of FIG. 13 disposed about the wire of FIG. 12, according to one aspect of the disclosure.
Figure 15:
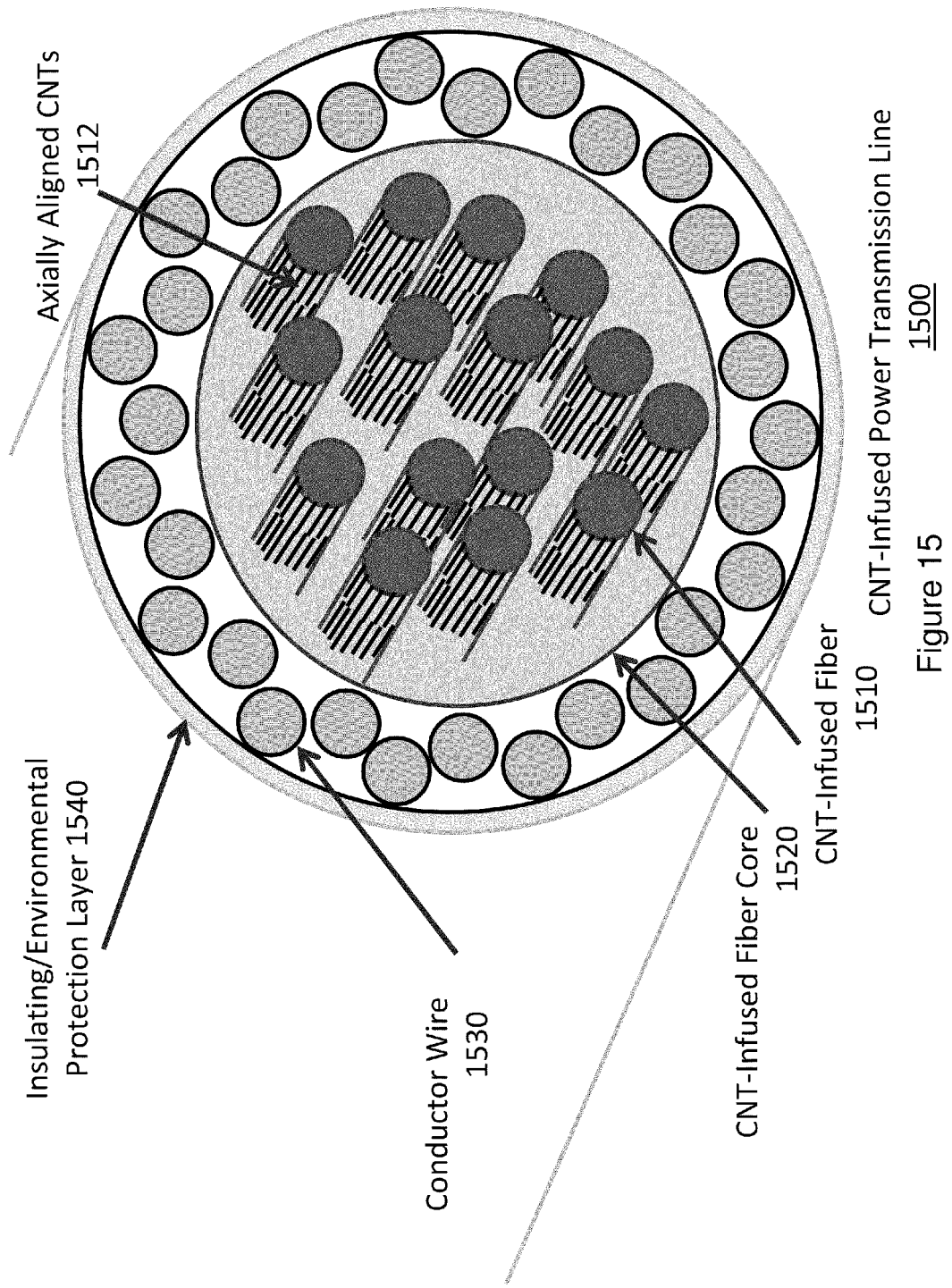
FIG. 15 shows a power transmission line with a CNT-Infused Fiber that functions as a core of FIG. 12, with a separate conductor material disposed about the core, according to one aspect of the disclosure.

FIG. 14 shows a self-shielding wire 1400 with an electromagnetic shield 1430 of FIG. 13 disposed about a CNT-infused fiber core 1420, according to one aspect of the disclosure. Representatively, a self-shielded wire 1400 may includes 1) wire core 1420 that includes a plurality of CNT-infused fibers 1410 in which the infused CNTs are aligned parallel 1412 to the fiber axes; and 2) an electromagnetic shield 1430 that includes a plurality of CNT infused fibers 1440 in which the CNTs are aligned radially 1442 about the fiber axes, according to one aspect of the present disclosure. The axes of the CNT-infused fibers 1410 of wire core 1420 and the CNT-infused fibers 1440 of electromagnetic shield 1430 are parallel.

In some embodiments, EMI shielding macrostructures, e.g., fabrics, sock, and sleeves, can be produced to comprise CNT-infused fibers, e.g., fibers infused with carbon nanotubes aligned radially relative to the fiber axis. Macrostructures can be generally produced in two ways. First, macrostructures comprising fibers, and the like, suitable for CNT-infusion can be taken through the above steps. Second, CNT-infused fibers can be used in the production of macrostructures. Macro structures may be woven or nonwoven depending on the application. Suitable examples of weave structures can include, but not be limited to, plain, satin, or twill. Weave structure can vary based on parent fiber tex. In some embodiments, lower tex fibers can be used for denser weaves that can increase EMI shielding performance.

EMI shielding macrostructures comprising CNT-infused fiber may advantageously yield reduced weight, increased shielding, and/or reduction of harmonic resonances as compared to copper and steel EMI shielding technologies. Comparing weight and shielding measurements between a CNT-infused glass shield to a copper shield, the weight decreases by about half (0.0151 lb/ft compared to 0.0322 lb/ft), shielding increases to greater than 2 dB at specific frequencies above 200 MHz, and harmonic resonances reduce to greater than 2 dB at specific frequencies above 200 MHz.

FIG. 15 shows a power transmission line 1500 with a CNT-Infused Fiber core 1520, for example, as shown in FIG. 12, with a separate conductor material 1530 disposed about core 1520, according to one aspect of the disclosure. In another aspect of the disclosure, a conductor wire 1530, such as aluminum or copper, is used as the charge transfer medium and is wrapped around CNT-infused fiber composite core 1520, with an optional film of thermoplastic 1540 on the outermost layer for environmental protection, as shown in FIG. 15. As described herein, CNT-infused core 1520 may be referred to as a "reinforcement core", where conductor wire operates as the power transmission medium.

The aluminum or copper conductor can be arranged around the CNT-infused composite core 1520 in any number of configurations that are similar to those that are currently employed in the art, e.g., a coating or a plurality of wires aligned longitudinally aligned with CNT-infused composite core 1520. The CNT-infused fiber 1510 can be aligned parallel to the conductor wire 1530, but can also be twisted in discrete bundles of individually cured composite structures to further enhance its current carrying capability analogous to conventional conductors. Although shown as an outermost layer in FIGS. 13-15, thermoplastic 1540 may be disposed between fiber core 1520 and conductive wire 1530. In some embodiments, a conductor, in any physical form, can be peripheral to the CNT-infused fibers which may or may not include a matrix material therewith.

CNT infused fibers can provide a self shielding wire, for example, as shown in FIGS. 13 and 14. The processing steps to infuse the fiber with carbon nanotubes may be used to generate the requisite fibers for both the wire and shield components. To generate the wire portion of the self-shielding wire, an additional processing step to "lay" the tubes down along the fiber axes is performed after the infusion process. In some aspects, efficiency in processing can be achieved by using the same fiber components to make up the wire and the shield, although it is not necessary to use the same fiber type.

In the case of data or signal transmission, CNT-infused fiber based wires can provide sufficient data transfer capabilities while preventing electromagnetic interference (EMI) via the inherent dispersed CNT properties, as provided by a CNT-infused fiber shield, e.g., as shown in FIGS. 13 and 14. In the case of using CNT infused fibers in shielding applications, not only does the incorporation of CNT infused fibers reduce cost by eliminating the need for a layered sheathing structure, it also provides enhanced stiffness and strength particularly for power transmission line applications which is important for increasing span distance.

Various configurations of these CNT infused fibers can be used in power transmission or data transfer lines, either as the charge transfer medium itself (e.g., FIG. 12), or as a sheathing material (e.g., FIG. 13) for a conventional metal wire medium. In the case where CNT-infused fibers are used as the charge transfer medium (wire), fibers with CNTs aligned along the fiber axis can be used in the core of the wire "structure" since CNTs most effectively carry current along the direction of their axes. Just outside the core material, CNT-infused fiber with CNTs aligned according to a radial orientation can be used as a shielding material with this wire (FIG. 14). CNTs aligned in the radial orientation on the fibers consequently result in CNTs aligned radially along the radius of the sheathing. This radial orientation is the most favorable (CNTs perpendicularly aligned to impinging EMI) for reducing EMI effects, although this is not a prerequisite to providing effective EMI shielding. According to one aspect, CNT-infused fibers may be arranged in a composite matrix to provide a reinforcement core for a power transmission cable, according to an axial orientation (FIG. 15).

In some aspects, only the wire core 1220 exists, as shown in FIG. 12, with a protective coating of a film of thermoplastic material 1230 on the outermost layer to provide a insulated environmental barrier (this barrier is used in all aspects to isolate the charge transferred through the wire as well as the provide environmental protection). This aspect can provide adequate levels of EMI protection.

In yet another aspect, as shown in FIG. 13, a conventional wire 1310 (aluminum or copper) is used as the charge transfer medium and CNT infused fibers are used as the EMI shielding sheathing 1330, with a film of thermoplastic 1340 on the outermost layer for environmental protection. In this case, CNTs can be aligned according to a radial orientation on the fibers to provide the maximum EMI shielding characteristics, while in other aspects, CNTs can be aligned parallel to the fiber axis, according to an axial orientation, for providing adequate levels of EMI shielding, but also improving tensile strength and stiffness of the overall wire structure.

In some aspects of the disclosure, the following techniques, as well as any combination thereof, can be used to achieve CNT alignment along the fiber axes: 1) Electromechanical—Via the use of an electric or magnetic field CNTs can be aligned parallel to the fiber during the growth process; thus, the CNTs can be aligned by inducing alignment via the force field applied; 2) Mechanical—A variety of mechanical techniques including extrusion, pultrusion, gas pressure aided dies, conventional dies, and mandrels can be used to apply a shearing force in the direction of the fibers to induce alignment; and 3) Chemical—Chemicals including solvents, surfactants, and micro-emulsions can be used to induce alignment via the sheathing effect in the direction of the fibers as material is drawn out of these chemicals.

As shown in FIG. 12, any configuration of these CNT infused fibers may be used in a power transmission line as reinforcing core 1220, but CNTs aligned along the fiber direction, according to axial orientation 1212, provide beneficial conductivity because CNTs conduct current along the direction of their axis. Moreover, the tensile strength and stiffness improvements are also greatest along their axis.

In one aspect of the disclosure, only the CNT-infused fiber reinforcement core 1220 exists, as shown in FIG. 12, where it acts as both the conductor and the reinforcement material and can have an optional film 1230 of thermoplastic material or other protective coating on the outermost layer to provide a insulated environmental barrier. This barrier is used optionally, in some aspects of the disclosure, to isolate the charge transferred through the wire as well as the provide environmental protection. It should be noted that in some aspects of the disclosure, a CNT-infused fiber shield 1430 (FIG. 14) and/or a conductor wire 1530 (FIG. 15) may surround reinforcement core 1220 with film 1230 (e.g., protective coating) disposed there between.

In some aspects of the disclosure, CNTs grown on the surface of composite fiber materials can be of a length between 0.1-500 microns. In particular, to improve the overall probability of enhancing fiber conductivity, longer (greater than about 50 microns) CNTs are desired due to the greater probability of CNT to CNT interaction. To improve the tensile properties of the parent composite fiber, medium length (between about 10 and about 50 microns) CNTs can be employed. Such lengths have the ability to bridge CNTs without greatly decreasing the fiber volume in composite. To improve composite toughness, short (less than about 10 micron) CNTs can be employed. Such lengths provide effective interfacial improvements without affecting composite fiber volume or requiring CNT alignment.

In some aspects of the disclosure, CNTs are aligned parallel to the fiber axis, according to an axial orientation, and can be functionalized using a number of techniques, such as plasma and chemical methods, to improve CNT to CNT, CNT to fiber, CNT to matrix, and fiber to matrix bridging and bonding. Functionalization can provide improved tensile strength and stiffness of the overall wire structure. Consequently, improved stiffness can help improve the ability for the line to span greater distances between support structures, while the CNTs aligned along the axis of the power line provide the greatest enhancement to electrical conductivity, for example, as shown in FIGS. 12, 14 and 15. Post CNT-infusion treatments can include, without limitation, reorientation of the CNTs, functionalization of the CNTs, and coating of the CNTs. Functionalization can include, for example, fluorination of the CNTs, acid etching, and acid etching combined with chemistry that utilizes any exposed functionality resulting from the etching process.

Exemplary chemistry includes that of the exposed ketone, aldehyde, and carboxylic acid functional groups. Thus, post etching chemistry can include, for example, ester bond formation, amide bond formation, Schiff base formation, reductive amination, and the like. Such functionalization can be used to enhance, for example, the interface between the CNT-infused fiber and the matrix material. Coatings can also be used to enhance the CNT-infused fiber-matrix material interface. In some aspects, such coatings can include, for example, the Kentera system (Zyvex Performance Materials, Columbus, Ohio).

In some embodiments, the configuration in which CNT-infused fibers are arranged can include multi-layer structures, e.g., a core with at least two layers of various CNT-infused fiber compositions.

In some embodiments, CNT-infused fibers arranged in any configuration disclosed herein can be used in conjunction with a device including, but not limited to, an electronic panel, a computer, a control panel, a circuit board, an electronic device, and the like. In some embodiments, a device can be operably attached to CNT-infused fibers arranged in any configuration disclosed herein. In some embodiments, the device can include an electrical ground.

In some embodiments, CNT-infused fibers arranged in any configuration disclosed herein, especially those which include axially aligned CNTs, can be used for transmitting electricity. In some embodiments, an electrical current can be passed through at least a portion of a composite that comprises CNT-infused fibers arranged in any configuration disclosed herein. In some embodiments, the electrical current can pass through at least portions of the CNT-infused fibers, an optionally included conductor, or any combination thereof.

In some embodiments, CNT-infused fibers, arranged in any configuration disclosed herein, can be used to produce a wire, or a composite, for transmitting electricity. The method of making said wire can include aligning a plurality of CNT-infused fibers substantially longitudinally to form a core, where alignment can include twisting at least some of the plurality of CNT-infused fibers into discrete bundles. Optionally, at least one conductor can be disposed peripherally to the core. Further, a protective coating can be applied to a composite that comprises the core and the optional conductor. One skilled in the art, with the benefit of this disclosure, will understand the other components that may be incorporated into the composite, e.g., shielding, insulation, sheaths, and screens, and how to incorporate said components.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the present disclosure.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such an embodiment may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such a configuration may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A composite for use as a power transmission medium comprising:
   a core comprising a plurality of carbon nanotube (CNT)-infused fibers and a composite matrix, the plurality of CNT-infused fibers and the composite matrix being within the core, wherein each of the plurality of CNT-infused fibers comprises:
   a respective fiber material, and
   a respective plurality of CNTs infused directly onto a surface of the respective fiber material; and
   a protective coating as an outermost layer,
   wherein, for at least one of the plurality of CNT-infused fibers of the core, each CNT of the respective plurality of CNTs and the respective fiber material are in contact with the composite matrix, and at least a portion of each CNT of the respective plurality of CNTs is aligned parallel to an axis of the respective fiber material and external to the respective fiber material.

2. The composite of claim 1, wherein the core is configured to provide a charge transfer medium.

3. The composite of claim 1, wherein the plurality of CNT-infused fibers are in the composite matrix.

4. The composite of claim 3, wherein the composite matrix is selected from the group consisting of a thermoset resin, a thermoplastic resin, a metal, a ceramic, a cement, and any combination thereof.

5. The composite of claim 1, wherein, for at least one of the plurality of CNT-infused fibers of the core, the respective plurality of CNTs is aligned axially relative to the respective fiber material.

6. The composite of claim 1, wherein, for at least one of the plurality of CNT-infused fibers of the core, each of the respective plurality of CNTs has a length in a range of 0.1 to 500 microns.

7. The composite of claim 1, wherein the core further comprising a plurality of transition metal nanoparticles.

8. The composite of claim 7, wherein the nanoparticles comprise iron.

9. The composite of claim 1, wherein, for at least one of the plurality of CNT-infused fibers of the core, the respective fiber material is selected from the group consisting of glass, a metal, aramid, carbon, a ceramic, and any combination thereof.

10. The composite of claim 1, wherein the protective coating comprises a thermoplastic material.

11. The composite of claim 1 further comprising:
at least one conductor peripheral to the plurality of CNT-infused fibers.

12. A composite for use as a power transmission medium comprising:
a core that comprises a plurality of carbon nanotube (CNT)-infused fibers in a composite matrix, wherein each of the plurality of CNT-infused fibers comprises:
a respective fiber material, and
a respective plurality of CNTs infused on a surface of the respective fiber material; and
at least one conductor peripheral to the core,
wherein, for at least one of the plurality of CNT-infused fibers of the core,
each CNT of the respective plurality of CNTs and the respective fiber material are in contact with the composite matrix, and
at least a portion of each CNT of the respective plurality of CNTs is aligned parallel to an axis of the respective fiber material and external to the respective fiber material.

13. The composite of claim 12 further comprising:
a protective coating as an outermost layer.

14. The composite of claim 12 further comprising:
a protective coating disposed between the core and the conductor.

15. The composite of claim 12, wherein the core is configured to provide a charge transfer medium.

16. The composite of claim 12, wherein the conductor comprises at least one selected from the group consisting of aluminum and copper.

17. The composite of claim 12, wherein the plurality of CNT-infused fibers is twisted into discrete bundles.

18. The composite of claim 12, wherein, for at least one of the plurality of CNT-infused fibers of the core, the respective plurality of CNTs is aligned axially relative to the respective fiber material.

19. An article comprising:
a composite comprising
a core comprising a plurality of carbon nanotube (CNT)-infused fibers and a composite matrix, the plurality of CNT-infused fibers and the composite matrix being within the core, wherein each of the plurality of CNT-infused fibers comprises:
a respective fiber material, and
a respective plurality of CNTs infused directly onto a surface of the respective fiber material; and
a protective coating as an outermost layer; and
a device operably connected to the composite,
wherein, for at least one of the plurality of CNT-infused fibers of the core,
each CNT of the respective plurality of CNTs and the respective fiber material are in contact with the composite matrix, and
at least a portion of each CNT of the respective plurality of CNTs is aligned parallel to an axis of the respective fiber material and external to the respective fiber material.

20. An article comprising:
a composite comprising
a wire and
a carbon nanotube (CNT)-infused fiber shield surrounding the wire, wherein the CNT-infused fiber shield comprises a plurality of CNT-infused fibers, each of the plurality of CNT-infused fibers comprising:
a respective fiber material, and
a respective plurality of CNTs infused directly onto a surface of the respective fiber material; and
a device operably connected to the composite,
wherein, for at least one of the plurality of CNT-infused fibers of the CNT-infused fiber shield,
at least a portion of each CNT of the respective plurality of CNTs is aligned perpendicular to an axis of the respective fiber material and external to the respective fiber material.

21. The article of claim 20, wherein, for the at least one of the plurality of CNT-infused fibers of the CNT-infused fiber shield:
at least one CNT of the respective plurality of CNTs is aligned perpendicular to a surface of the wire, and
at least one CNT of the respective plurality of CNTs is aligned tangential to the surface of the wire.

* * * * *